United States Patent
Bains et al.

(10) Patent No.: US 12,360,847 B2
(45) Date of Patent: Jul. 15, 2025

(54) ADAPTIVE INTERNAL ERROR SCRUBBING AND ERROR HANDLING

(71) Applicant: Intel Corporation, Santa Clara, CA (US)

(72) Inventors: Kuljit S. Bains, Olympia, WA (US);
Kjersten E. Criss, Portland, OR (US);
Rajat Agarwal, Portland, OR (US);
Omar Avelar Suarez, Zapopan (MX);
Subhankar Panda, Portland, OR (US);
Theodros Yigzaw, Sherwood, OR (US);
Rebecca Z. Loop, Portland, OR (US);
John G. Holm, Beaverton, OR (US);
Gaurav Porwal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 18/025,868

(22) PCT Filed: Sep. 26, 2020

(86) PCT No.: PCT/US2020/052959
§ 371 (c)(1),
(2) Date: Mar. 10, 2023

(87) PCT Pub. No.: WO2022/066178
PCT Pub. Date: Mar. 31, 2022

(65) Prior Publication Data
US 2024/0211344 A1    Jun. 27, 2024

(51) Int. Cl.
*G11C 29/02* (2006.01)
*G06F 11/10* (2006.01)

(52) U.S. Cl.
CPC ............ *G06F 11/106* (2013.01); *G11C 29/02* (2013.01)

(58) Field of Classification Search
CPC .............................. G06F 11/106; G11C 29/02
See application file for complete search history.

(56) References Cited

U.S. PATENT DOCUMENTS 6,480,982 B1   11/2002   Chan et al.
6,728,156 B2   4/2004    Kilmer et al.
(Continued)

FOREIGN PATENT DOCUMENTS

WO   2016113223 A1   7/2016
WO   2017151567 A1   9/2017

OTHER PUBLICATIONS

Cojocar, Lucian, et al "Exploiting Correcting Codes: On the Effectiveness of ECC Memory Against Rowhammer Attacks," 2019 IEEE Symposium on Security and Privacy (SP), San Francisco, CA, USA, 2019, pp. 55-71, doi: 10.1109/SP.2019.00089.
(Continued)

*Primary Examiner* — Mark D Featherstone
*Assistant Examiner* — Jeffrey Andrew Yang
(74) *Attorney, Agent, or Firm* — Compass IP Law PC

(57) ABSTRACT

A memory subsystem with error checking and scrubbing (ECS) logic on-device on the memory can adapt the rate of ECS operations in response to detection of errors in the memory when the memory device is in automatic ECS mode. The ECS logic can include an indication of rows of memory that have been offlined by the host. The ECS logic can skip the offlined rows in ECS operation counts. The ECS logic can include requests or hints by the host to have ECS operations performed. An internal address generator of the ECS logic can select between generated addresses and the hints. The system can allow a memory controller to detect multibit errors (MBEs) related to a specific address of the associated memory. When the detected MBEs indicate a
(Continued)

pattern of errors, the memory controller triggers a row hammer response for the specific address.

19 Claims, 18 Drawing Sheets

(56) References Cited

U.S. PATENT DOCUMENTS

| | | | |
|---|---|---|---|
| 6,838,331 | B2 | 1/2005 | Klein |
| 7,275,130 | B2 | 9/2007 | Klein |
| 8,122,308 | B2 | 2/2012 | Buch |
| 8,255,772 | B1 | 8/2012 | Foley |
| 8,443,262 | B2 | 5/2013 | Foley |
| 8,687,421 | B2 | 4/2014 | Avila et al. |
| 9,081,693 | B2 | 7/2015 | Ramaraju et al. |
| 9,081,719 | B2 | 7/2015 | Ramaraju et al. |
| 9,087,614 | B2 | 7/2015 | Son et al. |
| 9,318,168 | B2 | 4/2016 | Park et al. |
| 9,318,182 | B2 | 4/2016 | Lovelace |
| 9,519,531 | B2 | 12/2016 | Seo et al. |
| 9,812,222 | B2 | 11/2017 | Kim et al. |
| 9,817,714 | B2 | 11/2017 | Halbert et al. |
| 9,823,964 | B2 | 11/2017 | Reed et al. |
| 9,842,021 | B2 | 12/2017 | Halbert et al. |
| 9,864,653 | B2 | 1/2018 | Vidyapoornachary et al. |
| 9,891,990 | B2 | 2/2018 | Vidyapoornachary et al. |
| 10,049,006 | B2 | 8/2018 | Reed et al. |
| 10,127,101 | B2 | 11/2018 | Halbert et al. |
| 10,223,200 | B2 | 3/2019 | Vidyapoornachary et al. |
| 10,228,999 | B2 | 3/2019 | Vidyapoornachary et al. |
| 10,304,556 | B2 | 5/2019 | Luck |
| 10,445,177 | B2 | 10/2019 | Reed et al. |
| 10,475,503 | B2 | 11/2019 | Yoo et al. |
| 10,586,584 | B2 | 3/2020 | Cha et al. |
| 10,599,504 | B1 | 3/2020 | BeSerra et al. |
| 10,734,058 | B2 | 8/2020 | Shim et al. |
| 2007/0022244 | A1 | 1/2007 | Kimmery |
| 2012/0106283 | A1* | 5/2012 | Yang .................. G11C 29/20 365/230.02 |
| 2012/0284575 | A1 | 11/2012 | Foley |
| 2012/0317352 | A1* | 12/2012 | Kang .................. G11C 29/52 711/E12.001 |
| 2015/0134888 | A1* | 5/2015 | Kimberly .......... G11C 16/3418 711/103 |
| 2017/0161142 | A1 | 6/2017 | Reed et al. |
| 2018/0068693 | A1 | 3/2018 | Shiah et al. |
| 2018/0210786 | A1* | 7/2018 | Kim .................... G06F 11/1048 |
| 2019/0073261 | A1* | 3/2019 | Halbert ............... G06F 3/0679 |
| 2019/0243566 | A1 | 8/2019 | Hassan et al. |
| 2020/0012600 | A1 | 1/2020 | Konoth et al. |
| 2020/0066329 | A1 | 2/2020 | Son |
| 2020/0159621 | A1 | 5/2020 | Velayuthaperumal et al. |
| 2020/0168269 | A1 | 5/2020 | Cha et al. |
| 2020/0210278 | A1 | 7/2020 | Rooney et al. |
| 2020/0219580 | A1 | 7/2020 | Khan et al. |
| 2020/0387323 | A1* | 12/2020 | Boehm ............... G06F 11/1076 |

OTHER PUBLICATIONS

Dutch Patent Office Search Report and Written Opinion for NL Patent Application No. 2029034, Mailed Mar. 29, 2022, 13 pages.
International Search Report and Written Opinion for PCT Patent Application No. PCT/US20/52959, Mailed Jun. 25, 2021, 11 pages.
Nunes Jose Luis et al: "Using Failure Prediction to Improve FPGA Scrubbing", 2016 Seventh Latin-American Symposium on Dependable Computing (LADC), IEEE, Oct. 19, 2016, pp. 135-138, XP033023380.
Sayed Nour et al: "Process variation and temperature aware adaptive scrubbing for retention failures in STT-MRAM", 2018 23rd Asia and South Pacific Design Automation Conference (ASP-DAC), IEEE, Jan. 22, 2018, pp. 203-208, XP033323788.
Swami, Shivam, et al, "ECS: Error-Correcting Strings for Lifetime Improvements in Nonvolatile Memories", https://dl.acm.org/doi/abs/10.1145/3151083, ACM Transactions on Architecture and Code Optimization, vol. 14, No. 4, Article 40. Publication date: Dec. 2017.

* cited by examiner

ADAPTIVE INTERNAL ERROR SCRUBBING AND ERROR HANDLING

CLAIM OF PRIORITY

This application is a U.S. National Phase application under 35 U.S.C. § 371 of International Application No. PCT/US2020/052959 filed Sep. 26, 2020.

FIELD

Descriptions are generally related to memory system error management, and more particular descriptions are related to adaptive operations for management of error scrubbing and error handling within a memory.

BACKGROUND

Memory scrubbing is a background operation that fixes correctable errors and detects uncorrectable errors with the help of error checking and correction (ECC) mechanisms. Memory scrubbing was traditionally implemented as logic in the host, either as logic within the memory controller, or as a standalone component dedicated to memory scrubbing. Memory scrubbing can now be performed on-memory with devices that include on-device or on-die ECC.

Fixing correctable errors with memory scrubbing can be effective at avoiding the creation of uncorrectable errors, which typically would cause an unwanted system reset. Scrubbing can occur as a regular process, such as with the use of periodic patrol scrubbing, in which the entire system address space is scrubbed once within a set period (e.g., within 12 hours or 24 hours). Scrubbing operations include a read to memory, detection and correction of errors, followed by a write to memory. In the case that an uncorrectable error is detected, the system can poison the data to signal the uncorrectable error. For example, the data can be tagged with a poison bit to allow the host to write the data back from the last level cache or to mark the address as bad.

Patrol scrubbing is typically limited to a single configuration for the on-memory scrub operations. All patrol scrubbing is traditionally performed based on a configuration set at system initialization of the memory.

Additionally, although emerging memories include on-memory ECC and error scrubbing mechanisms, changing row hammer attack vectors have still proven to cause row hammer faults in machines that have row hammer protection mechanisms. Row hammer attacks refer to the repeated access within a refresh cycle of a target row. The repeated access to the target row continually cycles power on the target row, which can cause the build-up of charge on physically adjacent rows (victim rows), resulting in inadvertent overwriting of data on the victim rows. Row hammer mitigation can include targeted refreshing and monitoring of access counts to prevent row hammer conditions.

However, newer row hammer attacks include row fuzzing attacks, where the access occurs to multiple target rows instead of just one, which tends to reduce the effectiveness of the monitoring mechanisms. The current monitoring solutions for row hammer conditions are limited in what situations they identify as row hammer attacks.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
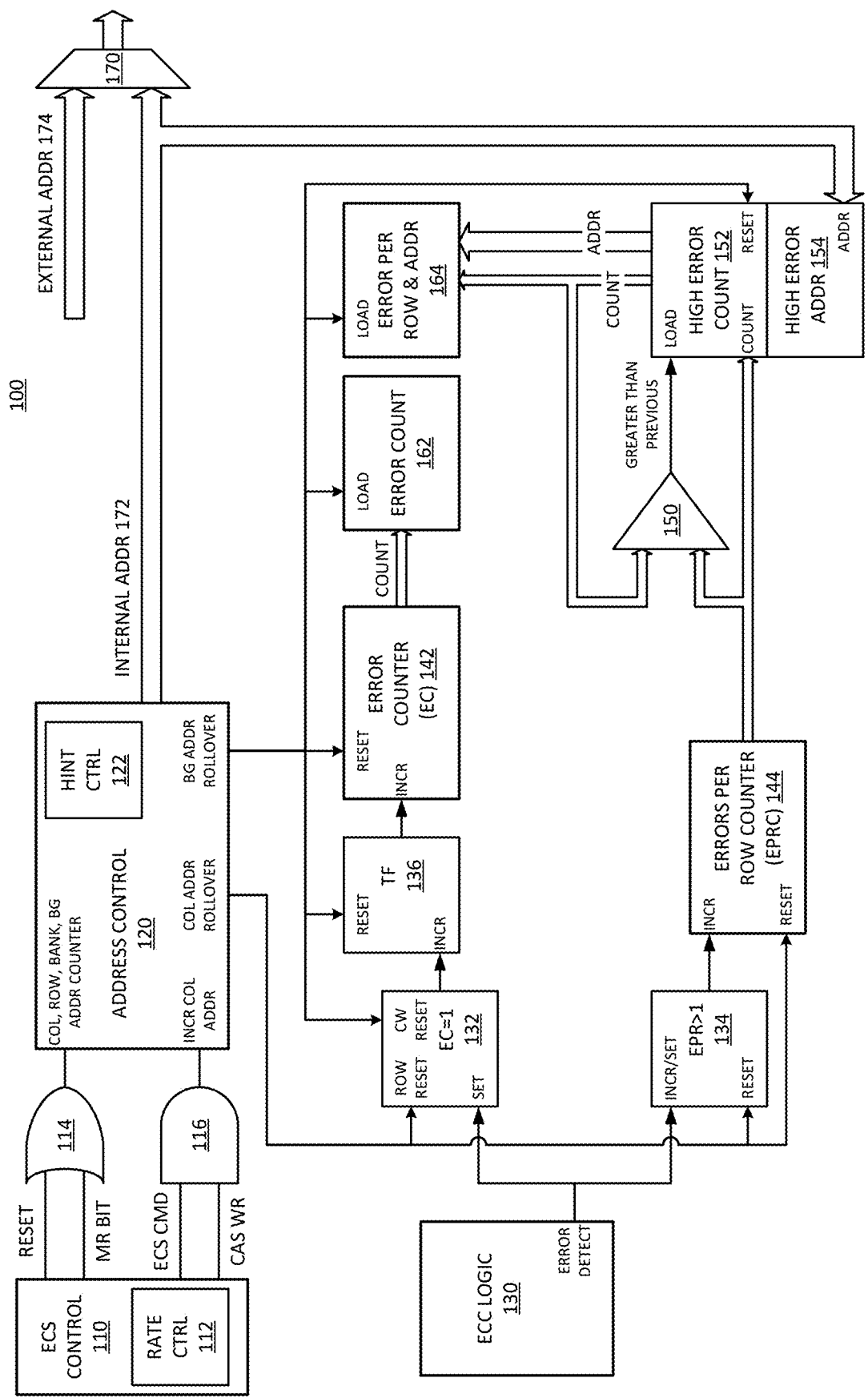
FIG. 1 is a block diagram of an example of an error checking and scrubbing system that is adaptable in scrub rate and scrub target addresses.

Descriptions of certain details and implementations follow, including non-limiting descriptions of the figures, which may depict some or all examples, and well as other potential implementations.

DETAILED DESCRIPTION

As described herein, a memory subsystem with error checking and scrubbing (ECS) logic on-device or on-die on the memory can adapt error scrubbing and adapt the use of error information in one or more ways. The adaptation to the realtime detected error information can result in the intelligent application of error scrubbing or other error mitigation techniques, resulting in fewer uncorrectable errors in memory.

In one example, the error scrubbing system can adapt the rate of on-memory scrubbing operations in response to detection of errors in the memory when the memory device is in automatic scrubbing mode. Automatic scrubbing mode refers to a mode where the memory controls the application of the scrubbing, as opposed to the host controlling the operations through direct commands from the memory controller. Based on detection of a change in error rate, or a predicted change in an error rate (e.g., based on sensor information), the host can change the rate of scrub operations by the memory scrubbing engine.

In one example, the host can provide an indication to the on-memory error scrubbing engine of rows of memory that have been offlined by the host. For an error scrubbing engine with ECS logic with transparency that counts and reports on errors detected, the indication of the offlined errors can enable the error scrubbing engine to skip the offlined rows in ECS operation counts. The skipping can be through not performing the error scrubbing for the offlined pages, or through performing the error scrubbing on the offlined pages but then not including the offlined pages in the error count information provided to the host.

In one example, the host can provide hints to the error scrubbing engine or error scrubbing logic on the memory. The hints indicate addresses the host determines should have scrubbing performed. An internal address generator of the on-memory error scrubbing logic can select between the normal incremented addresses for typical scrubbing operation or the address or addresses provided by the host.

In one example, the system can detect row hammer conditions through the monitoring of error information within the memory. In response to detection of a multibit error (MBE), the system can determine whether the MBE is part of a pattern of errors related to a specific address of the memory. When detected errors indicate a pattern of errors, the host can trigger a row hammer response related to the specific address. For example, the host can treat the specific address as a target address for a row hammer attack, and provide row hammer mitigation (such as targeted row refresh) for victim rows.

In one example, hints can be provided during runtime to a patrol scrubber to improve the reduction of uncorrectable errors. Adaptation of error scrubbing and row hammer response can be in response to operating system (OS) access patterns, or access patterns by agent software (e.g., application software executing under the OS). Additionally, the adaptation can be in response to environmental conditions, such as temperature increase, which tends to increase errors. Additionally, the adaptation can be in response to stress conditions, which can include the environmental conditions, as well as other system conditions such as a central processing unit (CPU) loading, network bandwidth usage, rate of writes to memory, or other condition. An adaptation based on stress conditions can include an adaptation to a scaling factor or a weighting factor for consideration of addresses selected for error scrubbing.

FIG. 1 is a block diagram of an example of an error checking and scrubbing system that is adaptable in scrub rate and scrub target addresses. System 100 illustrates components of an error monitoring system that keeps counts of error information. In one example, system 100 can be referred to as an ECS (error checking and scrubbing) system or ECS engine. System 100 represents components on-device on the memory that is to be scrubbed. Reference throughout to ECS operations or error scrubbing operations can refer to operations by a system in accordance with system 100. System 100 is adaptive to changing error conditions in the memory or responsive to different environmental conditions within a host system that could result in increased errors within the memory.

ECS control 110 represents logic or control circuitry to generate control scrubbing operations within system 100. In one example, ECS control 110 is part of a controller internal to the memory device. In one example, ECS control 110 is a standalone component within the memory to control the scrubbing operations. In one example, the registers that store the final counts are registers accessible to the host, and other components are within the controller on the memory device. For purposes of description, the scrubbing operations are described below as ECS operations, referring to operations that check for errors, correct correctable errors that are found (correct detected errors), and write corrected data back to memory. In one example, the ECS operations include the performance of error counting in a system that performs scrubbing with transparency or insight into the number of errors. In one example, the ECS operations include operations related to detection of uncorrectable errors and reporting the uncorrectable errors such as indication to the host or poisoning the data.

In one example, ECS control 110 includes rate control (CTRL) 112 to control the rate of performance of ECS operations. In one example, the host, such as an associated memory controller, indicates a change to the memory device. In response to the indicated change from the host, ECS control 110 can set a new time interval for scrubbing. For example, ECS control 110 can provide a scrub interval to trigger the performance of ECS operations to result in all memory addresses having a scrub performed within a time period (e.g., 24 hours, 10 hours, or some other interval). The scrub interval can be an average time between scrub operations to result in the scrub of the entire address space within the time period.

Address control 120 represents control logic to enable a memory device to manage internal addressing for ECS operations. The memory device may be responsible for certain address information and the memory controller responsible for other address information. Thus, system 100 can have different implementations depending on the address information responsibility of the memory device. In one example, address control 120 includes one or more ECS address counters to increment addresses for ECS commands. Address control 120 can include counters for column addresses, row addresses, bank addresses, bank group addresses, or a combination of these. In one example, address control 120 includes a counter to increment the column address for a row or other segment for an ECS operation.

In one example, address control 120 controls address information based on signals provided from ECS control 110. The signals received from ECS control 110 can be referred to as internal signals, referring to signals generated internally within the memory device by an internal controller. Internal signals can be distinguished from external signals received from the memory controller. The internal signals from ECS control 110 can refer to signals generated based on automatic ECS operation, where the memory device itself determines when and how to perform ECS operations, and on what addresses to perform the operations. Thus, the internal controller is in control of the ECS operations, and opposed to simply generating internal signals to execute host-controlled ECS operations. Host-controlled ECS operations refer to ECS operations directed by the memory controller as to when to perform the ECS operations or what addresses to scrub. With rate control 112, the host can request an increase in ECS frequency based on detection of external errors, which the memory device can then use to determine how to adjust its rate and ECS operation. As such, in one example, the memory controller can directly request a rate increase and can control the ECS rate. In one example, the memory controller can request a rate increase and the memory device will determine how to perform the increase.

In one example, address control 120 increments the column address (INCR COL ADDR) on each ECS WR command, which can be triggered or indicated by ANDing an internal ECS command signal (ECS CMD) with an internal write command as indicated by an internal column address strobe for a write (CAS WR), as illustrated with logic 116. In one example, once the column counter wraps or rolls over, the row counter will sequentially increment and read each code word and associated check bits in the next row until all rows within a bank are accessed. In one example, once the row counter wraps, the bank counter will sequentially increment and the next sequential bank within a bank group will repeat the process of accessing each code word and associated check bits until all banks and bank groups within the memory are accessed. In one example, once the row counter wraps, the bank counter will sequentially increment and the next sequential bank group will repeat the process of accessing each code word and associated check bits until all bank groups within the memory are accessed.

In one example, column, row, bank, bank group, or other counter to generate internal addresses in address control 120 can be reset in response to a RESET condition for the memory subsystem or in response to a bit in a mode register (MR), as illustrated with the OR of the RESET signal and the MR bit with logic 114. A reset can occur on a power cycle or other system restart. In one example, the address information generated by address control 120 can be used to control decode logic (e.g., row and column decoder circuits within the memory device) to trigger the ECS operations. However, seeing that for other operations the memory device operates on external address information received from the host, in one example, system 100 includes multiplexer (mux) 170 to select between external address (ADDR) 174 and internal address information, internal address (ADDR) 172, generated by address control 120. While not specifically shown, it will be understood that the control for mux 170 can be the ECS mode state, where in ECS mode the internal address generation is selected to access a memory location of the memory array, and when not in ECS mode external address 174 is selected to access the memory location of the memory array. Thus, the output of mux 170 can go to the decode logic to access the memory array.

When the memory controller provides some address information, the selection logic of system 100 can be selectively more complex. Based on internal address information or external address information, system 100 can check all code words and check bits within the memory. More specifically, system 100 can perform ECS operations, which include ECC operations to read, correct, and write back memory locations for all selected or specified addresses. In one example, the ECS system can read the memory array, correct errors with internal ECC (error checking and correction) logic, and write back corrected data. In one example, the ECS system can read the memory array and write the data back to the array every time, whether or not the ECC detected and corrected an error.

After being operated on once, system 100 can be configured (e.g., via the size of the counters) to wrap the counters and restart the address count. For example, once all memory locations for a memory have been checked, a bank group counter can wrap and begin the process again with the next ECS command. The total number of ECS commands required to complete one cycle of ECS mode is density dependent.

In one example, address control 120 includes hint control (CTRL) 122, which represents hints provided for internal address selection by the memory device. As indicated above, the memory controller can externally control ECS operation, including providing the address for the row or rows to be scrubbed. External address 174 represents ECS address information provided by the host, and internal address 172 represents internally generated address information. Hint control 122 can indicate a hybrid, where instead of directly providing the address information for the ECS operations, the host indicates addresses it has determined should be scrubbed, as described in more detail below, which the memory device can then take into consideration in the generation of internal address information.

In one example, hint control 122 can represent a list of addresses the host indicates should be scrubbed. In one example, hint control 122 can represent a list of addresses the host has offlined, which it does not want included in error count information. Based on suggested addresses, address control 120 can generate addresses that are not consecutively incremented addresses, performing ECS operations out of order, which can include repeating a scrub of some addresses within the scrub period prior to scrubbing addresses that have not yet been scrubbed. In one example, address control 120 can generate control signals, such as signals that control the setting of counters to control the counting of errors for selected addresses.

System 100 includes ECC logic 130 to perform error checking and correction operations on selected or addressed memory location(s). In one example, ECC logic 130 generates an output flag (ERROR DETECT) when an error is detected in a memory location. In one example, ECC logic 130 generates the flag in response to detecting and correcting a single bit error (SBE) with ECC operations. In one example, ECC logic 130 generates the flag in response to detecting a multibit error (MBE). In one example, the error detection signal from ECC logic 130 can set block 132 to be active, which when set provides an output of error count equal to one, or EC=1. In one example, the reset control signal can be controlled to prevent the counting of an error for an excluded address.

In one example, the error detection signal from ECC logic 130 can set block 134 to be active, which when set provides an output of errors per row are greater than one, or EPR>1. It will be understood that block 134 can require two error detection signals between resets to trigger the setting of EPR>1. Thus, the input for block 134 is labeled as INCR/SET to indicate that in one example the row will not be considered for high error count unless there are at least 2 errors.

In one example, block 132, TF 136, and error counter (EC) 142 count errors per row, and EC 142 only increments to count rows having at least one error. In one example, block 132, TF 136, and error counter (EC) 142 count the total number of errors, and EC 142 increments to count every error found by ECC logic 130.

In one example, the setting of block 132 triggers threshold filter (TF) 136 to increment. In one example, TF 136 is set when the threshold filter count equals an error threshold count (ETC). The ETC represents a configurable threshold set by the system or by the user to only count errors in response to a threshold number. The threshold can be per row, per bank, per bank ground, or some other segment of memory. In one example, the threshold filter can be related to an initial number of errors determined for the memory for manufacturing, which can allow the transparency counting to only report on errors that exceed the number of errors that show up after the memory is integrated into a system. As such, the manufacturer can set a threshold to indicate a number of errors only in excess of a selected number (e.g., selected from a table), a configured number set by the manufacturer, or some other threshold to set a baseline number of errors that must be reached before an error count is reported to the host. The setting of TF 136 can trigger error counter (EC) 142 to increment.

EC 142 can continue to increment to count errors until error count 162 loads the counter value. Error count 162 represents a register or storage location to store the error count. In one example, error count 162 represents a register accessible by the host, such as, for example, a mode register. The loaded error count is posted for the host to access.

In one example, the setting of block 134 increments errors per row counter (EPRC) 144. Whether block 132 counts total errors or the number of rows with at least one error, EPRC 144 counts the number of errors per row, in one example, for row having at least 2 errors. EPRC 144 counts errors to indicate a row with the highest number of errors in the block of addresses being scrubbed, or in the entire block of addresses in the memory.

In one example, EPRC 144 provides its count to high error count 152, as well as providing its count for comparison to a previous high or maximum error count from error count 152. High error count 152 represents a register or other storage that holds a high error count indicating the maximum number of errors detected in any of the rows. Comparison logic 150 determines if the count value in EPRC 144 is greater than high error count 152. In one example, if the current error count in EPRC 144 is greater than the previous maximum of high error count 152, logic 150 generates an output "GREATER THAN PREVIOUS" to trigger error count 152 to load the new count value from EPRC 144.

EPR & address 164 represents a register or storage location to store the error count and address for a row having the highest number of errors. In one example, EPR & address 164 represents a register accessible by the host, such as, for example, a mode register. The loaded error count and address are posted for the host to access. In one example, the output signal indicating the higher error count from logic 150 triggers high error count 152 to send the new high error count and the address of high error address 154 to EPR & address 164. In one example, high error address 154 latches the address when high error count 152 loads the new high error count.

The providing of error count 162 and EPR & address 164 can be referred to as providing error transparency or as transparency data. The transparency data provides insight for the host or the memory controller into errors within the memory. More particularly, as described in more detail below, the host can make determinations of error patterns and determinations of a need or suggestion for error scrubbing based on error transparency data provided by the memory device.

Figure 2:
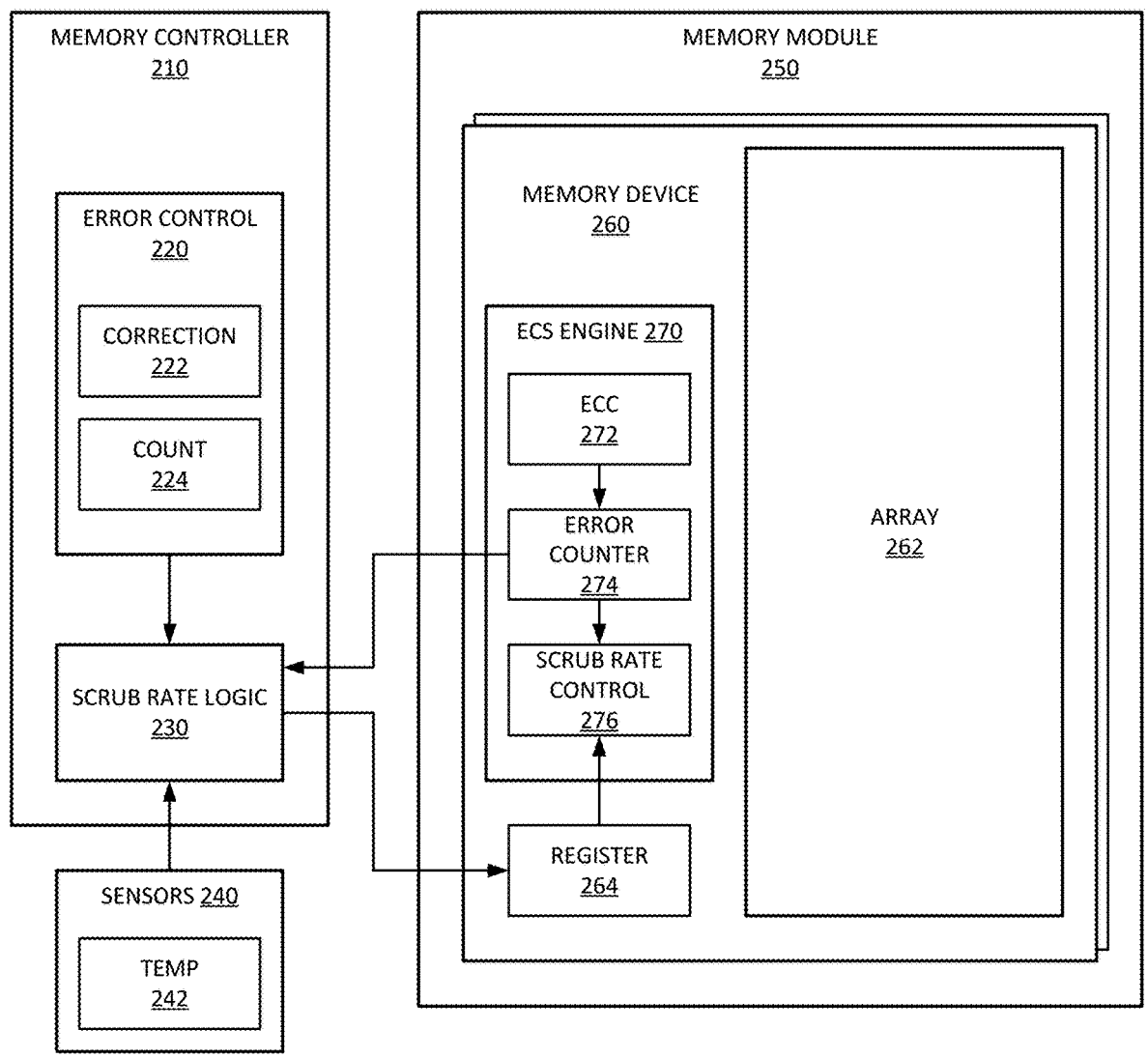
FIG. 2 is a block diagram of an example of a system to control a scrub rate of an on-memory error checking and scrubbing system.

FIG. 2 is a block diagram of an example of a system to control a scrub rate of an on-memory error checking and scrubbing system. System 200 represents components of a memory subsystem. System 200 includes an error scrubbing engine in accordance with system 100 of FIG. 1.

Memory controller 210 represents the host for system 200, and memory module 250 represents a module that includes multiple memory devices 260. In one example, memory module 250 represents a dual inline memory module (DIMM) and memory device 260 represents dynamic random access memory (DRAM) devices on the module.

In one example, memory controller 210 includes error control 220, which represents logic or circuitry within memory controller 210 to perform error correction on data received from memory devices 260. Memory device 260 includes ECC 272 to perform error checking and correction within memory device 260. ECC 272 can be referred to as on-device or on-die ECC for the memory device, which is distinct from error correction 222 of memory controller 210. ECC 272 can operate locally on the data stored within array 262. Array 262 represents memory cells within memory device 260. Array 262 can include multiple rows of memory. Correction 222 represents error correction that occurs at a system-wide level on data from multiple memory devices 260 in parallel. Correction 222 can detect and correct errors in data from multiple memory devices 260. Correction 222 can be error correction logic or an error correction circuit within memory controller 210 to perform operations on data received from memory devices 260 related to error checking and correction.

In one example, error control 220 counts errors in the correction of data at the system level. Count 224 represents an error count managed by error control 220, which is separate from error counter 274 of memory device 260. Error counter 274 within ECS engine 270 of memory device 260 represents one or more counters or error registers that store error counts generated by error counters. The use of error counters can be in accordance with what is described with reference system 100. Error counter 274 is internal to memory device 260 and can represent the number of SBEs corrected by the memory device prior to the data being sent to memory controller 210. In one example, memory device 260 will not send data with single bit errors to memory controller 210, because they will have already been corrected within the memory.

In one example, count 224 represents a number of multibit errors (MBEs) counted by memory controller 210 in data sent from memory device 260. In one example, the number of MBEs will represent the uncorrectable errors encountered by memory device in performing internal ECC. In practice, certain SBEs can be detected and corrected in data sent from memory device 260, even though it should correct all SBEs prior to sending to memory controller 210. An SBE can occur resulting from an error in transmission or detection of a bit, which can be corrected at memory controller 210. In one example, error control 220 only tracks MBEs even when correction 222 corrects SBEs. SBEs can be representative of transient errors in data communication, whereas MBEs can represent more significant errors within the data of memory device 260. SBEs can also be present from memory errors when on-die ECC performs correction on a larger portion of data than what is sent to the memory controller. For example, if on-die ECC performs correction over 128 bits and the memory device sends only 64 bits to the memory controller, there can be SBEs in the data sent.

In one example, error control 220 includes logic to perform correlation of errors received from memory device 260. The correlation of errors and the response to correlated errors is described in more detail below. In one example, error control 220 passes error counts and potentially correlated address information to scrub rate logic 230. Scrub rate logic 230 represents logic or circuitry within memory controller 210 to trigger an adjustment to the scrub rate of memory device 260.

In one example, scrub rate logic 230 receives input from one or more sensors 240 within system 200. For example, temperature sensors (TEMP 242), voltage sensors, or other sensors can indicate environmental conditions within system 200 that are likely to trigger an increase in errors, or environmental conditions that affect the error rate in the memory. In one example, scrub rate logic 230 can trigger an increase in scrub rate in response to increase in an error rate. In one example, scrub rate logic 230 can trigger a decrease in scrub rate in response to a decrease in the error rate. In one example, scrub rate logic 230 can trigger an increase or a decrease, respectively, in a projected increase or decrease of error rates based on changing sensor data. Thus, memory controller 210 can proactively change the scrub rate based on anticipated errors and not just on a detected increase in error rate. Predictive scrub rate increases can reduce the likelihood of increased error rate before it occurs. For example, scrub rate logic 230 can be programmed with information related to likely error rates based on temperature thresholds or voltage thresholds. In response to reaching one or more thresholds, scrub rate logic 230 can trigger a corresponding change in scrub rate within memory device 260.

In one example, memory device 260 includes register 264, which represents a mode register or configuration register or configuration memory that allows memory controller 210 to configure modes of operation of memory device 260. In one example, register 264 represents a register on memory module 250, which would be applicable to multiple memory devices 260, such as a configuration on a registered clock driver (RCD) or other controller logic on memory module 250. Register 264 includes one or more fields settable by memory controller 210 to trigger a scrub rate change in memory device 260. In one example, the scrub rate change can be in accordance with two or more selectable scrub rates for memory device 260.

In one example, based on configuration information set in register 264, scrub rate control 276 of ECS engine 270 can adjust the rate of performing ECS operations for memory device 260. In one example, scrub rate control 276 represents a rate of patrol scrubbing operations, which represent operations to systematically perform scrub operations through an entire address section, such as the entire memory, within a fixed period of time. In one example, ECS engine 270 can be referred to as error scrubbing logic or ECS logic, or an error scrubbing circuit or ECS circuit, to perform error scrubbing operations on the memory resources of array 262.

In one example, ECS engine 270 can detect an increase in errors with error counter 274, and increase or decrease the scrub rate autonomously within memory device 260. Autonomous adjustment refers to an adjustment to scrub rate control 276 based on error counter 274, and not necessarily based on command or configuration control by memory controller 210. In one example, error counter 274 provides error count information to scrub rate logic 230 of memory controller 210, such as through control signal lines or through providing information to a register readable by memory controller 210. Thus, memory controller 210 can detect a change in error rate and trigger a change in scrub rate based on data received from the memory device or signal from the memory device to indicate a change in the error rate.

In one example, scrub rate logic 230 can monitor the error rate indicated by error counter 274 and trigger a change to scrub rate control 276 based on an increase in error rate. In one example, scrub rate logic 230 correlates increases or decreases in SBE errors as indicated from error counter 274 with increases or decreases in MBE errors seen with error control 220 to determine whether to adjust the scrub rate. For example, increase in SBEs in combination with increases in SBEs or MBEs can indicate more uncorrectable errors or more aliased errors, which could indicate, for example, a row hammer attack. Aliased errors refer to errors created in memory data by applying ECC to a multibit error.

It will be understood that the passing of error information from memory device 260 to memory controller 210 and the setting of a configuration by memory controller 210 to adjust the scrub rate can be in accordance with protocols. Protocols refer to communication conventions between the devices. In one example, based on protocol, memory controller 210 can request changes in the scrub rate of memory device 260 by the on-die ECS engine 270 in response to errors or system conditions.

It will be understood that the memory controller adjusting the scrub rate can trigger a change to the internal scrub rate of memory device 260, rather than the memory controller sending specific commands to trigger more ECS operations or more scrub operations. Memory controller 210 can trigger a change, for example, in response to monitoring changes in expected errors or changes in actual errors.

Manual ECS mode can refer to a mode in which ECS operations are managed by memory controller 210, where memory controller 210 is responsible for sending ECS commands to memory device 260. Automatic ECS mode can refer to a mode in which ECS operations are managed internally by memory device 260 during refresh periods or other idle times. Instead of sending specific ECS commands, memory controller 210 simply needs to provide refresh commands for memory device 260 to manage ECS operations in automatic mode.

In one example, dynamically lowering the time taken by ECS engine 270 to scrub the entire array 262, which represents the memory cells of memory device 260, requires an average periodic ECS interval (tECSint) to be change. tECSint represents a time (for example, in seconds) to complete an entire scrub of array 262 divided by the total number of individual ECS operations to complete one full cycle of ECS. tECSint determines the maximum spacing in time between host issued REFab commands or self-refresh mode when in automatic ECS mode, or the time between manual ECS commands in manual ECS mode. In one example, memory controller 210 monitors tECSint to be able to issue periodic REFab commands or periods of self-refresh for ECS engine 270 to perform automatic ECS operations. In one example, memory device 260 can select between the use of REFab commands for normal refresh operations or scrubbing operations.

In one example, memory controller 210 through scrub rate logic 230 determines how frequently commands need to be sent to memory device 260 to enable automatic ECS operations to perform a scrub of the entire array within the time period (e.g. 24 hours (24 h), 10 hours (10 h)). Correspondingly, memory device 260 alters tECSint, such as in scrub rate control 276, to ensure the use of additional refresh times are used for scrubbing.

In one example, memory controller 210 can trigger memory device 260 to adjust the scrub rate through setting register 264. In one example, memory controller 210 can trigger memory device 260 to adjust a setting of register 264 based on a special command to adjust the scrub rate.

Figure 3:
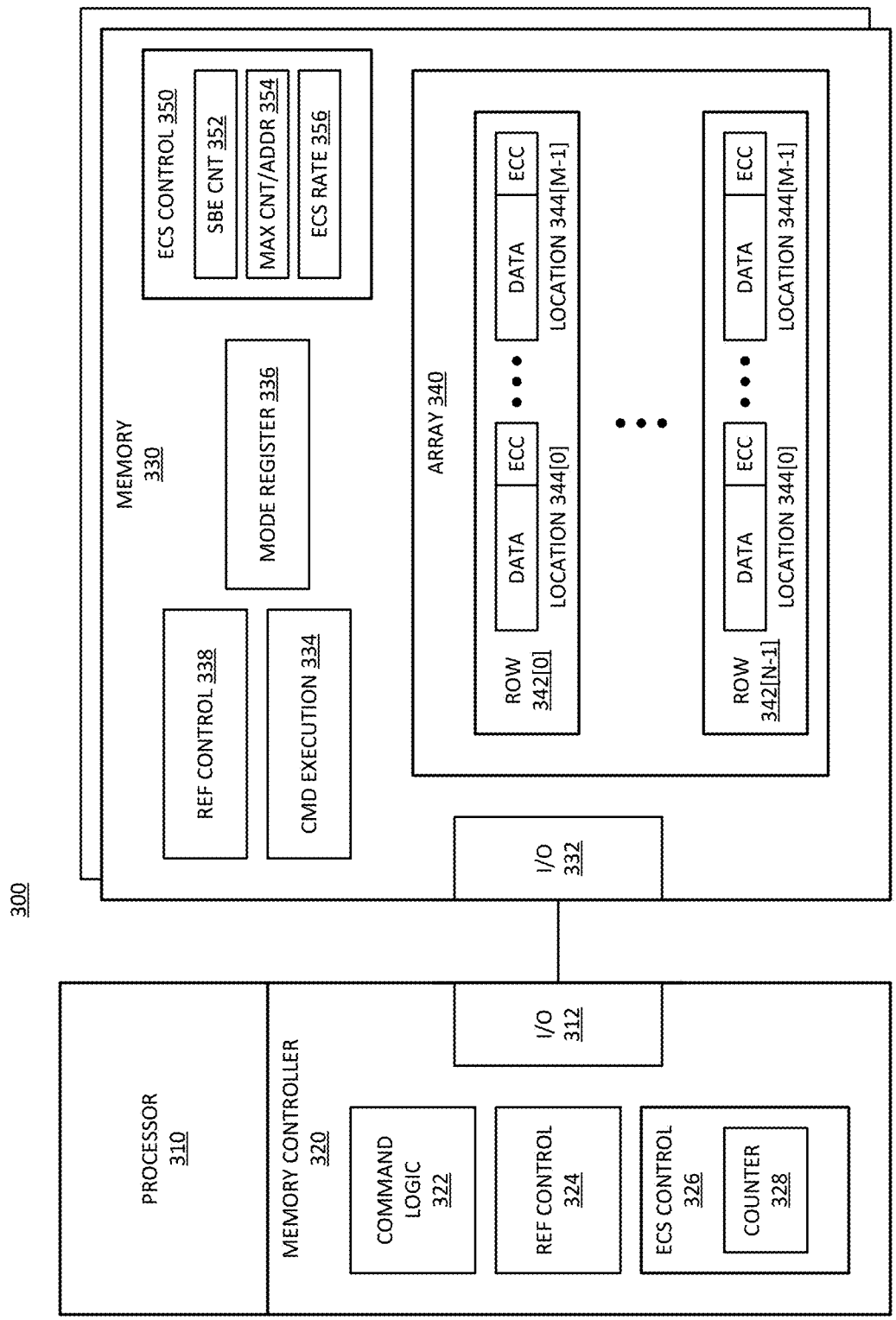
FIG. 3 is a block diagram of an example of a system that performs internal error correction and scrubbing, and stores error information during a refresh cycle.

FIG. 3 is a block diagram of an example of a system that performs internal error correction and scrubbing, and stores error information during a refresh cycle. System 300 represents components of a memory subsystem. System 300 includes an error scrubbing engine in accordance with system 100 of FIG. 1. System 300 can be included in any type of computing device or electronic circuit that uses memory with internal ECC, where the memory devices count error information. Processor 310 represents any type of processing logic or component that executes operations based on data stored in memory 330 or to store in memory 330. Processor 310 can be or include a host processor, central processing unit (CPU), microcontroller or microprocessor, graphics processor, peripheral processor, application specific processor, or other processor. Processor 310 can be or include a single core or multicore circuit.

Memory controller 320 represents logic to interface with memory 330 and manage access to data of memory 330. In one example, memory controller 320 is integrated into processor 310. Processor 310 and memory controller 320 together can be considered a "host" from the perspective of memory 330, and memory 330 stores data for the host. Memory controller 320 includes I/O (input/output) 312, which includes hardware resources to interconnect with corresponding I/O 332 of memory 330.

Command logic 322 of memory controller 320 represents logic or circuitry to generate and send command to memory 330. Refresh (REF) control 324 represents logic or circuitry within memory controller 320 to control the sending of refresh commands to memory 330. The refresh command can include external refresh commands, in which memory controller 320 provides address information for a row for memory 330 to refresh, or a self-refresh command to trigger memory 330 to enter a low power state and generate addresses internally for rows to be refreshed.

ECS control 326 represents logic or circuitry within memory controller 320 to apply error scrubbing to memory 330. In one example, memory controller 320 can send direct commands for memory 330 to execute scrub operations. In one example, memory controller 320 can set a mode (e.g., via register or mode register) within memory 330 to trigger the memory to generate addresses and control the execution of scrub operations. Such a mode can be referred to as automatic scrubbing or automatic ECS mode, where memory 330 controls the execution of ECS operations. In one example, memory 330 performs ECS operations during self-refresh (e.g., at times when memory controller 320 puts memory 330 into self-refresh mode), or in response to all bank refresh commands. Thus, for automatic ECS, memory controller 320 simply needs to ensure that memory 330 is provided with sufficient refresh commands, and memory 330 will determine when to perform the ECS operations.

In one example, ECS control 326 represents logic or circuitry within memory controller 320 to monitor and correlate the occurrence of errors within memory 330. In response to errors, memory controller 320 can correlate errors into patterns of errors that would indicate a row hammer condition. In response to a row hammer condition, in one example, memory controller 320 can suggest specific addresses for memory 330 to consider for ECS operations, increase the number of refresh cycles provided to memory 330 to allow it to perform more ECS operations, or perform other row hammer mitigations, or a combination.

In one example, ECS control 326 represents logic or circuitry within memory controller 320 to perform ECS operations. In one example, memory controller 320 includes an error checking and scrubbing (ECS) engine, which can be similar to what is described with reference to system 100. Whereas descriptions throughout make reference to ECS operations performed by the memory controller with on-memory ECS and ECC components, memory controller 320 can include such components and use them to apply error scrubbing to memory 330. Memory controller 320 can signal memory 330 to adjust its ECS operations (e.g., adjust the frequency of scrubbing, provide suggestions of addresses to scrub, or other operations) based on ECS operations at the memory controller. In one example, the ECS logic at memory controller 320 can be considered part of error control logic or error logic as described herein.

Descriptions throughout refer to the memory controller or the host determining to cause or trigger operations without the memory in response to data from ECS operations. In one example, such descriptions can apply to an example of system 300 with ECS operations performed by ECS control 326 of memory controller 320. Thus, memory controller can determine whether a row hammer attack is happening on memory 330, can determine whether to provide hints and what hints to provide to ECS control 350, can determine what weights to apply to logic within ECS control 350, can adjust a rate of error scrubbing operations by ECS control 350 of the memory, or other operations, or a combination of operations, based on operations performed by ECS control 326. Counter 328 can represent one or more counters for ECS operations, similar to the counters that ECS control 350 can include to report error transparency data to memory controller 320.

Memory 330 includes command (CMD) execution 334, which represents control logic within the memory device to receive and execute commands from memory controller 320. In one example, command execution 334 generates internal operations to perform within memory 330 related to ECC and error scrubbing. Command execution 334 can generate commands for the internal operations, which can include a series of ECC operations for the memory device to perform in ECS mode to record error count information. In one example, mode register 336 includes one or more multipurpose registers to store error count information. In one example, mode register 336 includes one or more fields that can be set by memory controller 320 to enable the resetting of the error count information.

Memory 330 includes refresh (REF) control 338, which represents logic within memory 330 to manage refresh operation within the memory. In one example, refresh control 338 can be part of the command execution logic. Refresh control 338 enables memory 330 to manage refresh operation. Refresh control 338 can control the operation of memory 330 in self-refresh mode. In one example, refresh control 338 can trigger ECS operations when in self-refresh mode. In one example, refresh control 338 can trigger ECS operations in response to all bank refresh commands.

Memory 330 includes array 340, which represents the array of memory locations where data is stored in the memory device. Array 340 represents the memory locations, which can be organized as banks or bank groups. In one example, each address location 344 of array 340 includes associated data and ECC bits. In one example, address locations 344 represent addressable chunks of data, such as bytes of data or data words, whatever the number of bits represents an addressable data word. Array 340 includes N rows 342, and rows 342 include M memory locations. In one example, rows 342 correspond to memory pages or word-lines.

In one example, address locations 344 correspond to memory words, and rows 342 correspond to memory pages. A page of memory refers to a granular amount of memory space allocated for a memory access operation. In one example, array 340 has a larger number of bits to accommodate the ECC bits in addition to the data bits. Thus, a normal page size would include enough space allocated for the data bits, and array 340 allocates enough space for the data bits plus the ECC bits.

In one example, memory 330 includes internal ECC managed by ECS control 350. Memory controller 320 manages system wide ECC, and can detect and correct errors across multiple different memory resources in parallel (e.g., multiple devices of memory 330). Many techniques for system wide ECC are known and can include managing memory resources in a way to spread data across multiple parallel resources. By spreading data across multiple resources, errors have a greater likelihood of being recovery by use of data spread across the resources, and memory controller 320 can recover data even in the event of one or more failures in memory 330. Memory failures are generally categorized as either soft errors or soft failures, which are transient bit errors typically resulting from random environmental conditions, or hard errors or hard failures, which are non-transient bit errors occurring as a result of a hardware failure. Hard errors can also be referred to as permanent faults, in which a hardware failure causes hard failure at the address, which cannot be recovered by simply writing new, correct data to the location address.

In one example, ECS control 350 includes single bit error (SBE) count 352 of rows 342, which can represent a total number of SBEs detected and corrected, or a number of rows 342 that includes at least one SBE. In one example, ECS control 350 includes max count (CNT)/address (ADDR) 354 to represent a register that stores a count of errors in the row with the most errors per row, and the address of the row. It will be understood that in one example, only a single max error count is indicated, even if more than one row has the same number of errors. In one example, ECS control 350 includes more counters. ECS control 350 includes ECC logic (not specifically shown) to perform error checking and correction. The operation of ECS control 350 can be in accordance with an example of system 100.

In one example, ECS control 350 includes ECS rate 356, which represents a register or configuration setting to adjust the rate of ECS operation. In one example, memory 330 includes selectable options for how frequently to perform a patrol scrub, for example, once every 24 hours, or some other time frame, such as 12 hours, 10 hours, 16 hours, or some other period. In one example, adjusting ECS rate 356 can occur dynamically during runtime or during operation of memory 330, rather than at initialization of the memory. Thus, ECS rate 356 can be adjusted when memory 330 stores usable data as opposed to when the memory is initialized. In one example, ECS control 350 adjusts ECS rate 356 in response to an increase in errors in memory 330. In one example, memory controller 320 makes determinations of how many errors in memory 330 and other parallel memory devices should trigger an increase in ECS rate 356. Thus, memory controller 320 can indicate when memory 330 should increase ECS rate 356. Similarly, when error conditions improve, memory controller 320 can indicate to memory 330 to reduce ECS rate 356 to a different rate.

In one example, ECS control 350 can adjust ECS rate 356 to a scrub rate that is not on a selectable list, such as a table. For example, ECS control 350 can adjust ECS rate 356 not based on table values, but based on adjusting a configurable value for a scrub interval. As such, ECS control 350 can adjust ECS 356 with much finer granularity than simply selecting a value from a table. Such operation could enable ECS control 350 to respond to changes in environment that may cause an increase in errors, and then relax the rate when the conditions subside. One such example can be when ECS control 326 of memory controller 320 detects a pattern of errors that indicates a row hammer condition. In one example, memory controller 320 can indicate the condition to memory 330, which can then adjust ECS rate 356, or memory controller 320 can indicate that the ECS rate should be increased.

Figure 4:
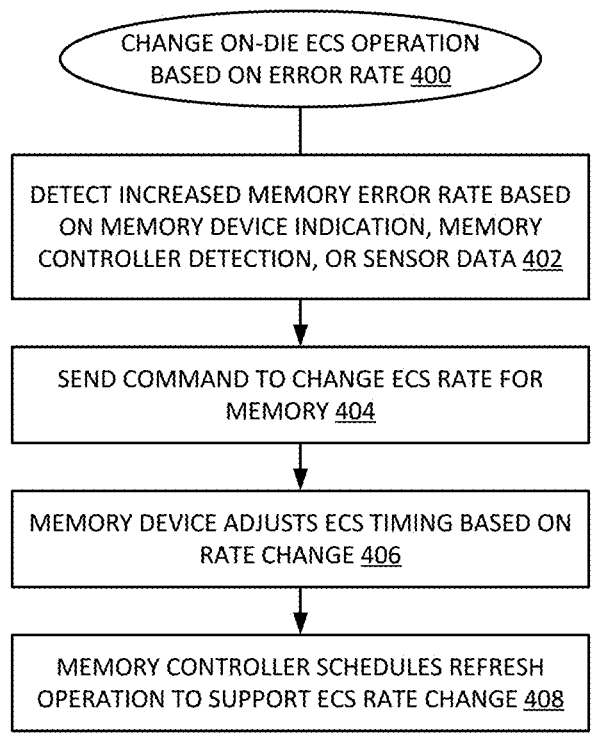
FIG. 4 is a flow diagram of an example of a process for changing a rate of on-die error scrubbing.

FIG. 4 is a flow diagram of an example of a process for changing a rate of on-die error scrubbing. Process 400 represents a process to change on-die ECS operation based on detection of a change in error rate for a memory device.

In one example, the memory controller detects an increased memory error rate based on an indication from the memory itself, based on detection by the memory controller, or based on sensor data, at 402. In one example, the indication from the memory can be an indication of error rate from the ECS system on the memory. In one example, detection by the memory controller can include the memory controller detecting rates of error increases. In one example, the detection can refer to detection of a predicted error rate increase based on sensor data. While detection is indicated with reference to the memory controller, in one example, the memory device detects an increase of errors within its ECS system and determines to adjust a scrub rate based on the internal detection of error rate increase.

In one example, the memory controller sends a command to change the ECS rate for the memory, at 404. The command can be a command to set a configuration of a register, such as a mode register setting. In one example, the command can be special command to trigger a change in the rate of ECS operations. If the memory device detects the errors, in one example, an external command is not needed to adjust the scrub rate, but the memory device can internally adjust the scrub rate.

The memory device adjusts the ECS timing based on the rate change, at 406. In one example, the ECS timing refers to a time interval between ECS operations based on a determination that the memory should be fully scrubbed once per a different time period.

In one example, the memory controller schedules refresh operation to support the ECS rate change, at 408. In one example, the rate change for ECS refers to a scrub rate by an internal ECS engine of the memory device, which is managed by the memory device in automatic mode. The memory device manages ECS operations during the refresh times, and the memory controller ensures that sufficient refresh time is provided to the memory device to enable the memory device to perform the ECS operations at the rate set for the device.

Figure 5:
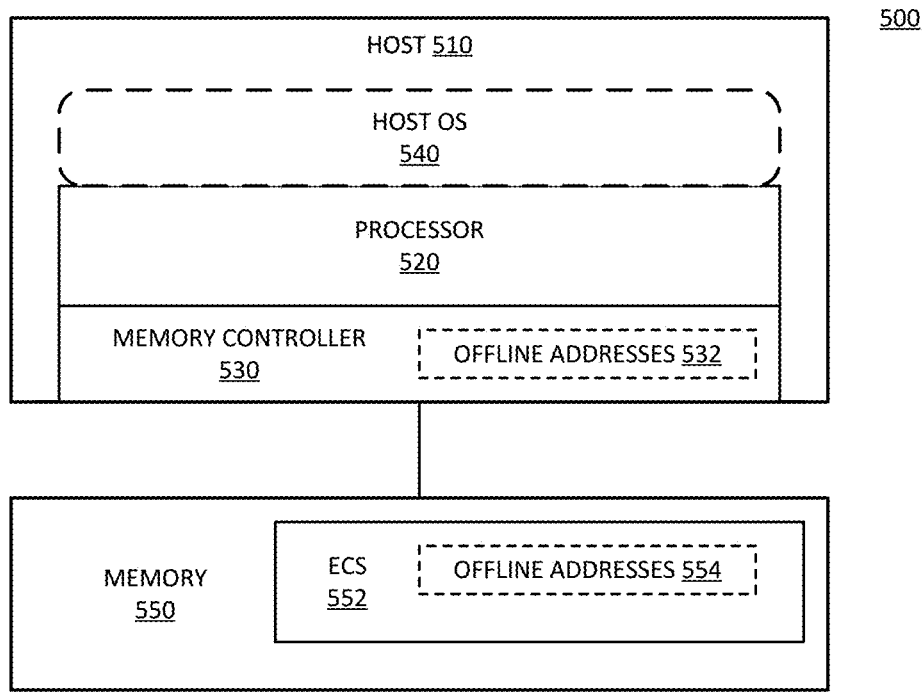
FIG. 5 is a block diagram of an example of a system to exclude offlined rows from error scrubbing counting.

FIG. 5 is a block diagram of an example of a system to exclude offlined rows from error scrubbing counting. System 500 illustrates memory coupled to a host. Host 510 represents a host computing system. Host 510 includes host hardware such as processor 520 and memory controller 530. Also included in the host hardware includes hardware interconnects and driver/receiver hardware to provide the interconnection between host 510 and memory 550. Memory 550 represents one or more memory devices coupled to host 510, which is managed by memory controller 530. Memory controller 530 includes error monitoring and control in accordance with system 100, system 200, or system 300.

The host hardware supports the execution of host software on host 510. The host software can include host OS (operating system) 540. Host OS 540 represents a software platform under which other software will execute. Host OS 540 provides control to interface with hardware interconnections to couple to memory 550.

During execution, host OS 540 provides requests to access memory. The requests can be directly from host OS software can be requests through APIs (application programming interfaces) or other mechanisms for a program executing under host OS 540 to request a memory access. In response to a host memory access request, memory controller 530 maps host-based addressing for memory resources to physical address locations of memory 550.

In response to memory errors, memory controller 530 can determine that one or more addresses of memory should be removed from use. In one example, host OS 540 can detect errors in pages provided to various applications, and the host OS can request memory controller 530 to offline a page. Thus, memory controller 530 can determine to remove one or more addresses from use based on its operations or from a request by host OS 540. Page offlining is commonly performed on address rows or cache lines (CLs) with failures. Thus, memory controller 530 can offline certain rows or cachelines and remap requests through host OS 540 to different physical memory locations. Offline addresses 532 represent addresses of locations the memory controller has offlined. In one example, offline addresses 532 are not reported to memory 550 during transition times, when hard errors have occurred in memory 550 but before memory controller 530 can execute a PFD (permanent fault detection) routine, post package repair (PPR) routine, or other process to move data to spare locations within the memory, thus changing the addressing of certain data within memory 550.

Traditionally, memory controller 530 does not indicate when a row has been offlined. Thus, the on-memory ECS system represented by ECS 552 that maintains counts of errors detected by the on-die ECC during scrubbing would traditionally report errors related to a row that memory controller 532 has offlined.

In system 500, ECS 552 includes offline addresses 554, which represents an indication by memory controller 530 to ECS 552 of one or more of offline addresses 532. In one example, the ideal situation would be for offline addresses 554 to include all addresses of offline addresses 532. During transitions, the lists of addresses may not completely match. In one example, ECS 552 excludes offline addresses 554 from ECS error counts.

In one example, when ECS 552 executes an ECS operation, it checks the target address of the ECS operation against offline addresses 554 to determine if the ECS target address has been offlined. Thus, ECS 552 can maintain more accurate error counts by including errors in the online memory and avoiding the inclusion of error counts for offlined, possibly failed, rows. It will be understood that a failed row with many errors could have more errors than any online row, which would mean counting the errors in the offline row would mask the online row with the highest error count from being reported in the error count indication to memory controller 530. When ECS 552 accounts for offline addresses, the transparency information can more accurately reflect the online memory.

Figure 6:
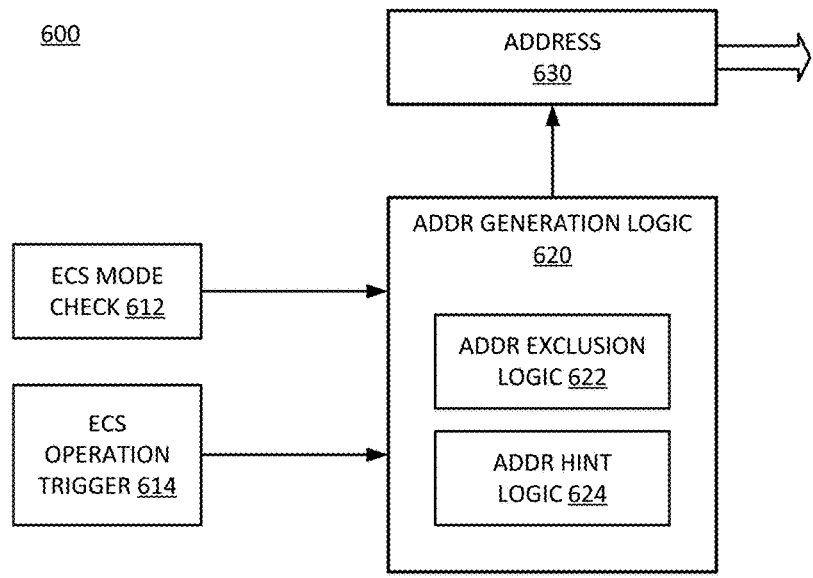
FIG. 6 is a block diagram of an example of adaptive address generation logic of error checking and scrubbing logic.

FIG. 6 is a block diagram of an example of adaptive address generation logic of error checking and scrubbing logic. System 600 represents elements of address generation for address control logic in accordance with an example of system 100.

Address (ADDR) generation logic 620 represents logic on-memory in an ECS system on the memory. Address generation logic 620 generates address information to identify a row for an ECS operation by ECS logic. Address 630 represents the generated address output to the ECS logic for error checking and scrubbing, which can include error transparency counting.

In one example, address generation logic 620 includes counters, register, pointers, or other logic to generate an address. Traditionally, address generation logic 620 will walk through an address space sequentially to perform a patrol scrub in automatic ECS operation. Address generation logic 620 includes the ability to generate sequential address information for a memory space to scrub. Address generation logic 620 also includes the ability to pause the sequential address generation and perform scrubbing on selected rows that are not sequential, or to exclude selected addresses from scrubbing or from error counting.

In one example, address generation logic 620 receives as an input an ECS mode check 612, which represents the ECS mode configured for the ECS logic to execute. For example, one mode may indicate that error scrubbing should be skipped for excluded addresses. In another example, another mode may indicate that error scrubbing should be performed for excluded addresses, but the result should be excluded from counting.

In one example, address generation logic 620 receives an input an ECS operation trigger 614, which represents a command or trigger to perform ECS operations. For manual ECS operation, the trigger can be in the form of ECS commands issued by the memory controller. For automatic ECS operation, the trigger can be refresh commands, which trigger the internal controller of the memory device to generate internal ECS operations. For internal triggers, address generation logic 620 generates the address information for ECS operation. For manual ECS operation, the address generation logic can set a multiplexer to select an external address set by the memory controller for scrubbing, which may bypass error counting.

In one example, address generation logic 620 includes address (ADDR) exclusion logic 622, which represents logic or circuitry within address generation logic 620 excluded address information and perform comparisons to the excluded addresses. In one example, address generation logic 620 can store address information or access a storage with address information for excluded addresses. If a generated address matches an excluded address, address generation logic 620 can exclude the error count from transparency information provided to the host.

In one example, address generation logic 620 includes address (ADDR) hint logic 624, which represents logic or circuitry within address generation logic 620 to provide hints from the host for address selection for ECS operation. In one example, address generation logic 620 can store address information or access a storage with address information for addresses the host wants to have scrubbed. In one example, address generation logic 620 can factor the suggested address information with internal address information, and can choose whether to continue in sequential order or whether to select an address or addresses suggested by the host for scrubbing.

Figure 7:
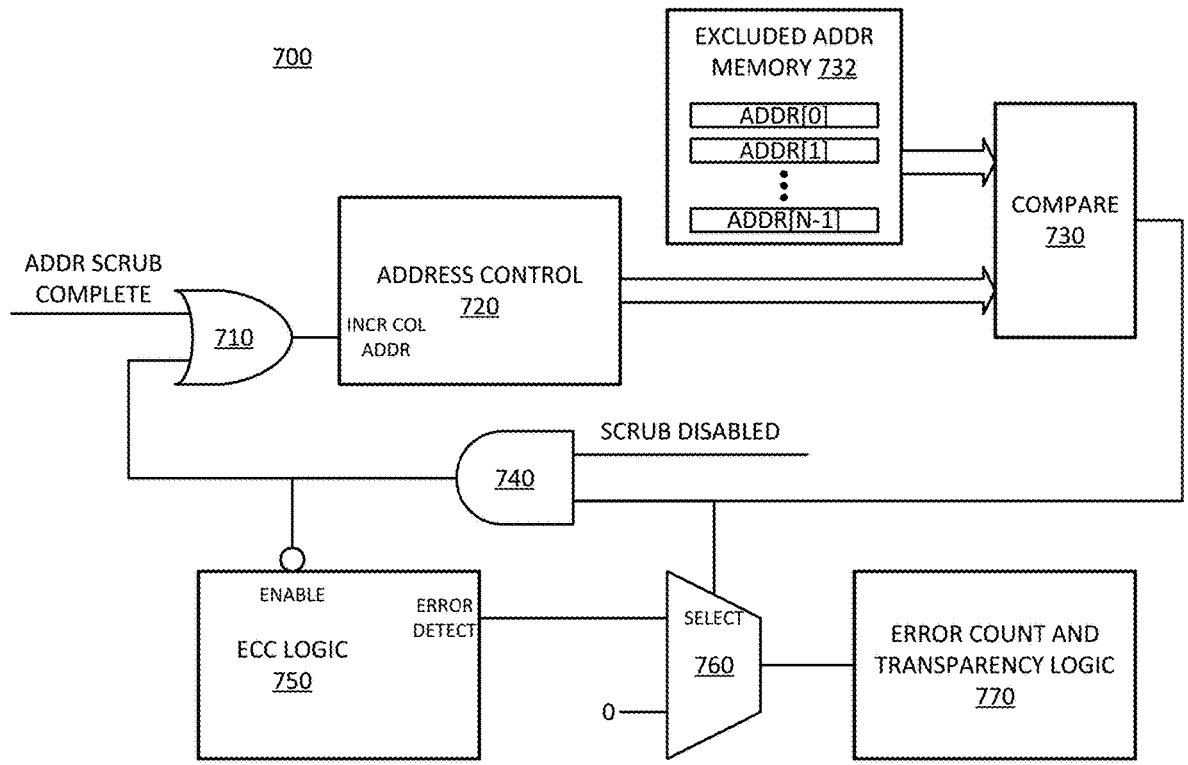
FIG. 7 is a block diagram of an example of an error scrubbing engine having adaptive address generation logic.

FIG. 7 is a block diagram of an example of an error scrubbing engine having adaptive address generation logic. System 700 represents error scrub logic in accordance with an example of system 100. System 700 represents error scrub logic compatible with the offlining of system 500. System 700 provides an example of applying memory address exclusion during internal memory scrubbing operations.

System 700 does not explicitly illustrate a memory controller and memory device. The memory controller and memory device for system 700 can be in accordance with an example of memory controller 530 and memory 550 of system 500. System 700 includes elements of an ECS system that can be in accordance with an example of system 100. Address control 720 can include address generation logic in accordance with an example of system 600.

Error count and transparency logic 770 represents the logic of the ECS system that performs counting of errors and loading the error counts into registers available to the memory controller. Error count and transparency logic 770 provides the error counting logic or error counting circuitry of system 700. ECC logic 750 represents error checking and correction logic that can detect and correct SBEs in the memory array, or detect MBEs in the memory array. As with system 100 above error count and transparency logic 770 enables an ECS to maintain counts of errors detected during scrubbing. In one example, the ECS system counts the number of rows that contain at least one error and reports the address with the highest error count. In one example, the ECS system counts cachelines (CLs) or data words (where a row can include multiple words or cachelines) with errors and reports the row address with the highest error count.

In one example, system 700 includes a storage unit within the ECS counter logic to store offlined or excluded addresses. In one example, system 700 implements one or more protocols to transfer and manage offlined page addresses between the memory controller and the memory device. In one example, system 700 implements one or more protocols to manage the scrubbing of offlined pages and the exclusion of offlined pages from error count information provided by the ECS system to the memory controller.

When the system chooses to offline pages with high numbers of errors, system 700 can operate different than a typical ECS system would. Instead of continuing to scrub these areas and include the results in the error counts, system 700 can ignore the scrub results with respect to reported error counts. Thus, ECS transparency logic in accordance with system 700 will report the online area with the highest error count instead of potentially reporting an offline area as the area having the highest number of areas.

System 700 includes address control 720, which can be address control in accordance with an example of system 100. System 700 includes excluded address (ADDR) memory 732, which represents a storage to include N addresses of offlined rows (ADDR[N−1:0]). In one example, excluded address memory 732 is part of address control 720. In one example, excluded address memory 732 is separate from address control 720 but part of the ECS engine. In one example, excluded address memory 732 is separate from address control 720 and separate from the ECS engine, but accessible by the ECS engine.

Excluded address memory 732 represents storage with excluded addresses. During scrubbing, address control 720 can check the address to be scrubbed against the list of excluded addresses in excluded address memory 732. If the address is not contained in the list of excluded addresses, then the ECS operation can continue without any modifications what is described previously. In one example, if the address is contained within the list of excluded addresses, the ECS operation is modified.

In one example, configuration settings, such as through mode register, can select one of two options for modified ECS operation. In one example, one or the other of the options is the default ECS operation when an excluded address is found. In one example, only one of the following options is available for the ECS system when an excluded address is encountered. The options are explained below with respect to possible operation of system 700.

In one example, address control 720 generates internal address information, shown as one of the inputs to compare 730. Compare 730 represents an address comparator, or a comparison mechanism to compare generated addresses with addresses identified by the host as offline. The other input to compare 730 is excluded address memory 732. In one example, compare 730 compares the address generated by address control 720 to all entries in excluded address memory 732. It will be understood that up to N address can be stored in excluded address memory 732, but there can be as few as zero addresses excluded, or any integer between 1 and N. If any address in excluded address memory 732 matches with the generated address, the output of compare 730 is set to true, or set to 1. If the addresses do not match, compare 730 will output a zero.

In one example, the output of compare 730 is the selection signal for mux 760, which selects between the error detect signal of ECC logic 750 on the "zero" input, and between a hard-coded zero on the "one" input of the mux. Thus, when compare 730 outputs a zero, mux 760 selects the output of ECC logic 750. When compare 730 outputs a one, mux 760 selects the zero. The output of mux 760 is provided to error count and transparency logic 770. For example, either the ECC logic output is provided, which can be a one or a zero, depending on detection of an error, or the input to the error counters of error count and transparency logic 770 are held at zero, thus, not counting errors.

In one example, the output of compare 730 is provided as an input to AND gate 740 to be ANDed with a scrub disabled signal. If the output of compare 730 is zero, meaning to address match is found, then regardless of the value of scrub disabled, AND gate 740 will output a zero, which will enable ECC logic 750 and provide a zero to the input of OR gate 710. When the output of compare 730 is a one meaning an address match is found, the value of scrub disabled will determine whether AND gate 740 outputs a one or a zero. If the address match is found and scrub disabled is false or set to zero, the output of AND gate 740 will be zero, enabling ECC logic 750. When the output of compare 730 is set and scrub disabled in set, the output of AND gate 740 is a one, which will disable ECC logic 750 and provide a one at the input of OR gate 710.

In one option, address control 720 prevents the ECS system from performing scrubbing and error counting on the excluded address. Thus, in response to an excluded address, address control 720 will trigger the ECS system to increment the address counter and continue with the scrub cycle without performing a scrub on the excluded address. For example, scrub disabled signal can be set high, meaning that when the output of compare 730 is asserted, AND gate 740 will output a one, disabling ECC logic 750 and providing a 1 to OR gate 710. With ECC logic 750 disabled, and a zero output from mux 760 to error count and transparency logic 770 selected, no errors will be counted, the ECC and scrub operation will not occur. The one input at OR gate 710 will trigger address control 720 to increment the address.

In a second option, address control 720 does not prevent the ECS system from performing scrubbing the excluded address but prevents counting errors on the excluded address. Thus, in response to an excluded address, address control will trigger the ECS to perform scrubbing on the excluded address but exclude the address from the row or cache line error count, and then continue with the scrub cycle. For example, scrub disabled will be set low, meaning that AND gate 740 will always output a zero, enabling ECC logic 750. The error detect input will be selected when no address match is found by compare 730, which means that when no excluded address is found and the scrub is not disabled, the output of ECC logic 750 will be provided to error count and transparency logic 770. When compare 730 outputs a one, the zero input of mux 760 will be selected and provided to error count and transparency logic 770, even though ECC logic 750 will be enabled and XOR gate 710 will not trigger incrementing the address until the signal address (ADDR) scrub complete is set high.

In either option, the memory can be said to skip the scrub count for the excluded address. In one example, the memory controller provides the excluded address information to the memory device to excluded from the ECS count with a special configuration command. In one example, excluded address memory 732 is writeable by the memory controller, such as by a mode register write command or multipurpose register write command. In one example, the memory controller will set a mode register bit to determine the behavior of the ECS system when an excluded address is encountered, whether to perform error scrubbing and exclude the result, or whether to simple not perform error scrubbing. In one example, memory controller has a command to clear selected addresses from excluded address memory 732. In one example, the memory controller can clear the entire excluded address memory 732 with a single command.

Figure 8:
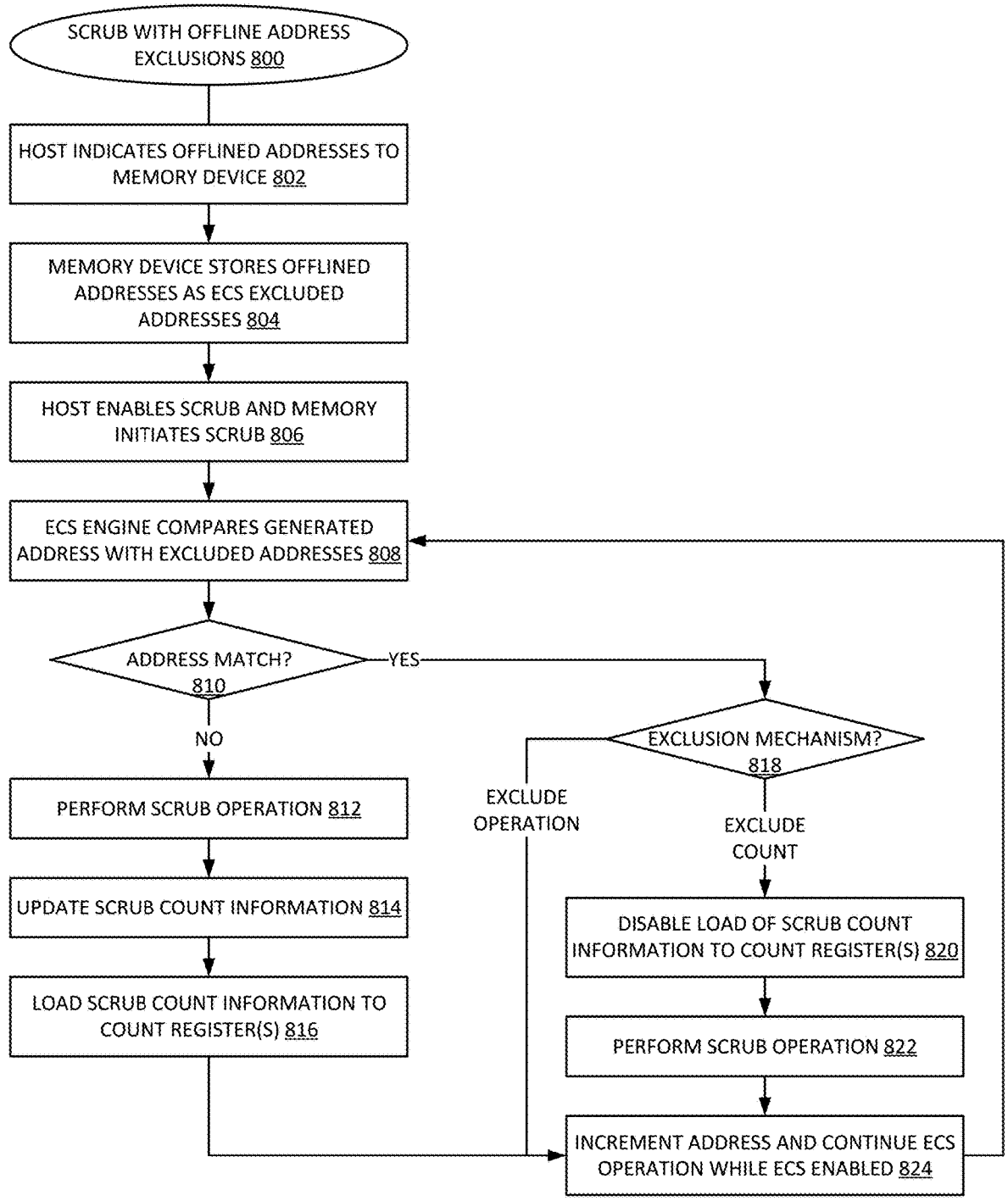
FIG. 8 is a flow diagram of an example of a process for excluding offlined rows from error scrubbing counting.

FIG. 8 is a flow diagram of an example of a process for excluding offlined rows from error scrubbing counting. Process 800 represents a process for excluding addresses on internal scrubbing and error reporting within the memory device. Descriptions throughout refer to excluded addresses as offlined addresses. It will be understood that an address could potentially be selected for exclusion by the host for a reason other than the fact the address has been offlined. Thus, descriptions related to offlined addresses can refer generally to any address that the host determines should be excluded from error reporting.

In one example, the host indicates the offlined or excluded addresses to the memory device, at 802. In one example, the memory device stores the offlined addresses as ECS excluded addresses, at 804. In one example, the host writes the addresses to a register or memory accessible to the memory controller, in which case the memory device simply needs to access the storage to determine what addresses are excluded. In one example, the memory controller sends a command for each address that should be excluded, and the memory device records the address in an excluded address list.

In one example, the host enables scrub operations and the memory initiates the scrub, at 806. For automatic scrub where the memory device generates address information, and can therefore exclude addresses from scrub, the host can enable scrub with a configuration setting and then send refresh commands or self-refresh commands to trigger the memory to perform scrub operations. The host can send additional refresh commands relative to what would normally be needed to accomplish refresh within the refresh period. In one example, the memory device can use the additional refresh commands for error scrubbing.

In one example, the ECS engine on the memory compares generated address information with excluded addresses, at 808. If there is not an address match, at 810 NO branch, the ECS engine can perform the scrub operation, at 812, and update scrub count information, at 814. The ECS engine will load the scrub count information to one or more count registers for access by the host, at 816. The ECS engine can then increment the address and continue with ECS operations while ECS is enabled to be performed, at 824.

If there is an address match, at 810 YES branch, the ECS operation will depend on the exclusion mechanism used. If the exclusion mechanism is to skip the scrub operation, at 818 EXCLUDE OPERATION branch, in one example, the ECS engine can simply increment the address and continue with ECS operations while ECS is enabled to be performed, at 824.

If the exclusion mechanism is to only exclude the scrub count, at 818 EXCLUDE COUNT branch, in one example, the ECS engine disables the loading of scrub count information to the count registers(s), at 820. The ECS engine can then perform the scrub operation, at 822, and increment the address and continue with ECS operations while ECS is enabled to be performed, at 824.

Figure 9:
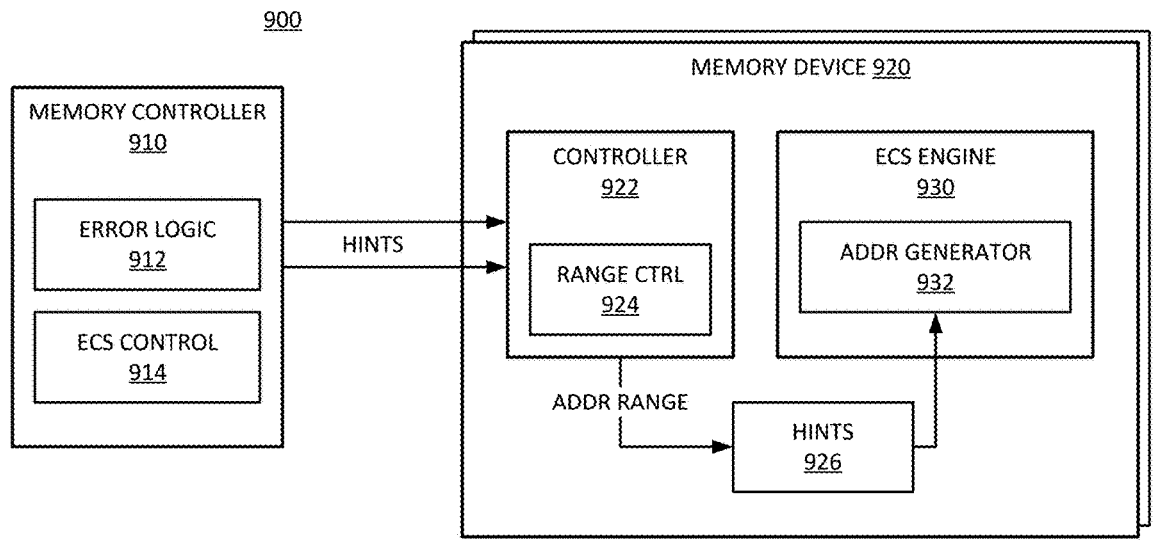
FIG. 9 is a block diagram of an example of a system that provides adaptive error scrubbing operation based on information from the host to the on-memory error scrubbing engine.

FIG. 9 is a block diagram of an example of a system that provides adaptive error scrubbing operation based on information from the host to the on-memory error scrubbing engine. System 900 can be in accordance with an example of system 300. The ECS engine can be in accordance with an example of system 100.

Memory controller 910 represents a host for system 900. In one example, memory controller 910 includes error logic 912, which represents logic or circuitry within memory controller 910 to perform error correction on data from memory devices 920. In one example, error logic 912 enables memory controller 910 to correlate error date to detect patterns of errors. The patterns of errors can include errors in common locations across multiple different memory devices 920, or within specific regions within memory device 920, or to correlate a pattern of increases in MBEs with SBEs, or to correlate MBEs in regions around stored ACT addresses, or other patterns.

Memory controller 910 includes ECS control 914, which represents control logic or circuitry within memory controller 910 to provide commands related to error scrubbing by memory devices 920. In one example, based on information generated by error logic 912, ECS control 914 can generate hints of addresses that memory controller 910 determines should be scrubbed, or would benefit from a scrub. The determination can be a determination that multiple SBEs or MBEs are found in specific areas and a scrub could prevent additional errors from occurring.

Memory controller 920 can pass the hints to memory device 920, which receives the hints at controller 922. Controller 922 represents an on-memory controller that controls the operations internal to memory device 920. In one example, controller 922 applies range control (CTRL) 924 to the received hints. Range control 924 represents default configuration or protocol settings by which controller 922 can interpret the hints provided by memory controller 910. In one example, the hints are addresses, which can include start and end addresses, identified by range control 924 to be ranges of addresses. In one example, the hints are individual addresses, which range control 924 can interpret as an address range, by including a default range to the address.

Controller 922 can provide the address range information to hints 926 to store within memory device 920. Hints 926 represents a storage for hint information from the host. Hints 926 can also be referred to as suggestions, in that memory controller 910 provides address information to suggest addresses or address ranges for scrub operations. Hints 926 can represent a memory or storage location external to ECS engine 930, or can represent a memory or storage location within ECS engine 930.

ECS engine 930 includes address (ADDR) generator 932 to generate internal address information for the performance of ECS operations within memory device 920. In one example, address generator 932 applies hints 926 to determine what addresses to generate for ECS operations.

In one example, ECS engine 930 performs memory scrubbing as a continuous background operation to proactively fix correctable errors and detect uncorrectable errors with on-die ECC. Based on performing the background ECS operations based on hints 926, ECS engine 930 can scrub areas of memory device 920 that could otherwise develop errors, which could include avoiding uncorrectable error creation.

In one example, ECS engine 930 performs patrol scrubbing. A scrubbing operation can include a read to memory followed by a write to memory if a correctable error is detected. In the case of detection of an uncorrectable error, in one example, ECS engine 930 poisons the data and writes the data back to memory. In one example, both corrected and uncorrected errors are reported via a machine check architecture (MCA). The use of data poisoning can provide error containment and possible MCA recovery in accordance with the MCA architecture.

Based on hints 926 provided by memory controller 910 and used by ECS engine 930, system 900 can steer memory scrubbing to continually adjust to the system's environment. Hints 926 can be of any nature that can help ECS engine 930 optimize its operation. In one example, hints 926 includes hints related to load on the system, or hints related to environmental conditions such as temperature. The hints can be related to stress conditions, which can include the environmental conditions, as well as other system conditions such as a central processing unit (CPU) loading, network bandwidth usage, rate of writes to memory, or other condition.

For example, if the system is lightly loaded, the memory subsystem may benefit from accelerated patrol scrubbing. In such an example, hints 926 can provide both address generation hints as well as hints related to the rate of ECS. In one example, hints 926 can trigger ECS engine 930 to adjust its scrub rate, similar to what is discussed above with reference to system 200. In one example, hints 926 represent specific row addresses by the In one example, the host OS associated with system 900 wants to scrub a given region in memory before assigning it to an application. In one example, memory controller 910 can suggest scrubbing part of memory device 920 that is underutilized, to benefit a region of memory from directed patrol scrubbing while other portions of the memory space are being accessed, which may instead benefit more from demand scrubbing or manual scrubbing. In one example, hints 926 provide the means to proactively seek out correctable and uncorrectable data errors during patrol scrubbing operations in system 900, which can allow system software a mechanism to suggest scrubbing to either predict future failures from the corrected error rates or invoke recovery from the uncorrected data failures in the non-execution path. Such directed scrubbing can avoid limitations in other RAS (reliability, availability, and serviceability) functions such as MCA recovery on the execution path, where at the time of operation of the other functions, the errors may have increased to being not recoverable.

In one example, memory controller 910 provides the hints or requests for scrubbing for one or more regions based on the detection of errors or the detection of a row hammer condition or row hammer event. The hints provide a mechanism to system 900 to adapt the granularity of the application of error scrubbing, by scrubbing specific areas of memory, allowing different scrub rates among different regions (e.g., by repeating scrubbing of certain regions before completion of a patrol scrub), or responding to error rate changes, row hammer conditions, or environmental conditions.

Figure 10:
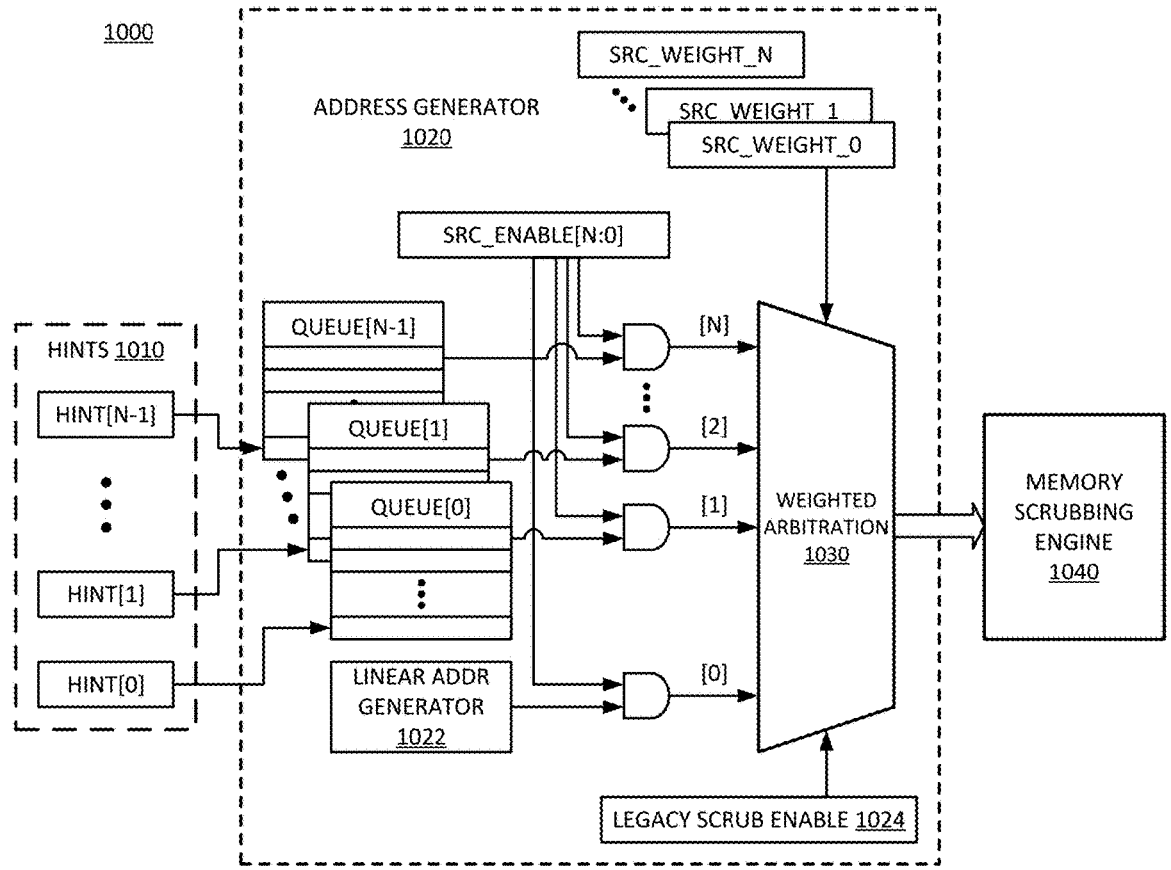
FIG. 10 is a block diagram of an example of adaptive address generation logic for an adaptive error scrubbing engine responsive to host hints.

FIG. 10 is a block diagram of an example of adaptive address generation logic for an adaptive error scrubbing engine responsive to host hints. System 1000 enables host hints to be used by the on-memory address generation logic of the ECS engine, which can enable "predictive memory scrubbing," by which the memory can be scrubbed in a way that can reduce the number of errors that occur in the memory array.

System 1000 illustrates components of on-memory prefetch sources for a predictive memory scrubber. System 1000 can be in accordance with an example of system 900. The address generation can be in accordance with an example of system 600.

System 1000 includes address generator 1020, which generates internal address information for automatic ECS operation, which can include patrol scrubbing. In one example, system 1000 includes hints 1010. N hints are illustrated (hint[N−1:0]). In one example, the host is limited to a certain number of hints that it can provide to the memory device. Thus, the host can determine what hints it considers the most important and limit the hints provided based on which hints have more significance.

Hints 1010 can be considered addresses identified or marked by the host as candidates for scrubbing. The host can provide one identified address for scrubbing, or can provide multiple hints 1010 to provide multiple identified addresses for scrubbing. The hints can be referred to as identified addresses, being addresses identified by the host that the host determined should be scrubbed. In one example, the host provides a suggested weight for each hint, which can be provided based on protocol between the memory device and the memory controller. The weights can be in accordance with a configured scale or type of hint. The scale or the type of hint can help address generator 1020 to determine the priority of various hints.

In one example, address generator 1020 supports the legacy operation of traditional ECS system address generation. Linear address (ADDR) generator 1022 can represent a legacy address generator that will step through scrubbing all of the memory array within a given period of time. In one example, the hint features can be disabled within address generator 1020 to enable traditional memory scrubbing operation. For example, the signal legacy scrub enable 1024 can bypass weight arbitration 1030 to always provide the output of linear address generator 1022 as the address output to memory scrubbing engine 1040.

As already mentioned, in one example, address generator 1020 includes weighted arbitration 1030, which represents a weight arbiter to select among multiple possible address sources. In one example, weighted arbitration 1030 is implemented in hardware and can be referred to as a weighted arbitration circuit. In one example, weighted arbitration 1030 is implemented in hardware or a combination of hardware and software and can be referred to as weighted arbitration logic. In one example, linear address generator 1022 is one of the inputs to weight arbitration 1030, which allows system 1000 to select between sequential scrubbing operation and host hints 1010. In one example, address generator 1020 can selectively pause the sequential scrubbing operation, scrub another region of memory, which can be a repeat scrub of an area already scrubbed in the patrol scrub operation, or can be an area being scrubbed out of order, and then resume the sequential scrub after applying scrubbing to hinted addresses.

Weight arbitration 1030 includes logic that permits switching between different address sources. The output of weighted arbitration 1030 is fed to memory scrub engine 1040, which can be a legacy scrub engine or a scrub engine with other adaptive scrub features described. In one example, system 1000 includes programmable weights for arbitration sources. The programmable weights can be referred to as source weights. In one example, there is an associated weight for each of the input hints or the addresses identified by the host. In one example, each associated weight can be stored in a separate register, which can be referred to as an associated register that stores the weight for a hint. In one example, there is not a one-to-one correspondence between weights and hints. In a situation where there is not a one-to-one correspondence between hints, there can be refer weights, with one weight associated with multiple hints, such as one weight to apply to a class or a group of hints.

The arbitration sources can thus be configured by different weight registers SRC_WEIGHT[N:0]. In one example, there are N+1 weight sources, to provide weights for the N hints 1010 plus provide a weight for linear address generator 1022. The source weights (SRC_WEIGHT) can be provided as input to weighted arbitration 1030 to enable the arbiter to weight the different address sources based on type or priority.

In one example, system 1000 includes a source enable (SRC_ENABLE) control register SRC_ENABLE[N:0] to individually enable or disable different scrubbing hint sources. For example, the control register can include a bit assigned to enable/disable each scrubbing hint individually.

In one example, system 1000 includes address ranges to associate with the various hints 1010, as represented by the queues for the different hints. Queues[N−1:0] can provide start address and end address registers for each hint, thus providing regions of addresses for hints.

In one example, the registers SRC_WEIGHT[N:0] are accessible programmable during runtime of the memory system platform agents such as the PCU (power control unit), for example, based on system temperature, or by CPU (central processing unit) utilization. The registers can be dynamically updated at runtime to dynamically adjust the weights to changing conditions with the system. The weight values in SRC_WEIGHT[N:0] correspond to how frequently the arbiter will pick the addresses to feed to the memory scrubbing engine.

In one example, the source weight registers can be considered knobs matched to hints 1010 to provide the ability to influence the operation of memory scrubbing engine 1040 to fit the usage of the system. Programmatic weighting of the hints can help the arbiter account for each hint, out of all the hints provided, by its relative importance to the scrubbing actions or scrubbing operations. In one example, the weights are dynamically programmable by the memory device itself, or by the host or the memory controller. In one example, the weights can be dynamically adjusted during runtime of the memory based on stress conditions, such as those identified above. For example, changes in system conditions can identify a reason to more heavily weight one hint over another. In another example, changes in system conditions can indicate a reason to change all weights for hints relative to the weight assigned to the legacy address generation.

In one example, system 1000 includes a patrol scrub finished indication to mark the end of a scrub operation for a given hint/region. The indication can be programmable to support various usage models such as SMI (system management interrupts) for platform level handling, BMC (baseboard management controller) for indication to the motherboard service processor, or CMCI (corrected machine check interrupt) to notify of a corrected event, or SCI (serial communication interface) to provide direct messaging to the host OS.

Figure 11:
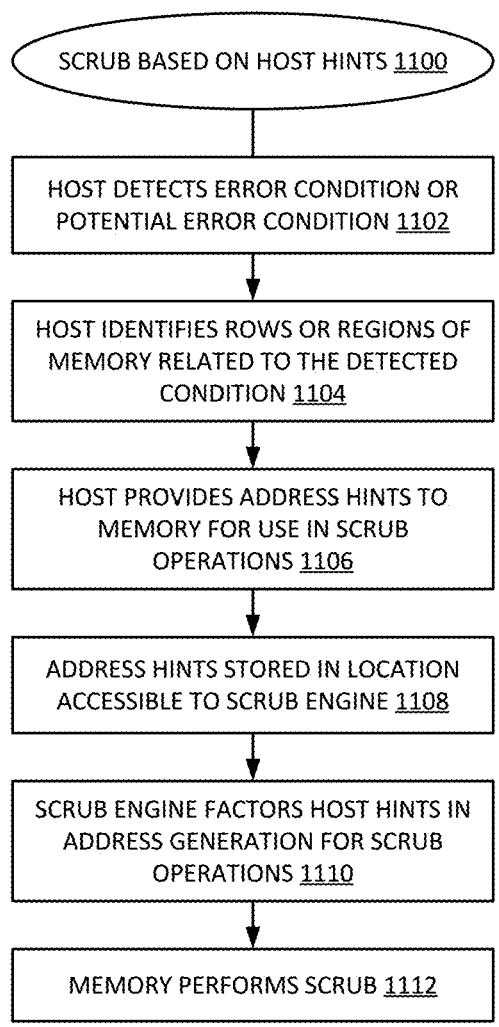
FIG. 11 is a flow diagram of an example of a process for scrubbing based on host hints.

FIG. 11 is a flow diagram of an example of a process for scrubbing based on host hints. Process 1100 represents a process for scrubbing based on host hints. The process can be executed by an adaptive ECS system in accordance with any example provided.

In one example, the host detects an error condition or a potential error condition in the memory, at 1102. The error condition or potential error condition can be identified from an increase in SBEs or an increase in MBEs, patterns of errors as otherwise described, or other condition. In one example, the host identifies rows or regions of memory that are related to the detected error condition or predicted error condition, at 1104.

The host can provide address hints to the memory for use in scrub operations, at 1106. More specifically, the ECS engine of the memory can use the hint information to determine what addresses to use for ECS operations. In one example, either the host directly stores the hints in a storage location accessible to the ECS engine, or the memory stores the hints in a location accessible to the ECS engine, at 1108. In one example, the system can also store hint weights for use by the address generation system to dynamically adjust the weight to be applied in decision making about what addresses to use for error scrubbing. The weights can thus reflect changing conditions in the system and dynamically change an arbitration decision as to what addresses to scrub.

The scrub engine factors the hots hints in address generation for the scrub operations, at 1110. The memory then performs the scrub based on the selected addresses, at 1112.

Figure 12:
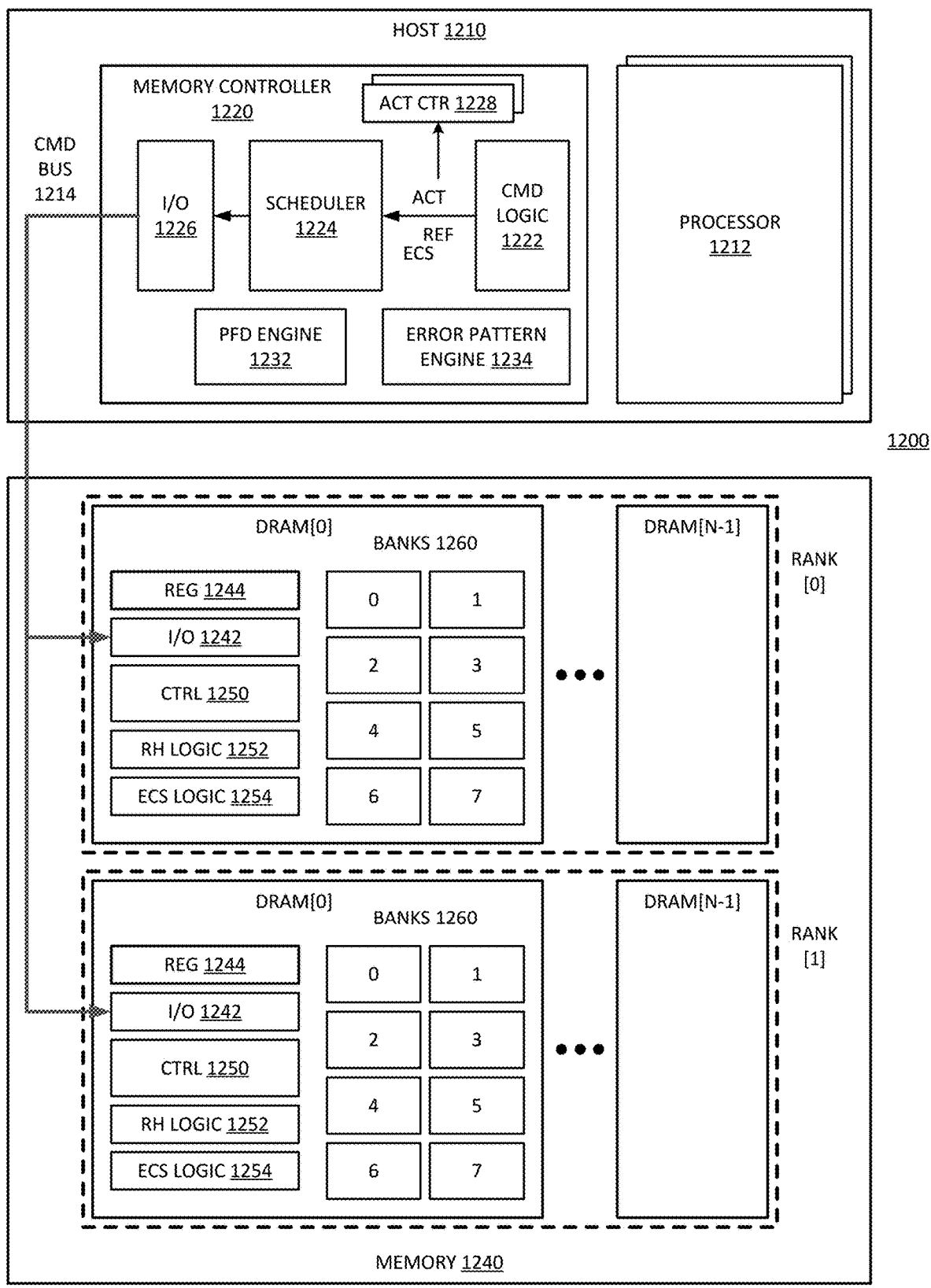
FIG. 12 is a block diagram of an example of a memory subsystem in which the host can detect row hammer conditions based on patterns of errors in the memory.

FIG. 12 is a block diagram of an example of a memory subsystem in which the host can detect row hammer conditions based on patterns of errors in the memory. System 1200 represents elements of a computing system. System 1200 provides an example of a system in accordance with an example of system 200, an example of system 300, or an example of system 900.

Host 1210 includes one or more processors 1212 (e.g., a central processing unit (CPU) or a graphics processing unit (GPU)) that generate requests for data stored in memory 1230. In one example, memory controller 1220 is integrated onto processor 1212. Memory controller 1220 includes I/O (input/output) 1226 to connect to memory 1230. I/O includes connectors, signal lines, drivers, and other hardware to interconnect the memory devices to host 1210. I/O 1226 can include command I/O as represented by command (CMD) bus 1214, and data I/O by a DQ (data) bus (not specifically illustrated). CMD bus 1214 includes command signal lines that enable memory controller 1220 to send commands to memory 1230, including activate commands (ACT), refresh commands (REF), and commands associated with ECS operation (ECS).

Memory controller 1220 includes command (CMD) logic 1222 to generate commands for memory in response to operations by processor 1212. The commands can be commands for data access (such as Read, Write, Refresh, or other commands), or commands for configuration (such as mode register commands). Memory controller 1220 includes scheduler 1224 to schedule when to send commands in a sequence of operations. Scheduler 1224 can control the timing for I/O to improve the chance that I/O will be error free. The order of commands can maintain high utility of the memory to improve data throughput. In one example, the order of commands can influence the execution of scrub operations, and scheduler 1224 manages the order of commands to ensure memory 1240 can perform automatic scrubbing.

System 1200 illustrates two ranks of memory devices in memory 1240, Rank[0] and Rank[1]. A rank refers to a collection or group of memory devices that share a select line (e.g., a CS signal line). Thus, memory devices in a rank will execute operations in parallel. Rank[0] and Rank[1] are illustrated to include N DRAM devices or DRAMs. Typically, a system with multiple ranks will have the same number of DRAMs in each of the ranks.

DRAM[0] of Rank[0] and DRAM[0] of Rank[1] are shown to include I/O 1242, registers (REG) 1244, control (CTRL) 1250 or control logic 1250, row hammer (RH) logic 1252, and ECS logic 1254. Such components will be understood to be included in the other DRAMs as well. I/O 1242 represents connection hardware comparable to I/O 1226 of memory controller 1220. I/O 1242 enables connection of DRAMs to memory controller 1220. Register 1244 represents one or more registers within the DRAM, which include one or more configuration registers such as mode registers. Register 1244 can include configuration settings for ECS operation in accordance with what is described above.

Control logic 1250 represents control components within the DRAM to decode and execute the commands and access operations. Control logic 1250 causes the DRAM to perform the internal operations needed to execute the access initiated by memory controller 1220. In one example, the DRAMs include RH logic 1252, which represents logic or circuitry within the DRAMs to perform row hammer mitigation, such as targeted refresh commands. RH logic 1252 can enable the DRAM to decode a row hammer refresh command to refresh the victim row or rows.

In one example, the DRAMs include ECS logic 1254, which represents logic or circuitry within the DRAMs to perform automatic ECS operations, including address generation. ECS logic 1254 is adaptive in accordance with any example described, where the ECS logic can respond to host hints, the ECS logic can perform address generation based on host hints or excluded addresses, or and can adjust or adapt its scrub rate based on system conditions. In one example, ECS logic 1254 can also respond to hints or signals related to row hammer determinations by memory controller 1220.

The DRAM devices are illustrated as having multiple banks (Bank[0:7]). It will be understood that eight banks is one example, and is not limiting. Other systems may include 4 banks, 16 banks, 12 banks, or some other number of banks. A binary number of banks is simpler from the perspective of addressing but is not necessary for purposes of operation, and any number of banks could be used. Banks 1260 can be utilized as separate banks, separately addressable by bank number. In one example, banks 1260 are organized in a bank group, such as Bank[0:3] as BG0 (bank group 0) and Bank[4:7] as BG1. The bank groups could alternatively be BG0 having Bank[0,2,4,6], for example, or some other grouping. Bank groups can typically be accessed separately and can enable shorter access times than back to back accesses to banks of the same bank group, for example.

In one example, memory controller 1220 includes one or more activate counters (ACT CTR) 1228 to monitor a condition for row hammer mitigation. In one example, counters 1228 detect a number of activate commands sent to memory 1240. Tracking activate commands scheduled to be sent to memory 1240 can indicate when a particular address is being repeatedly accessed within the refresh period.

In one example, memory controller 1220 includes permanent fault detection (PFD) engine 1232, which represents logic or circuitry within memory controller 1220 to determine whether a detected fault in memory 1240 is a permanent fault (i.e., a hard fault), or a transient error (a soft fault). PFD engine 1232 can enable memory controller 1220 determine the severity of errors within the DRAMs of memory 1240, to determine if directed automatic ECS operation can reduce errors within system 1200. In one example, PFD engine 1232 can operate by writing a known pattern (e.g., 1010 . . . b) to a failing address in response to detection of an MBE. The host can then read the data back to ensure the error is transient and not permanent. To ensure the address is properly checked, the host writes need to ensure that the data is written to the array (e.g., by issuing a precharge and then opening the page again for a read) and not just to the sense amps.

In one example, memory controller 1220 includes error pattern engine 1234, which represents logic or circuitry within memory controller 1220 to identify patterns of errors based on errors within memory 1240. In one example, error pattern engine 1234 identifies patterns based on the address locations of different errors in the DRAMs. For example, errors at similar addresses of the bank group or the same bank address for DRAMs within the same rank could be indications that the errors are being created through targeted attacks. In one example, error pattern engine 1234 can identify errors within the DRAMs based on ECS data from ECS logic 1254, which can be matched to errors detected by system level error correction of memory controller 1220 (not specifically illustrated).

In one example, based on error pattern recognition, memory controller 1220 can schedule additional refreshes and provide ECS hints to the DRAMs. Thus, memory controller 1220 can indicate hints to ECS logic 1254 and provide refresh commands to enable ECS logic 1254 to perform ECS operations, which can include taking into account the ECS hints.

In one example, based on detection of multibit errors by error pattern engine 1234, memory controller 1220 can engage PFD engine 1232 to determine if the errors are transient or permanent. In one example, in response to determining that the MBEs are transient, memory controller 1220 determines that the errors are related to a row hammer attack. In response to the determination of a row hammer attack, memory controller 1220 can schedule row hammer mitigation refreshes, or refresh commands for DRAMs to perform ECS operations to scrub memory.

It will be understood that in accordance with ECS address generation as described previously, the ECS logic can respond to hints. As such, the system can provide row hammer target row addresses or row hammer victim row addresses into the hints for the ECS engine. However, it will be understood that using all row hammer information as ECS hints could require an unrealistic amount of resources. By allowing memory controller 1220 to determine what addresses should be used as hints and providing selected addresses, system 1200 can apply row hammer information to direct to steer ECS operation with a reasonable use of resources with the DRAMs. Additionally, memory controller 1220 can provide hint information that is directed related to a determine of row hammer condition as well as determining to provide a hint that is not directly related to a determination of a row hammer condition.

Figure 13:
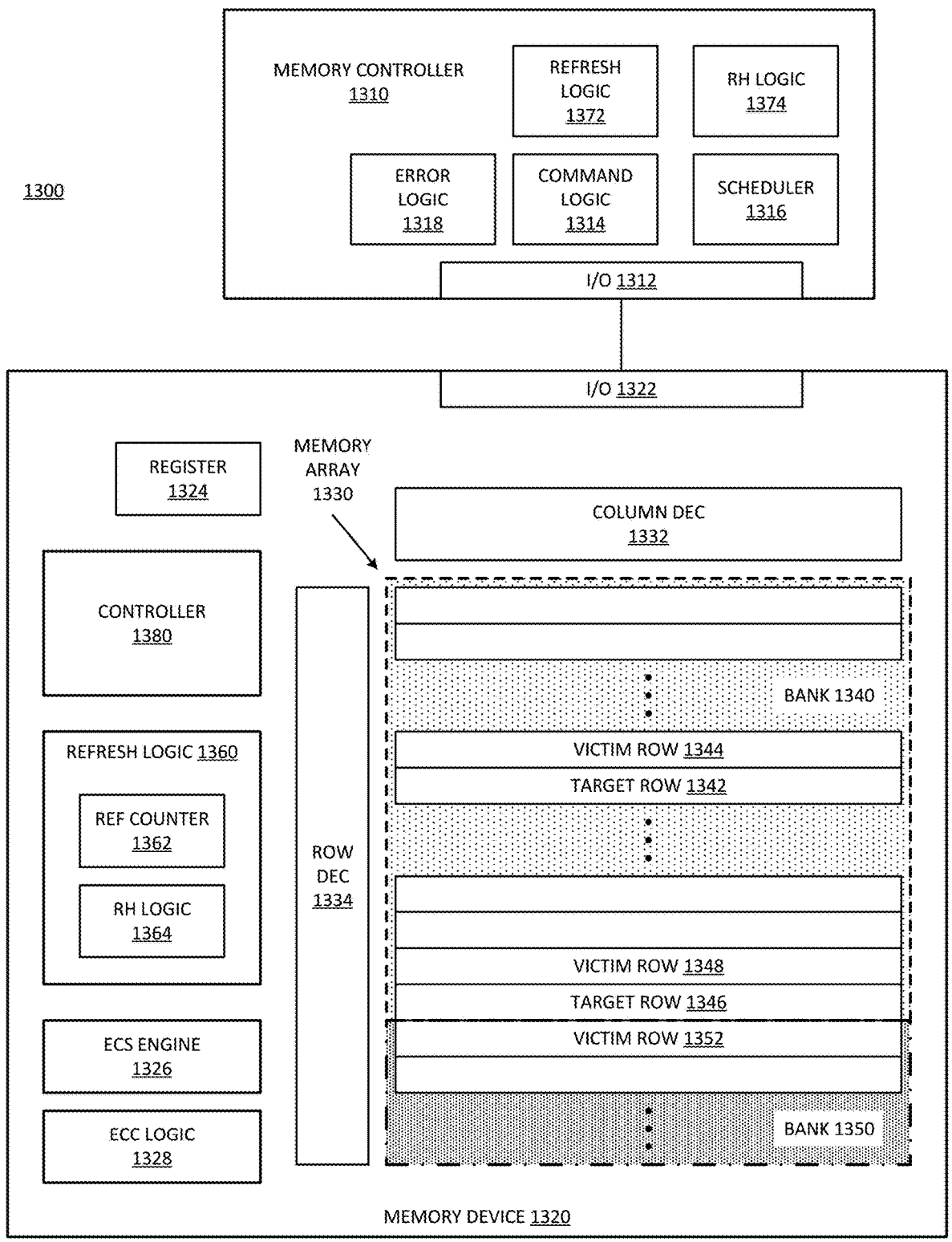
FIG. 13 is a block diagram of an example of a system that performs row hammer mitigation based on host detection of a pattern of errors in memory.

FIG. 13 is a block diagram of an example of a system that performs row hammer mitigation based on host detection of a pattern of errors in memory. System 1300 provides an example of a system in accordance with an example of system 1200. Memory controller 1310 can be referred to as a host controller, or simply, a controller. Memory device 1320 can include any type of memory technology that has adjacent rows of memory cells, where data is accessible via a wordline or the equivalent. In one example, memory device 1320 includes DRAM technology. The rows of memory device 1320 are refreshed to maintain a deterministic state.

Memory device 1320 includes memory array 1330, which represents an array of memory cells or storage cells. A memory cell stores a bit of data, or multiple bits for a multilevel cell. Memory array 1330 includes a representation of potential row hammer situations. For purposes of example, memory array 1330 shows bank 1340 and bank 1350. It will be understood that memory array 1330 can include multiple banks, including banks not shown. In general, a bank or a sub-bank of memory includes memory cells that are addressable separately from memory cells of another bank or sub-bank, and are thus accessible in parallel to another portion of memory array 1330.

Memory device 1320 includes column decoder (dec) 1332 which represents logic or circuitry to apply charge to a column based on an access command. In one example, column decoder 1332 selects a column in response to a column address strobe (CAS) command. Memory device 1320 includes row decoder (dec) 1334 which represents logic or circuitry to apply selection voltages to rows based on a memory access command. In one example, the row decoder 1334 selects a row in response to a row address strobe (RAS) command.

Memory controller 1310 includes command logic 1314 to generate commands for memory device 1320. Commands can include commands such as Write commands or Read commands. Commands can also include Activate commands, Precharge commands, Refresh commands, or other commands. In one example, memory controller 1310 includes refresh logic 1372, which represents logic to control the refreshing of memory device 1320.

Refresh logic 1372 can include one or more counters to determine the need for refresh of memory device 1320 and register space to track the sending of refresh commands. Refresh commands can include external refresh commands (e.g., REFab, REFpb) where the memory device continues to operate in accordance with a clock signal from memory controller 1310. Refresh commands can include a self refresh command (e.g., SRE) where the memory device operates on an internal clock instead of based on a clock signal from the memory controller. During certain refresh commands, memory device 1320 can perform error scrubbing, in accordance with any description herein. In one example, memory controller 1310 includes row hammer (RH) logic 1374 to enable the controller to respond to a row hammer condition.

Memory controller 1310 includes scheduler 1316 to manage the scheduling and sending of sequences of commands to memory device 1320. Scheduler 1316 includes logic to determine the order of commands, as well as timing requirements for the commands. Memory controller 1310 has to make determinations of what commands to send, including commands related to configuring and enabling ECS operations. In one example, scheduler 1316 includes a buffer queue up commands for sending to memory device 1320.

Memory controller 1310 includes I/O (input/output) hardware 1312. I/O 1312 represents transceivers and signal line interface hardware to enable memory controller 1310 to connect to memory device 1320 over one or more buses. I/O 1312 enables memory controller 1310 to send commands to memory device 1320.

For an illustration of a row hammer condition, memory array 1330 includes target row 1342 in bank 1340. A physically proximate row or a physically adjacent row can suffer from unintentional programming or disturb of one or more values stored in the row based on repeated access to target row 1342 within a time period prior to a refresh operation on the row. Victim row 1344 represents a row that is subject to row hammer when target row 1342 is repeatedly accessed. When victim row 1344 is at risk of a row hammer event, target row 1342 can be referred to as an aggressor row. There may be another row in bank 1340 that is a victim row to target row 1342.

In one example, bank 1340 also includes target row 1346. Consider that target row 1346 is at or near a bank boundary. Depending on the architecture of the physical layout of the rows, a row on the boundary of bank 1350 could also be at risk for a row hammer event based on access to target row 1346. In one example, repeated access to a target row can cause a disturb of multiple adjacent rows. In as illustrated, target row 1346 can result in row hammer events to both victim row 1348 of bank 1340 and victim row 1352 of bank 1350.

Memory device 1320 includes I/O 1322 to interface with I/O 1312 of memory controller 1310. I/O 1322 has corresponding signal lines to I/O 1312 to receive commands and address information to receive activate and refresh commands, among other commands. In one example, I/O 1322 includes an interface to a data bus to exchange data with memory controller 1310.

Memory device 1320 includes register 1324, which represents one or more registers or storage locations to store configuration information or values related to the operation of memory device 1320. In one example, register 1324 includes one or more mode registers. In one example, register 1324 includes configuration information to control the application of error scrubbing by ECS engine 1326 in memory device 1320.

Memory device 1320 includes controller 1380, which represents a controller local to the memory device. Controller 1380 includes hardware logic to execute operations in response to commands. Controller 1380 includes software or firmware logic to control the hardware logic and control operations and sequences of operations in the memory device. In one example, controller 1380 includes refresh logic 1360. In one example, controller 1380 includes ECS engine 1326. Controller 1380 manages I/O 1322.

In one example, memory device 1320 includes refresh logic 1360, which represents logic within memory device 1320 to manage refreshing of memory array 1330. In one example, refresh logic 1360 includes refresh (REF) counter 1362 and row hammer (RH) logic 1364. Refresh counter 1362 enables refresh logic 1360 to count addresses and timing for internal refresh operations. Row hammer logic 1364 enables refresh logic 1360 to perform internal operations related to refresh, which can include self-refresh.

ECS engine 1326 represents ECS logic in accordance with any example described. ECS engine 1326 applies ECC logic 1328 to perform error checking and correction and provides error information to memory controller 1310, which error logic 1318 can use to identify the possibility of a row hammer attack. In one example, error logic 1318 can determine from error patterns whether a row hammer condition exists within memory device 1320.

In one example, error logic 1318 uses ECC error information to detect row hammer attacks. In one example, command logic 1314 is enabled to send a read retry command or comparable command that triggers memory device 1320 to return data without the application of ECC logic 1328. Thus, the application of ECC logic 1328 can be optionally disabled in response to a retry command. The use of a read command where memory device 1320 sends data without SBE enabled can allow the host to get data from a specific memory device 1320 without any mis-corrections due to on-die ECC mis-corrects for single bit errors. Error logic 1318 can detect error patterns even without such a read command. However, application of such a command could provide another mechanism to detect the error pattern.

In one example, error logic 1318 can detect error patterns better through the use of the special read command mentioned. In one example, error logic 1318 can enable memory controller 1310 to detect row hammer attacks based on error information in system 1300. In one example, error logic 1318 can detect MBEs based on a patrol scrub by ECS engine 1326. Row hammer bit flips are transient in nature and can have similar address locations across the rank on a DIMM. If error logic 1318 detects such an error pattern, it can be an indication that system has been compromised. In one example, error logic 1318 can apply knowledge of adjacent row addressing for scrubbing based on detection of a row hammer condition. Instead of simply refreshing the victim rows, memory controller 1310 can trigger ECS engine 1326 of memory device 1320 to correct the regions around the victim row or regions around the target row.

Another pattern error logic 1318 can detect is if correctable errors (CEs) are detected to be offset by an expected offset, it can be an indication of row hammer attack. In one example, RH logic 1374 of memory controller 1310 can maintain a list of recent ACT commands to use for probabilistic targeted row refresh (pTRR) to determine if there is a correlation to MBEs and an address for an ACT. A strong correlation can indicate a row hammer attack. In one example, ECC logic 1328 includes on-die error counters. In one example, memory device 1320 includes an MBIST (memory built-in self-test) engine to track errors. In one example, a heuristic-based DRAM health monitor can detect row hammer attacks.

In one example, error logic 1318 can detects an error pattern based on errors in rows that are spatially grouped. Detection of the error patterns and the providing of row hammer response or ECS operations in response to the pattern detection can also be effective at row fuzzing attacks instead of simple row hammer attacks. Even to the extent that traditional row hammer mitigation techniques are effective against simple row hammer attacks (i.e., a specific aggressor row), they are not necessarily effective against row fuzzing (i.e., multiple different aggressor rows targeted simultaneously).

In one example, error logic 1318 detects errors based on errors detected by ECS operation or other ECC operations and performs tests to determine or compute if there are patterns of errors in the memory, or whether the errors are simply random/transient. When memory controller 1310 detects a pattern of errors, memory controller 1310 can determine that the memory is experiencing a row hammer attack, and perform an operation to address the row hammer condition. The operation can include: limiting access to the memory; directing additional ECS operations by ECS engine 1326; triggering a row hammer response mechanism by refresh logic 1360; or, a combination of operations.

Figure 14:
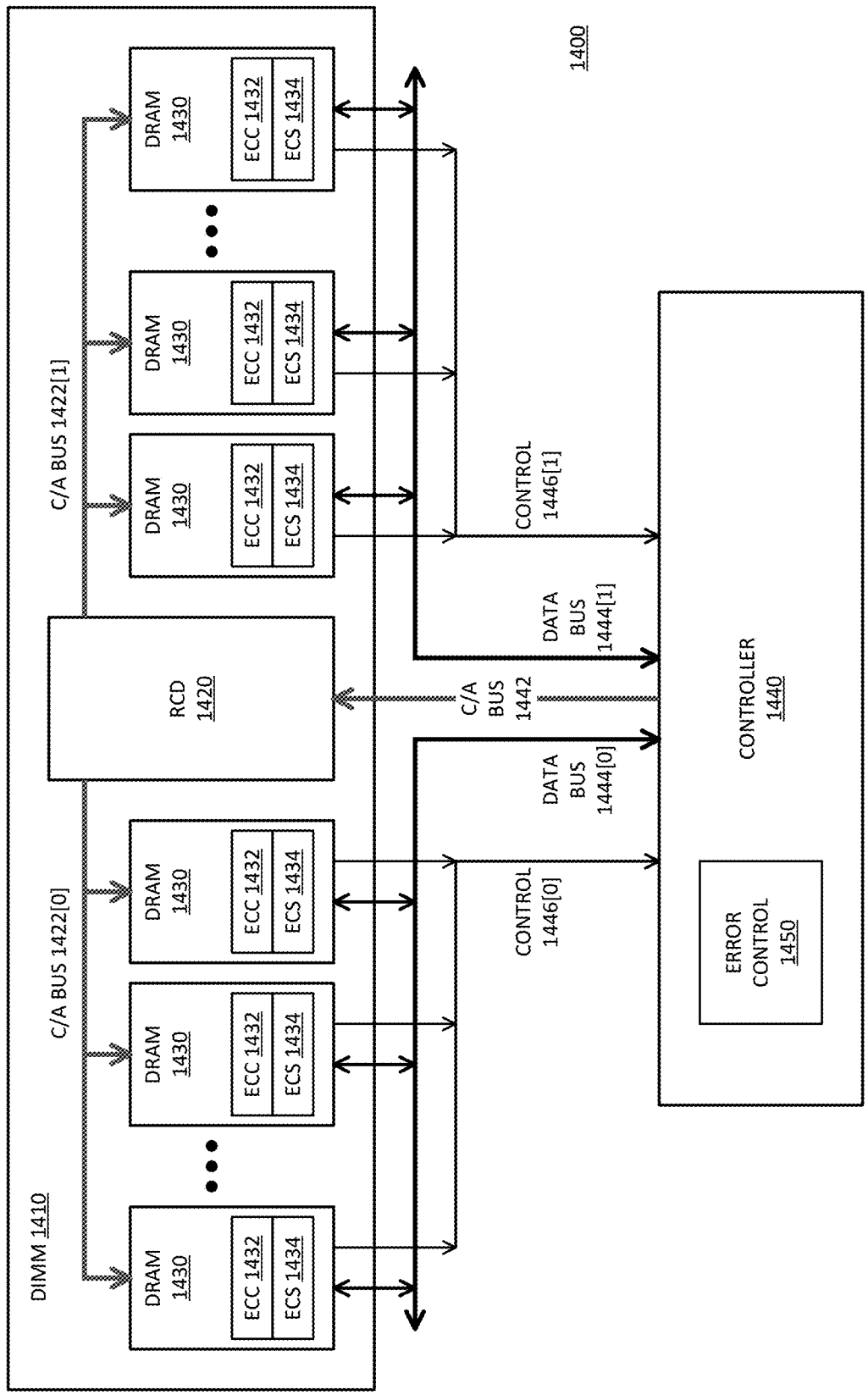
FIG. 14 is a block diagram of an example of a memory module with memory devices having error logic to provide adaptive error scrubbing.

FIG. 14 is a block diagram of an example of a memory module with memory devices having error logic to provide adaptive error scrubbing. System 1400 provides an example of a system in accordance with an example of system 200 or an example of system 1200.

System 1400 illustrates one example of a system with memory devices that share a control bus (C/A (command/address) bus 1442) and a data bus (data bus 1446), which are illustrated as split into two parts for Channel 0 (CH[0]) and Channel 1 (CH[1]). The memory devices are represented as DRAM (dynamic random access memory) devices 1430. In one example, the two separate channels share C/A bus 1442 connection between controller 1440 to RCD 1420. In one example, the separate channels will have separate C/A buses. DRAM devices 1430 can be individually accessed with device specific commands, and can be accessed in parallel with parallel commands.

RCD (registered clock driver or registering clock driver) 1420 represents a controller for DIMM (dual inline memory module) 1410. In one example, RCD 1420 receives information from controller 1440 and buffers the signals to the various DRAM devices 1430. By buffering the input signals from controller 1440, the controller only sees the load of RCD 1420, which can then control the timing and signaling to DRAM devices 1430.

In one example, RCD 1420 controls the signals to the DRAM devices of Channel 0 through C/A bus 1422[0], and controls the signals to DRAM devices of Channel 1 through C/A bus 1422[1]. In one example, RCD 1420 has independent command ports for separate channels. In one example, DIMM 1410 includes data buffers (not illustrated) to buffer the data bus signals between DRAM devices 1430 and controller 1440. Data bus 1444[0] provides a data bus for the DRAM devices of Channel 0 and data bus 1444[1] provides a data bus for the DRAM devices of Channel 1.

C/A bus 1422[0] AND C/A bus 1422[1] (collectively, C/A buses 1422) are typically unilateral buses or unidirectional buses to carry command and address information from controller 1440 to DRAM devices 1430. Thus, C/A buses 1422 can be multi-drop buses. Data buses 1444[0] and 1444[1], collectively data buses 1444, are traditionally bidirectional, point-to-point buses.

In one example, DRAMs 1430 include ECC 1432, which represents ECC logic for the DRAM devices. DRAMs 1430 include ECS 1434, which represents ECS logic in accordance with any example herein. With ECC logic and ECS logic in DRAMs 1430, system 1400 enables adaptive scrubbing operations in accordance with any example herein.

In one example, controller 1440 includes error control 1450, which represents error control in accordance with any example herein. Error control 1450 can detect error patterns in DRAMs 1430 and provide ECS operations or refresh operations in response to the detected error patterns. In one example, the error patterns as indicated by error information from ECC 1432 or ECS 1434 can indicate a row hammer condition within DRAMs 1430.

In one example, control 1446[0] represents signal lines to enable DRAMs of Channel[0] and control 1446[1] represents signal lines to enable DRAMs of Channel[1] to enable the DRAMs to provide error information for evaluation by error control 1450. Thus, error control 1450 can receive the information about errors in the DRAMs to detect patterns that can indicate row hammer conditions.

Figure 15:
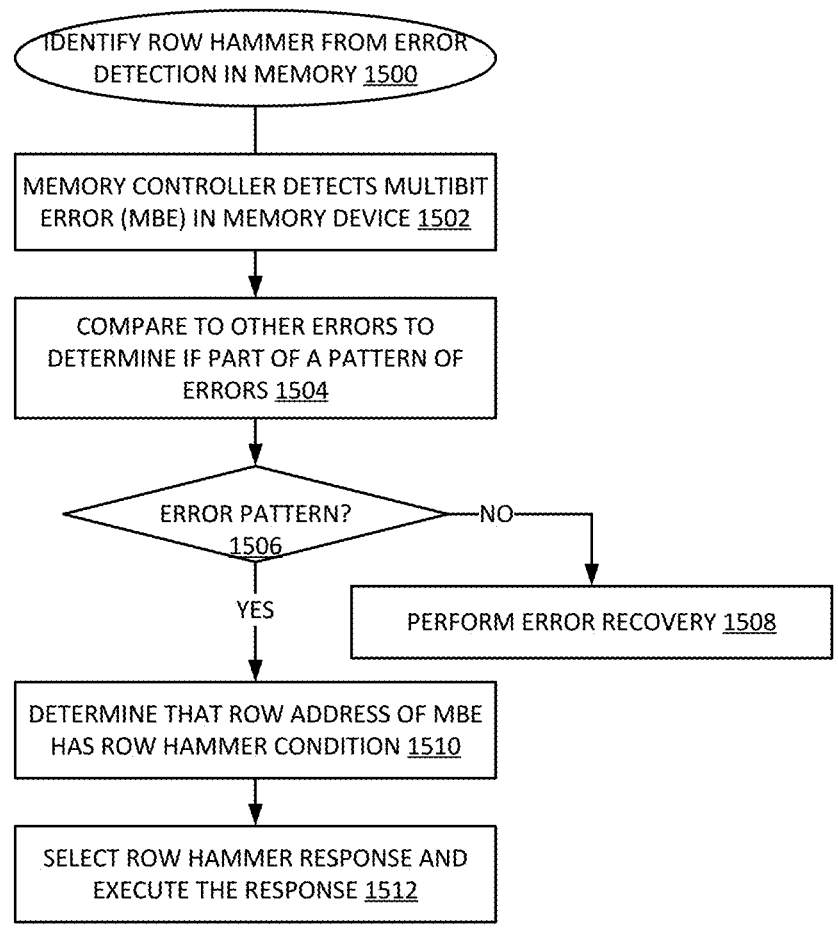
FIG. 15 is a flow diagram of an example of a process for correlating memory errors to detect a row hammer condition.

FIG. 15 is a flow diagram of an example of a process for correlating memory errors to detect a row hammer condition. Process 1500 represents a process to identify row hammer conditions based on error detection in the memory.

In one example, the memory controller detects an MBE in the memory device, at 1502. The detection can be from error correction operations on the memory controller itself or through receipt of signals from the memory devices. In one example, the memory controller compares to other errors to determine if the error is part of a pattern of errors, at 1504.

If the error is determined to not be part of an error pattern, at 1506 NO branch, the memory controller can trigger the performance of error recovery in accordance with known techniques, at 1508. If the error is determined to be part of an error pattern, at 1506 YES branch, the memory controller can determine that the row address of the MBE has a row hammer condition, at 1510. Based on the determination of the row hammer condition, the memory controller can select a row hammer response and execute the response, at 1512. The row hammer response can include a row hammer mitigation response, such as a row hammer refresh operation, or a change to ECS operation, such as ECS hints, or some other row hammer response to trigger error correction in a victim row or in a selected memory area.

Figure 16:
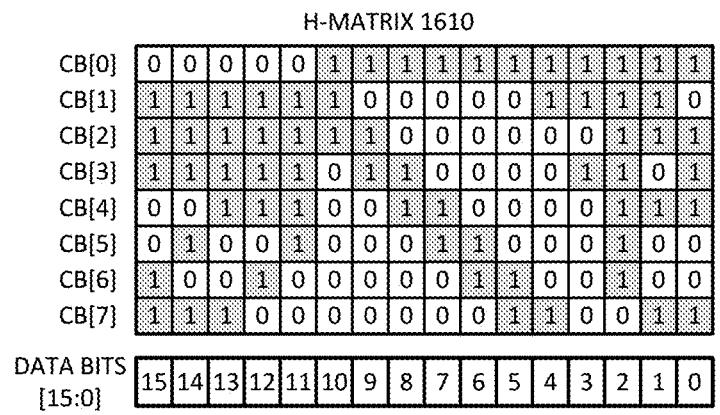
FIG. 16 is a block diagram of an example of check bit generation logic and syndrome bit generation logic to apply a matrix to perform on-die error checking and correction in an adaptive error scrubbing system.
Figure 16:
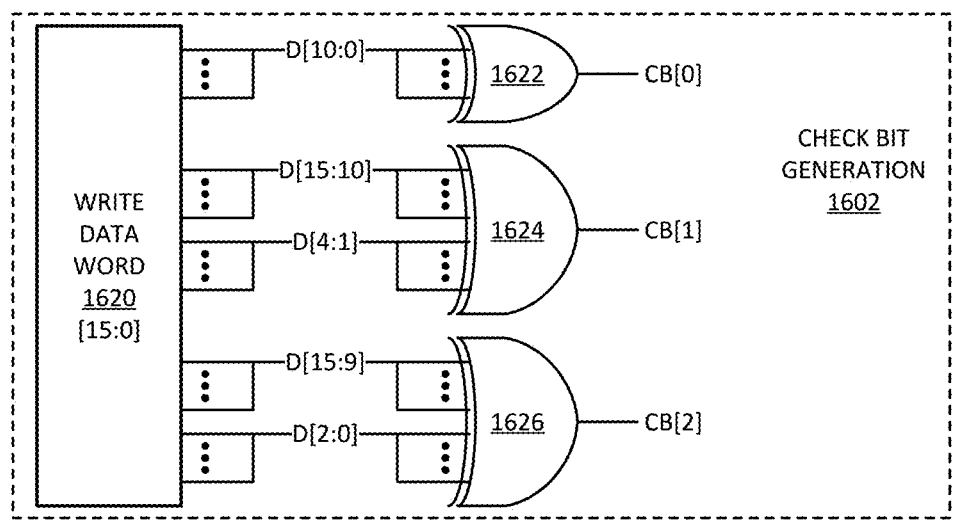
Figure 16:
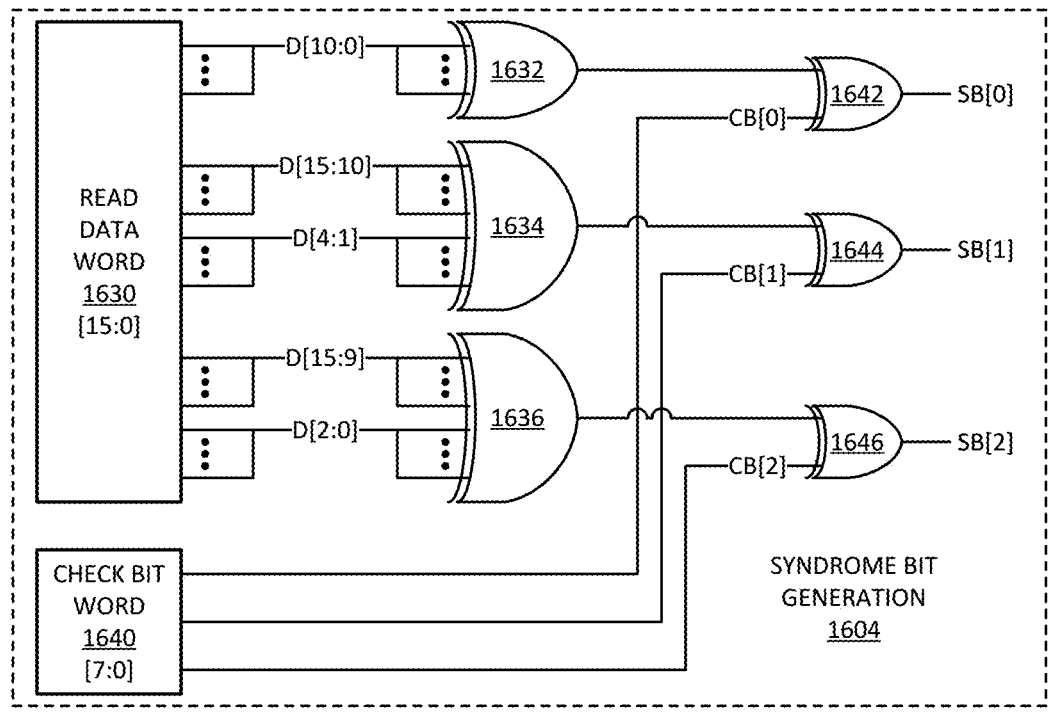

FIG. 16 is a block diagram of an example of check bit generation logic and syndrome bit generation logic to apply a matrix to perform on-die error checking and correction in an adaptive error scrubbing system.

H matrix 1610 represents an example of 16 bits of a code matrix for use with on-device ECC. It will be understood that a typical operational code word in modern computing systems includes more than 16 bits. However, the 16 bit H matrix illustrates principles of ECC operation for on die ECC to be used in on-memory error checking and correction and error scrubbing in accordance with any example herein.

Matrix 1610 can be part of an SEC Hamming code, such as a hamming code for a 128-bit code word. Matrix 1610 illustrates only 16 codes, one code bit for each data bit [15:0]. In one example, every code of matrix 1610 corresponds to one data bit. In the example illustrated, each code includes 8 check bits CB[0:7]. When a syndrome is computed from the data word and check bits stored in the memory, the ECC engine can determine if the syndrome corresponds to one of the codes in matrix 1610. If the ECC engine determines a syndrome matches with one of the codes, the ECC engine toggles the corresponding data bit to correct an error. Examples of check bit generation and syndrome bit generation are illustrated.

Check bit generation logic 1602 represents logic to perform ECC operations to generate check bits. Syndrome bit generation logic 1604 represents logic to perform ECC operations to generate syndrome bits to compare against the check bit. For purposes of illustration in the drawing, only logic related to check bits CB[0:2] are illustrated, and correspondingly, only syndrome bits SB[0:2] are illustrated.

As illustrated, the syndrome can be completely encoded in the ECC logic for the check bit generation and syndrome bit generation. In one example, check bit generation 1602 includes XOR gates to receive write data word 1620 and perform XOR operations for the one-bits of the code. For example, generation of CB[0] with respect to the 16 code word bits illustrated, bits D[10:0] are all ones, whereas bits D[15:11] are zeros. Thus, in one example, computation of CB[0] includes the XOR operation with XOR 1622 of bits D[10:0] of the code word. Similarly, generation of the syndrome bit SB[0] includes logic to receive read data word 1630 and perform XOR operation with XOR 1632 of bits D[10:0] of the read data code word. The output of XOR 1632 is then XORed with XOR 1642 with CB[0] to generate SB[0].

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 1622 for CB[0] and XOR 1632 for SB[0]. The XOR operation has a commutative property, and the XORing of multiple pairs of inputs, and then the series XORing of the outputs of those operations can be interchanged in any order with the same result. Thus, the XOR operations have the practical effect of modulo 2 addition, which is also equivalent to odd parity detection. Odd parity detection provides a '1' as the output when there is an odd number of ones among the inputs, and an output zero when there is an even number of ones among the inputs.

In another example, generation of CB[1] with respect to the 16 code word bits illustrated, bits D[15:10] and D[4:1] are ones, and bits D[9:5] and D[0] are zeros. XOR 1624 computes CB[1] from the one bits. Similarly, for the generation of CB[2], bits D[15:9] and D[2:0] are ones, and bits D[8:3] are zeros. XOR 1626 computes CB[2] from the one bits.

Syndrome bit generation 1604 represents logic to receive read data word 1630 and check bit word 1640, and generate the syndrome bits by comparison of the CB computation with the stored check bits. Similarly, syndrome bit generation of SB[1] with respect to the 16 code word bits illustrated, XOR 1634 computes an XOR of D[15:10] and D[4:1], and then XOR 1644 computes SB[1] by XOR of CB[1] with the output of XOR 1634. Similarly, syndrome bit generation of SB[2] with respect to the 16 code word bits illustrated, XOR 1636 computes an XOR of D[15:9] and D[2:0], and then XOR 1646 computes SB[2] by XOR of CB[2] with the output of XOR 1636.

Based on the determination of the check bits and syndrome bits, the system can identify errors and potentially flip bits, e.g., for a bit or column of CB[7:0] found to match with the syndrome bits. The ECS system applies such techniques to perform scrubbing on memory addresses. In one example, a system applied the error detection of the ECC to detect memory errors and provide error information to the memory controller to allow the memory controller to detect error patterns and adjust the error scrub operations in accordance with any example herein.

Figure 17:
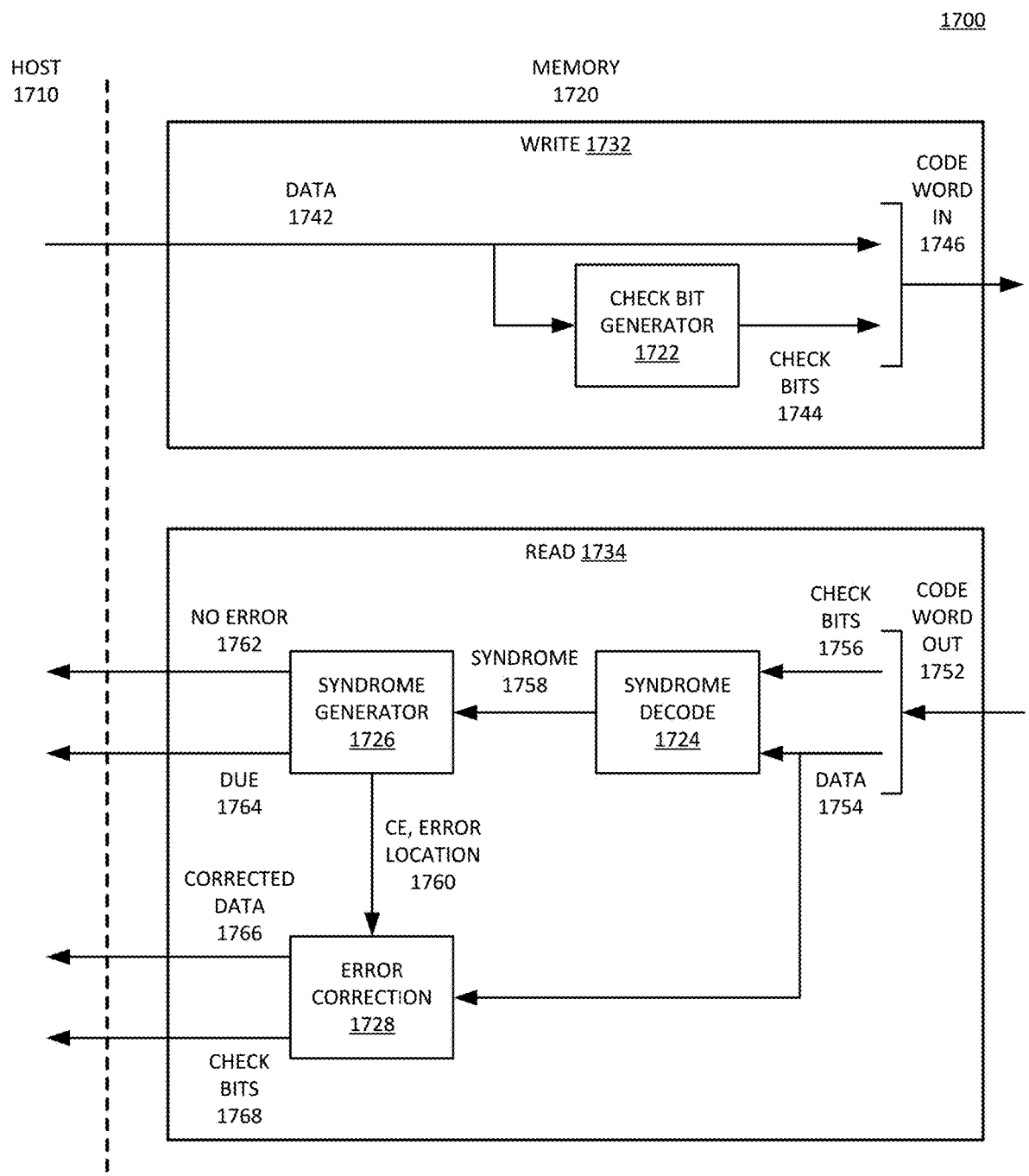
FIG. 17 is a block diagram of an example of on-die error checking and correction in an adaptive error scrubbing system.

FIG. 17 is a block diagram of an example of on-die error checking and correction in an adaptive error scrubbing system. System 1700 provides an example of on-die ECC circuitry for a system in accordance with an example of system 100. Host 1710 includes a memory controller or equivalent or alternative logic or circuit or component that manages access to memory 1720. Host 1710 performs external ECC on data read from memory 1720. Memory 1720 implements on-die ECC to check and correct data prior to sending the data to host 1710. The ECC logic can be used by ECS logic in accordance with any example herein.

System 1700 illustrates write path 1732 in memory 1720, which represents a path for data written from host 1710 to memory 1720. Host 1710 provides data 1742 to memory 1720 for writing to the memory array(s). In one example, memory 1720 generates check bits 1744 with check bit generator 1722 to store with the data in memory. Check bits 1744 can be referred to as ECC bits, and enable memory 1720 to correct an error that might occur in the writing to and reading from the memory array(s). Data 1742 and check bits 1744 can be included as code word in 1746, which is written to the memory resources.

Read path 1734 represents a path for data read from memory 1720 to host 1710. In one example, at least certain hardware components of write path 1732 and read path 1734 are the same hardware. In one example, memory 1720 fetches code word out 1752 in response to a Read command from host 1710. The code word can include data 1754 and check bits 1756. Data 1754 and check bits 1756 can correspond, respectively, to data 1742 and check bits 1744 written in write path 1732. Thus, a read can access data and ECC bits. It will be understood that error correction in read path 1734 can include the application of an XOR (exclusive OR) tree to a corresponding H matrix to detect errors and selectively correct errors (in the case of a single bit error). As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one example, memory 1720 includes syndrome decode 1724, which enables the memory to apply check bits 1756 to data 1754 to detect errors in the read data. Syndrome decode 1724 can generate syndrome 1758 for use in generating appropriate error information for the read data. Data 1754 can also be forwarded to error correction 1728 for correction of a detected error.

In one example, syndrome decode 1724 passes syndrome 1758 to syndrome generator 1726 to generate an error vector. In one example, check bit generator 1722 and syndrome generator 1726 are fully specified by a corresponding H matrix for the memory device. In one example, if there are no errors in the read data (e.g., zero syndrome 1758), syndrome generator 1726 generates a no error signal 1762. In one example, if there are multiple errors in the read data (e.g., non-zero syndrome 1758 that does not match any of the columns in a corresponding H matrix), syndrome generator 1726 generates a DUE (detected uncorrected error) signal 1764, which indicates a detected, uncorrected error. DUE signal 1764 can indicate a multibit error that memory 1720 was not able to correct by internal ECC.

In one example, if there is a single bit error (e.g., non-zero syndrome 1758 that matches one of the columns of a corresponding H matrix), syndrome generator 1726 can generate a CE (corrected error) signal with error location 1760, which is a corrected error indication to error correction logic 1728. Error correction 1728 can apply the corrected error to the specified location in data 1754 to generate corrected data 1766 for output to host 1710. In one example, error correction 1728 also generates check bits 1768, which includes the check bits for the read data.

Check bits 1768 can be considered an error vector that indicates a state of errors in the read data transmitted to host 1710. It will be understood that zero syndrome (no error 1762) condition and a corrected SBE resulting in corrected data 1766 will have the same check bits 1768, indicating no error to host 1710. Thus, check bits 1768 will not provide information about SBE in memory 1720, but only multibit errors. In one example, system 1700 writes corrected data back to the memory array.

In one example, system 1700 includes an internal ECC write path 1732 and internal ECC read path 1734 for each portion of an array. In one example, memory device 1720 can include one path for half of its I/O pins and a second path for the other half of its I/O pins. Thus, memory 1720 can perform ECC isolation with hardware resources to separate the application of ECC to separate sub-portions of the overall data to be provided by the memory device.

Figure 18:
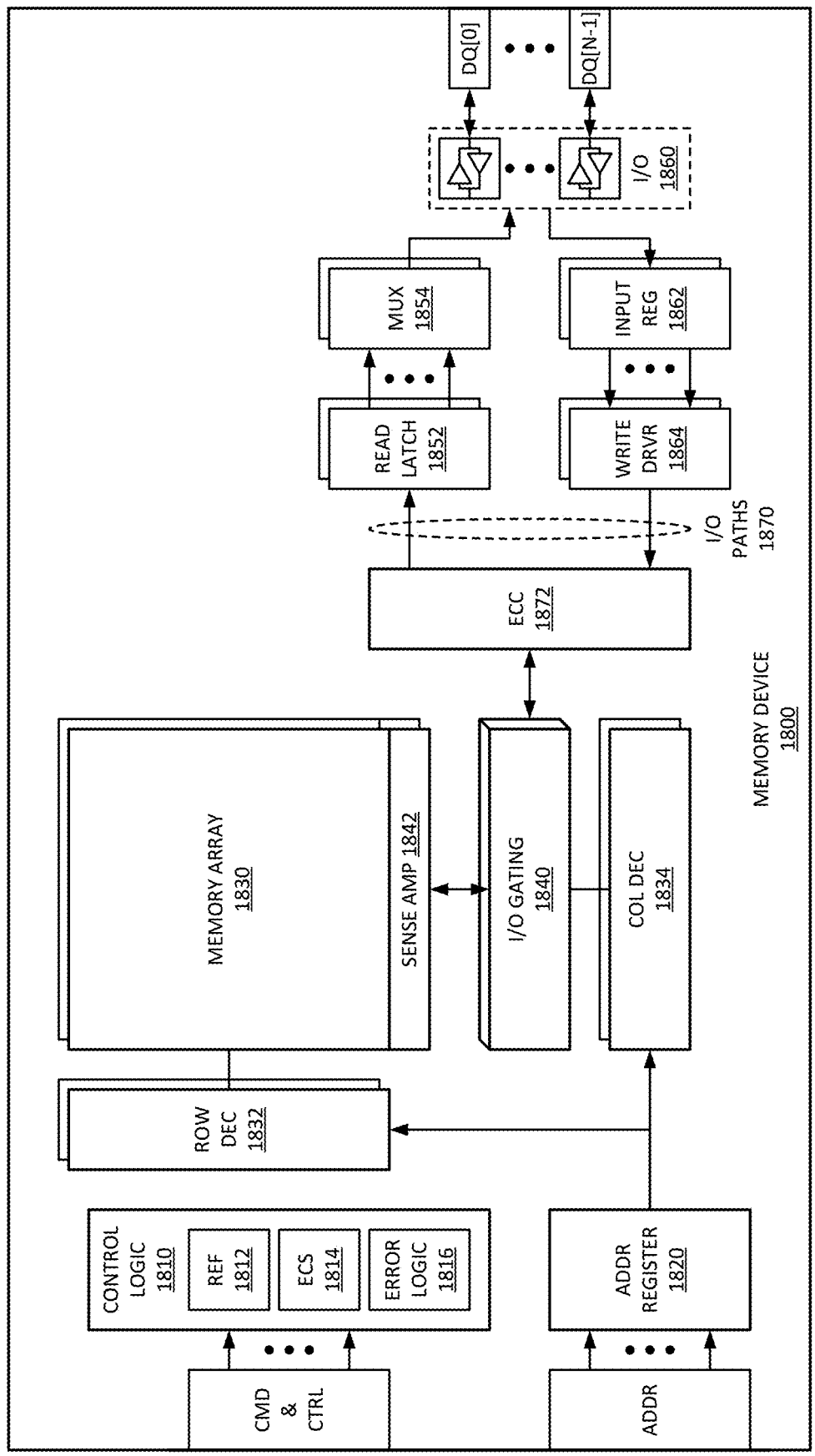
FIG. 18 is a block diagram of an example of a memory device with on-die error checking and correction for adaptive error scrubbing.

FIG. 18 is a block diagram of an example of a memory device with on-die error checking and correction for adaptive error scrubbing. Memory device 1800 represents an example of a memory device with on-die ECC to enable inline error checking and correction. In one example, memory device 1800 is a nonvolatile memory device.

Control logic 1810 receives command (CMD) and control (CTRL) signals, and controls the operation of memory device 1800 in relation to those signals. The control signals can include clock (CLK), clock enable (CKE), as well as other signals. Address (ADDR) register 1820 receives address information (ADDR) signals. The address information signals can include row address, bank address, bank group address, or other signals to identify a portion of memory that is to be affected by a particular command.

The address and command (CMD) and control (CTRL) signals represent I/O connectors for command and address for memory device 1800. In one example, address register 1820 distributes the address information to row decoder (DEC) 1832 and column decoder (COL DEC) 1834. The row decoder 1832 and column decoder 1834 select specific portions of memory array 1830 for execution of a command, such as read command. While not specifically illustrated, the decoder circuits can include latch circuits, counters, or other logic to control the selection of specific addresses. For purposes of simplicity, bank selection logic and bank group selection logic are considered to be part of the row decoder and column decoder of memory device 1800.

Row decoder 1832 selects an address in a bank, which can include a row of memory array 1830. In one example, memory arrays 1830 can be or include subarrays. Column decoder 1834 activates the appropriate sense amplifiers (AMP) 1842 for the desired portions of memory array 1830. Column decoder 1834 can trigger I/O gating 1840, which represents the hardware including signal lines or wires as well as logic to route data to and from memory arrays 1830. I/O gating 1840 can place data into sense amplifiers 1842 for a write operation, and can read the data out for a read operation. Column decoder 1834 makes a column selection for I/O gating 1840 based on bank control logic selection and the column address counter selection.

In one example, read latch 1852 is coupled to receive data bits from I/O gating 1840 for a read operation. Read latch 1852 feeds the data into mux 1854, which can select the number of bits corresponding to the device data interface (the N DQ bits illustrated in memory device 1800). Mux 1854 can send the data to the driver portion of I/O 1860, which will drive the data on I/O connectors DQ[0:(N−1)]. While not specifically illustrated, it will be understood that the driver can drive on or more data strobe lines based on the timing. It will be understood that the latching and muxing on the read path can serialize data for output over the signal lines.

For a write operation, the controller will provide data on DQ[0:(N−1)]. In one example, a receiver portion of I/O 1860 receives write data from the data bus, and inputs it into input register (REG) 1862 or input buffer. In one example, the receiver of I/O 1860 receives a data mask signal (DM) that can indicate when the memory device should perform a read operation. Input register 1862 samples the data in accordance with a data strobe line, and can latch the data to write driver 1864, which provides the data to I/O gating 1840. It will be understood that data buffering can deserialize the data on the write path for input to the array.

In one example, memory device 1800 includes I/O paths 1870 to transfer data between I/O gating 1840 and the read and write paths. Thus, in one example a data path includes a read path and a write path. I/O paths 1870 can be specifically routed to map one or more memory arrays 1830 to specific I/O connectors, referring to DQ[0:(N−1)].

In one example, memory device 1800 includes ECC 1872 to perform internal ECC on the data. In one example, ECC 1872 provides operation in accordance with system 1700. The ECC logic can generate check bits for the incoming data as the code word. The check bits can be stored to array 1830 with the data. The ECC logic can also generate syndrome bits from stored check bits and data as the code word on read from array 1830.

In one example, control logic 1810 includes refresh (REF) logic 1812, which represents logic or circuitry within memory device 1800 to manage refresh operations within the memory device. Refresh logic 1812 can manage the application of self-refresh, including decisions about when to perform internal refresh operations only, or to perform scrub operations during the refresh cycles. Refresh cycles refer to clock cycles where the memory controller has provided a refresh command expects the memory device to be unavailable because it is performing refresh operations.

In one example, control logic 1810 includes ECS logic 1814, which can be ECS logic in accordance with any example herein. ECS logic 1814 can control the operation of ECC 1872, including the control needed to place corrected data back into sense amplifiers 1842 to write back to array 1830 for a scrub operation. In one example, ECS logic 1814 provides error counts to an associated memory controller (not illustrated) for the memory controller to make error determinations.

ECS logic 1814 can be adaptable in accordance with any example provided. In one example, ECS logic 1814 can dynamically adjust a scrub rate of a patrol scrub in response to a changing environmental condition or in response to a change in error rate. In one example, ECS logic 1814 can receive hints from the memory controller and determine what addresses to scrub, including taking into consideration the hints from the memory controller. In one example, ECS logic 1814 includes weighted values to perform the address determinations. In one example, ECS logic 1814 can perform ECS operations without counting errors in excluded addresses.

In one example, control logic 1810 includes error logic 1816. Error logic 1816 represents logic at the memory device to detect changes in error rates. In one example, memory device 1800 can automatically adjust a scrub rate based on errors identified with error logic 1816. In one example, error logic 1816 provides information to the memory controller, which the memory controller then uses to make a determination of row hammer condition in memory device 1800.

Figure 19:
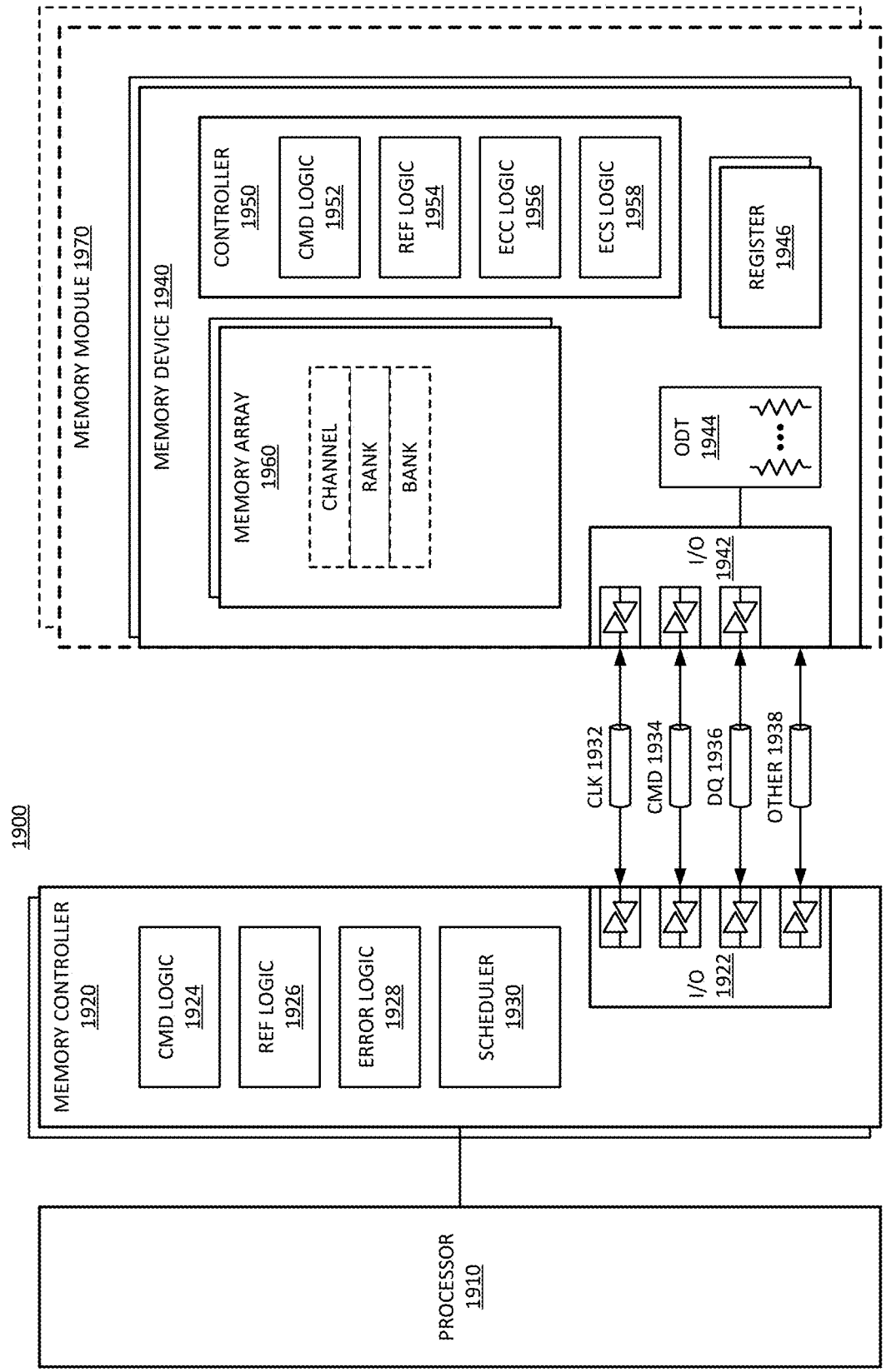
FIG. 19 is a block diagram of an example of a memory subsystem in which adaptive error scrubbing can be implemented.

FIG. 19 is a block diagram of an example of a memory subsystem in which adaptive error scrubbing can be implemented. System 1900 includes a processor and elements of a memory subsystem in a computing device. System 1900 provides an example of a system in accordance with system 200.

In one example, controller 1950 of memory device 1940 includes ECC logic 1956 and ECS logic 1958. ECS logic 1958 can be ECS logic in accordance with any example herein. ECS logic 1958 can be in accordance with an example of system 100. ECC logic 1956 represents on-die ECC for memory device 1940, to enable error checking and correction in the memory. ECC logic 1956 can be in accordance with an example of system 1700.

In one example, memory controller 1920 includes error logic 1928, which represents logic within memory controller 1920 to enable determinations about errors within memory. In one example, error logic 1928 can detect error patterns and determine there is a row hammer attack in memory device 1940. Error logic 1928 can also represent logic within memory controller 1920 to perform system-level ECC operations and detect and correct errors from memory devices 1940. The performance of error checking and correction operations can enable memory controller 1920 to determine the rate of errors in memory devices 1940 and to identify locations of errors, including MBEs. The error logic can enable the memory controller to provide hints and perform operations related to ECS operations in accordance with any example herein.

Processor 1910 represents a processing unit of a computing platform that may execute an operating system (OS) and applications, which can collectively be referred to as the host or the user of the memory. The OS and applications execute operations that result in memory accesses. Processor 1910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 1900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR flash technologies. Thus, a memory device can also include a future generation nonvolatile device, such as a three dimensional crosspoint (3DXP) memory device. 3DXP can operate as a byte addressable nonvolatile memory device or as a block addressable nonvolatile memory device. A memory device can include a nonvolatile, byte addressable media or block addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random-access memory (FeTRAM), magnetoresistive random-access memory (MRAM) memory that incorporates memristor technology, or spin transfer torque (STT)-MRAM, or a combination of any of the above, or other memory.

Memory controller 1920 represents one or more memory controller circuits or devices for system 1900. Memory controller 1920 represents control logic that generates memory access commands in response to the execution of operations by processor 1910. Memory controller 1920 accesses one or more memory devices 1940. Memory devices 1940 can be DRAM devices in accordance with any referred to above. In one example, memory devices 1940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1920 manages a separate memory channel, although system 1900 can be configured to have multiple channels managed by a single controller, or to have multiple controllers on a single channel. In one example, memory controller 1920 is part of host processor 1910, such as logic implemented on the same die or implemented in the same package space as the processor.

Memory controller 1920 includes I/O interface logic 1922 to couple to a memory bus, such as a memory channel as referred to above. I/O interface logic 1922 (as well as I/O interface logic 1942 of memory device 1940) can include pins, pads, connectors, signal lines, traces, or wires, or other hardware to connect the devices, or a combination of these. I/O interface logic 1922 can include a hardware interface. As illustrated, I/O interface logic 1922 includes at least drivers/transceivers for signal lines. Commonly, wires within an integrated circuit interface couple with a pad, pin, or connector to interface signal lines or traces or other wires between devices. I/O interface logic 1922 can include drivers, receivers, transceivers, or termination, or other circuitry or combinations of circuitry to exchange signals on the signal lines between the devices. The exchange of signals includes at least one of transmit or receive. While shown as coupling I/O 1922 from memory controller 1920 to I/O 1942 of memory device 1940, it will be understood that in an implementation of system 1900 where groups of memory devices 1940 are accessed in parallel, multiple memory devices can include I/O interfaces to the same interface of memory controller 1920. In an implementation of system 1900 including one or more memory modules 1970, I/O 1942 can include interface hardware of the memory module in addition to interface hardware on the memory device itself. Other memory controllers 1920 will include separate interfaces to other memory devices 1940.

The bus between memory controller 1920 and memory devices 1940 can be implemented as multiple signal lines coupling memory controller 1920 to memory devices 1940. The bus may typically include at least clock (CLK) 1932, command/address (CMD) 1934, and write data (DQ) and read data (DQ) 1936, and zero or more other signal lines 1938. In one example, a bus or connection between memory controller 1920 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1920 and memory devices 1940. An example of a serial bus technology is 8B10B encoding and transmission of high-speed data with embedded clock over a single differential pair of signals in each direction. In one example, CMD 1934 represents signal lines shared in parallel with multiple memory devices. In one example, multiple memory devices share encoding command signal lines of CMD 1934, and each has a separate chip select (CS_n) signal line to select individual memory devices.

It will be understood that in the example of system 1900, the bus between memory controller 1920 and memory devices 1940 includes a subsidiary command bus CMD 1934 and a subsidiary bus to carry the write and read data, DQ 1936. In one example, the data bus can include bidirectional lines for read data and for write/command data. In another example, the subsidiary bus DQ 1936 can include unidirectional write signal lines for write and data from the host to memory, and can include unidirectional lines for read data from the memory to the host. In accordance with the chosen memory technology and system design, other signals 1938 may accompany a bus or sub bus, such as strobe lines DQS. Based on design of system 1900, or implementation if a design supports multiple implementations, the data bus can have more or less bandwidth per memory device 1940. For example, the data bus can support memory devices that have either a x4 interface, a x8 interface, a x16 interface, or other interface. The convention "xW," where W is an integer that refers to an interface size or width of the interface of memory device 1940, which represents a number of signal lines to exchange data with memory controller 1920. The interface size of the memory devices is a controlling factor on how many memory devices can be used concurrently per channel in system 1900 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1940 and memory controller 1920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 1940 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 1940 represent memory resources for system 1900. In one example, each memory device 1940 is a separate memory die. In one example, each memory device 1940 can interface with multiple (e.g., 2) channels per device or die. Each memory device 1940 includes I/O interface logic 1942, which has a bandwidth determined by the implementation of the device (e.g., x16 or x8 or some other interface bandwidth). I/O interface logic 1942 enables the memory devices to interface with memory controller 1920. I/O interface logic 1942 can include a hardware interface, and can be in accordance with I/O 1922 of memory controller, but at the memory device end. In one example, multiple memory devices 1940 are connected in parallel to the same command and data buses. In another example, multiple memory devices 1940 are connected in parallel to the same command bus, and are connected to different data buses. For example, system 1900 can be configured with multiple memory devices 1940 coupled in parallel, with each memory device responding to a command, and accessing memory resources 1960 internal to each. For a Write operation, an individual memory device 1940 can write a portion of the overall data word, and for a Read operation, an individual memory device 1940 can fetch a portion of the overall data word. The remaining bits of the word will be provided or received by other memory devices in parallel.

In one example, memory devices 1940 are disposed directly on a motherboard or host system platform (e.g., a PCB (printed circuit board) on which processor 1910 is disposed) of a computing device. In one example, memory devices 1940 can be organized into memory modules 1970. In one example, memory modules 1970 represent dual inline memory modules (DIMMs). In one example, memory modules 1970 represent other organization of multiple memory devices to share at least a portion of access or control circuitry, which can be a separate circuit, a separate device, or a separate board from the host system platform. Memory modules 1970 can include multiple memory devices 1940, and the memory modules can include support for multiple separate channels to the included memory devices disposed on them. In another example, memory devices 1940 may be incorporated into the same package as memory controller 1920, such as by techniques such as multi-chip-module (MCM), package-on-package, through-silicon via (TSV), or other techniques or combinations. Similarly, in one example, multiple memory devices 1940 may be incorporated into memory modules 1970, which themselves may be incorporated into the same package as memory controller 1920. It will be appreciated that for these and other implementations, memory controller 1920 may be part of host processor 1910.

Memory devices 1940 each include one or more memory arrays 1960. Memory array 1960 represents addressable memory locations or storage locations for data. Typically, memory array 1960 is managed as rows of data, accessed via wordline (rows) and bitline (individual bits within a row) control. Memory array 1960 can be organized as separate channels, ranks, and banks of memory. Channels may refer to independent control paths to storage locations within memory devices 1940. Ranks may refer to common locations across multiple memory devices (e.g., same row addresses within different devices) in parallel. Banks may refer to sub-arrays of memory locations within a memory device 1940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1940 include one or more registers 1944. Register 1944 represents one or more storage devices or storage locations that provide configuration or settings for the operation of the memory device. In one example, register 1944 can provide a storage location for memory device 1940 to store data for access by memory controller 1920 as part of a control or management operation. In one example, register 1944 includes one or more Mode Registers. In one example, register 1944 includes one or more multipurpose registers. The configuration of locations within register 1944 can configure memory device 1940 to operate in different "modes," where command information can trigger different operations within memory device 1940 based on the mode. Additionally or in the alternative, different modes can also trigger different operation from address information or other signal lines depending on the mode. Settings of register 1944 can indicate configuration for I/O settings (e.g., timing, termination or ODT (on-die termination) 1946, driver configuration, or other I/O settings).

In one example, memory device 1940 includes ODT 1946 as part of the interface hardware associated with I/O 1942. ODT 1946 can be configured as mentioned above, and provide settings for impedance to be applied to the interface to specified signal lines. In one example, ODT 1946 is applied to DQ signal lines. In one example, ODT 1946 is applied to command signal lines. In one example, ODT 1946 is applied to address signal lines. In one example, ODT 1946 can be applied to any combination of the preceding. The ODT settings can be changed based on whether a memory device is a selected target of an access operation or a non-target device. ODT 1946 settings can affect the timing and reflections of signaling on the terminated lines. Careful control over ODT 1946 can enable higher-speed operation with improved matching of applied impedance and loading. ODT 1946 can be applied to specific signal lines of I/O interface 1942, 1922 (for example, ODT for DQ lines or ODT for CA lines), and is not necessarily applied to all signal lines.

Memory device 1940 includes controller 1950, which represents control logic within the memory device to control internal operations within the memory device. For example, controller 1950 decodes commands sent by memory controller 1920 and generates internal operations to execute or satisfy the commands. Controller 1950 can be referred to as an internal controller, and is separate from memory controller 1920 of the host. Controller 1950 can determine what mode is selected based on register 1944, and configure the internal execution of operations for access to memory resources 1960 or other operations based on the selected mode. Controller 1950 generates control signals to control the routing of bits within memory device 1940 to provide a proper interface for the selected mode and direct a command to the proper memory locations or addresses. Controller 1950 includes command logic 1952, which can decode command encoding received on command and address signal lines. Thus, command logic 1952 can be or include a command decoder. With command logic 1952, memory device can identify commands and generate internal operations to execute requested commands.

Referring again to memory controller 1920, memory controller 1920 includes command (CMD) logic 1924, which represents logic or circuitry to generate commands to send to memory devices 1940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1940, memory controller 1920 can issue commands via I/O 1922 to cause memory device 1940 to execute the commands. In one example, controller 1950 of memory device 1940 receives and decodes command and address information received via I/O 1942 from memory controller 1920. Based on the received command and address information, controller 1950 can control the timing of operations of the logic and circuitry within memory device 1940 to execute the commands. Controller 1950 is responsible for compliance with standards or specifications within memory device 1940, such as timing and signaling requirements. Memory controller 1920 can implement compliance with standards or specifications by access scheduling and control.

Memory controller 1920 includes scheduler 1930, which represents logic or circuitry to generate and order transactions to send to memory device 1940. From one perspective, the primary function of memory controller 1920 could be said to schedule memory access and other transactions to memory device 1940. Such scheduling can include generating the transactions themselves to implement the requests for data by processor 1910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1920 typically includes logic such as scheduler 1930 to allow selection and ordering of transactions to improve performance of system 1900. Thus, memory controller 1920 can select which of the outstanding transactions should be sent to memory device 1940 in which order, which is typically achieved with logic much more complex that a simple first-in first-out algorithm. Memory controller 1920 manages the transmission of the transactions to memory device 1940, and manages the timing associated with the transaction. In one example, transactions have deterministic timing, which can be managed by memory controller 1920 and used in determining how to schedule the transactions with scheduler 1930.

In one example, memory controller 1920 includes refresh (REF) logic 1926. Refresh logic 1926 can be used for memory resources that are volatile and need to be refreshed to retain a deterministic state. In one example, refresh logic 1926 indicates a location for refresh, and a type of refresh to perform. Refresh logic 1926 can trigger self-refresh within memory device 1940, or execute external refreshes which can be referred to as auto refresh commands) by sending refresh commands, or a combination. In one example, controller 1950 within memory device 1940 includes refresh logic 1954 to apply refresh within memory device 1940. In one example, refresh logic 1954 generates internal operations to perform refresh in accordance with an external refresh received from memory controller 1920. Refresh logic 1954 can determine if a refresh is directed to memory device 1940, and what memory resources 1960 to refresh in response to the command.

Figure 20:
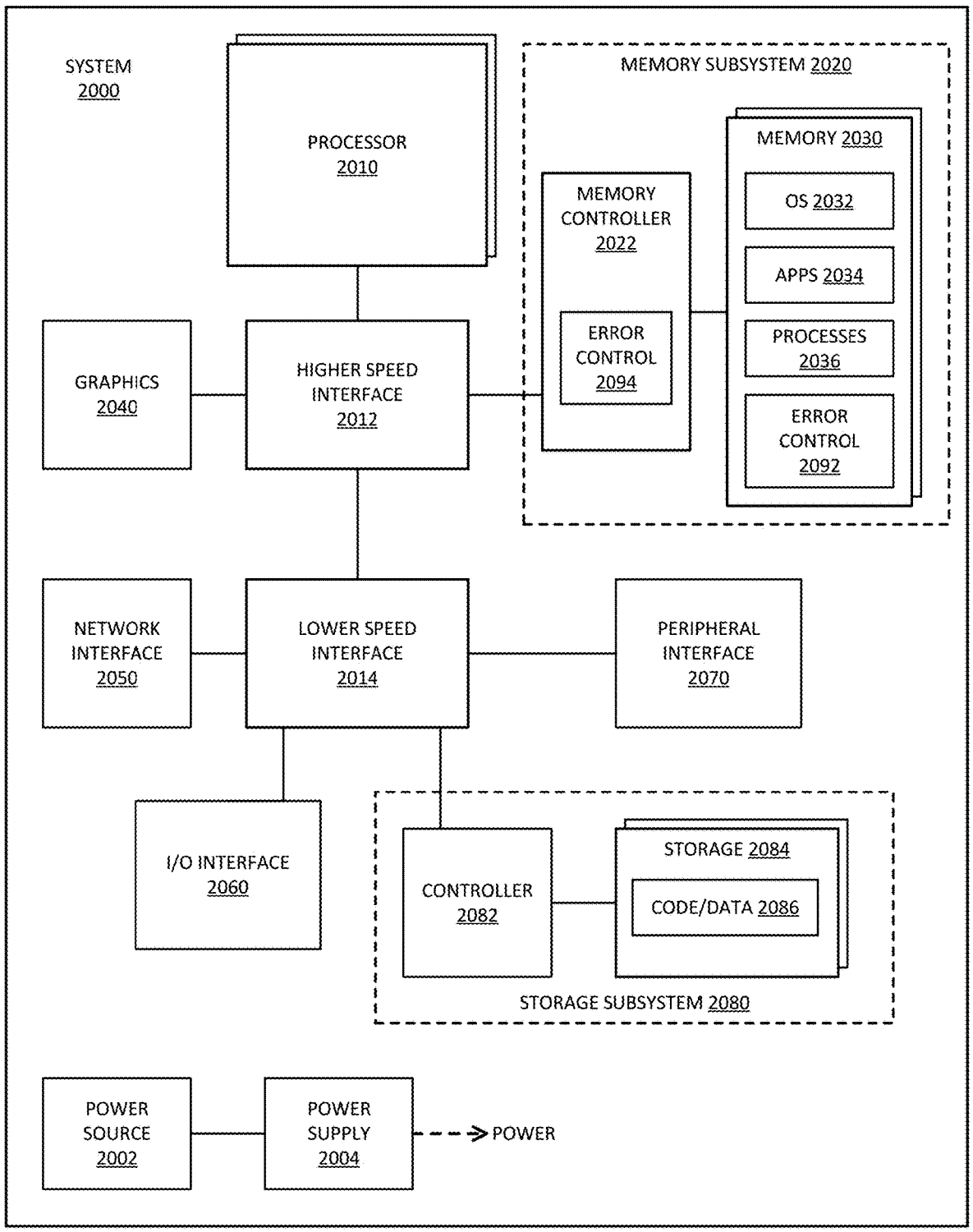
FIG. 20 is a block diagram of an example of a computing system in which adaptive error scrubbing can be implemented.

FIG. 20 is a block diagram of an example of a computing system in which adaptive error scrubbing can be implemented. System 2000 represents a computing device in accordance with any example herein, and can be a laptop computer, a desktop computer, a tablet computer, a server, a gaming or entertainment control system, embedded computing device, or other electronic device. System 2000 illustrates a system in accordance with an example of system 200, in which an example of system 100 can be implemented.

In one example, memory controller 2022 includes error control 2094, which represents logic within memory controller 2022 to enable determinations about errors within memory. In one example, error control 2094 can detect error patterns and determine there is a row hammer attack in memory device 2030. Error control 2094 can also represent logic within memory controller 2022 to perform system-level ECC operations and detect and correct errors from memory devices 2030. The performance of error checking and correction operations can enable memory controller 2022 to determine the rate of errors in memory 2030 and to identify locations of errors, including MBEs. The error control can enable the memory controller to provide hints and perform operations related to ECS operations in accordance with any example herein.

In one example, memory 2030 includes error control 2092, which can represent ECS logic and logic to provide error information to memory controller 2022 and to perform error determinations within memory 2030. Error control 2092 can include adaptive ECS logic in accordance with any example herein.

System 2000 includes processor 2010 can include any type of microprocessor, central processing unit (CPU), graphics processing unit (GPU), processing core, or other processing hardware, or a combination, to provide processing or execution of instructions for system 2000. Processor 2010 can be a host processor device. Processor 2010 controls the overall operation of system 2000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 2000 includes interface 2012 coupled to processor 2010, which can represent a higher speed interface or a high throughput interface for system components that need higher bandwidth connections, such as memory subsystem 2020 or graphics interface components 2040. Interface 2012 represents an interface circuit, which can be a standalone component or integrated onto a processor die. Interface 2012 can be integrated as a circuit onto the processor die or integrated as a component on a system on a chip. Where present, graphics interface 2040 interfaces to graphics components for providing a visual display to a user of system 2000. Graphics interface 2040 can be a standalone component or integrated onto the processor die or system on a chip. In one example, graphics interface 2040 can drive a high definition (HD) display or ultra high definition (UHD) display that provides an output to a user. In one example, the display can include a touchscreen display. In one example, graphics interface 2040 generates a display based on data stored in memory 2030 or based on operations executed by processor 2010 or both.

Memory subsystem 2020 represents the main memory of system 2000, and provides storage for code to be executed by processor 2010, or data values to be used in executing a routine. Memory subsystem 2020 can include one or more memory devices 2030 such as read-only memory (ROM), flash memory, one or more varieties of random-access memory (RAM) such as DRAM, 3DXP (three-dimensional crosspoint), or other memory devices, or a combination of such devices. Memory 2030 stores and hosts, among other things, operating system (OS) 2032 to provide a software platform for execution of instructions in system 2000. Additionally, applications 2034 can execute on the software platform of OS 2032 from memory 2030. Applications 2034 represent programs that have their own operational logic to perform execution of one or more functions. Processes 2036 represent agents or routines that provide auxiliary functions to OS 2032 or one or more applications 2034 or a combination. OS 2032, applications 2034, and processes 2036 provide software logic to provide functions for system 2000.

In one example, memory subsystem 2020 includes memory controller 2022, which is a memory controller to generate and issue commands to memory 2030. It will be understood that memory controller 2022 could be a physical part of processor 2010 or a physical part of interface 2012. For example, memory controller 2022 can be an integrated memory controller, integrated onto a circuit with processor 2010, such as integrated onto the processor die or a system on a chip.

While not specifically illustrated, it will be understood that system 2000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 2000 includes interface 2014, which can be coupled to interface 2012. Interface 2014 can be a lower speed interface than interface 2012. In one example, interface 2014 represents an interface circuit, which can include standalone components and integrated circuitry. In one example, multiple user interface components or peripheral components, or both, couple to interface 2014. Network interface 2050 provides system 2000 the ability to communicate with remote devices (e.g., servers or other computing devices) over one or more networks. Network interface 2050 can include an Ethernet adapter, wireless interconnection components, cellular network interconnection components, USB (universal serial bus), or other wired or wireless standards-based or proprietary interfaces. Network interface 2050 can exchange data with a remote device, which can include sending data stored in memory or receiving data to be stored in memory.

In one example, system 2000 includes one or more input/output (I/O) interface(s) 2060. I/O interface 2060 can include one or more interface components through which a user interacts with system 2000 (e.g., audio, alphanumeric, tactile/touch, or other interfacing). Peripheral interface 2070 can include any hardware interface not specifically mentioned above. Peripherals refer generally to devices that connect dependently to system 2000. A dependent connection is one where system 2000 provides the software platform or hardware platform or both on which operation executes, and with which a user interacts.

In one example, system 2000 includes storage subsystem 2080 to store data in a nonvolatile manner. In one example, in certain system implementations, at least certain components of storage 2080 can overlap with components of memory subsystem 2020. Storage subsystem 2080 includes storage device(s) 2084, which can be or include any conventional medium for storing large amounts of data in a nonvolatile manner, such as one or more magnetic, solid state, 3DXP, or optical based disks, or a combination. Storage 2084 holds code or instructions and data 2086 in a persistent state (i.e., the value is retained despite interruption of power to system 2000). Storage 2084 can be generically considered to be a "memory," although memory 2030 is typically the executing or operating memory to provide instructions to processor 2010. Whereas storage 2084 is nonvolatile, memory 2030 can include volatile memory (i.e., the value or state of the data is indeterminate if power is interrupted to system 2000). In one example, storage subsystem 2080 includes controller 2082 to interface with storage 2084. In one example controller 2082 is a physical part of interface 2014 or processor 2010, or can include circuits or logic in both processor 2010 and interface 2014.

Power source 2002 provides power to the components of system 2000. More specifically, power source 2002 typically interfaces to one or multiple power supplies 2004 in system 2000 to provide power to the components of system 2000. In one example, power supply 2004 includes an AC to DC (alternating current to direct current) adapter to plug into a wall outlet. Such AC power can be renewable energy (e.g., solar power) power source 2002. In one example, power source 2002 includes a DC power source, such as an external AC to DC converter. In one example, power source 2002 or power supply 2004 includes wireless charging hardware to charge via proximity to a charging field. In one example, power source 2002 can include an internal battery or fuel cell source.

Figure 21:
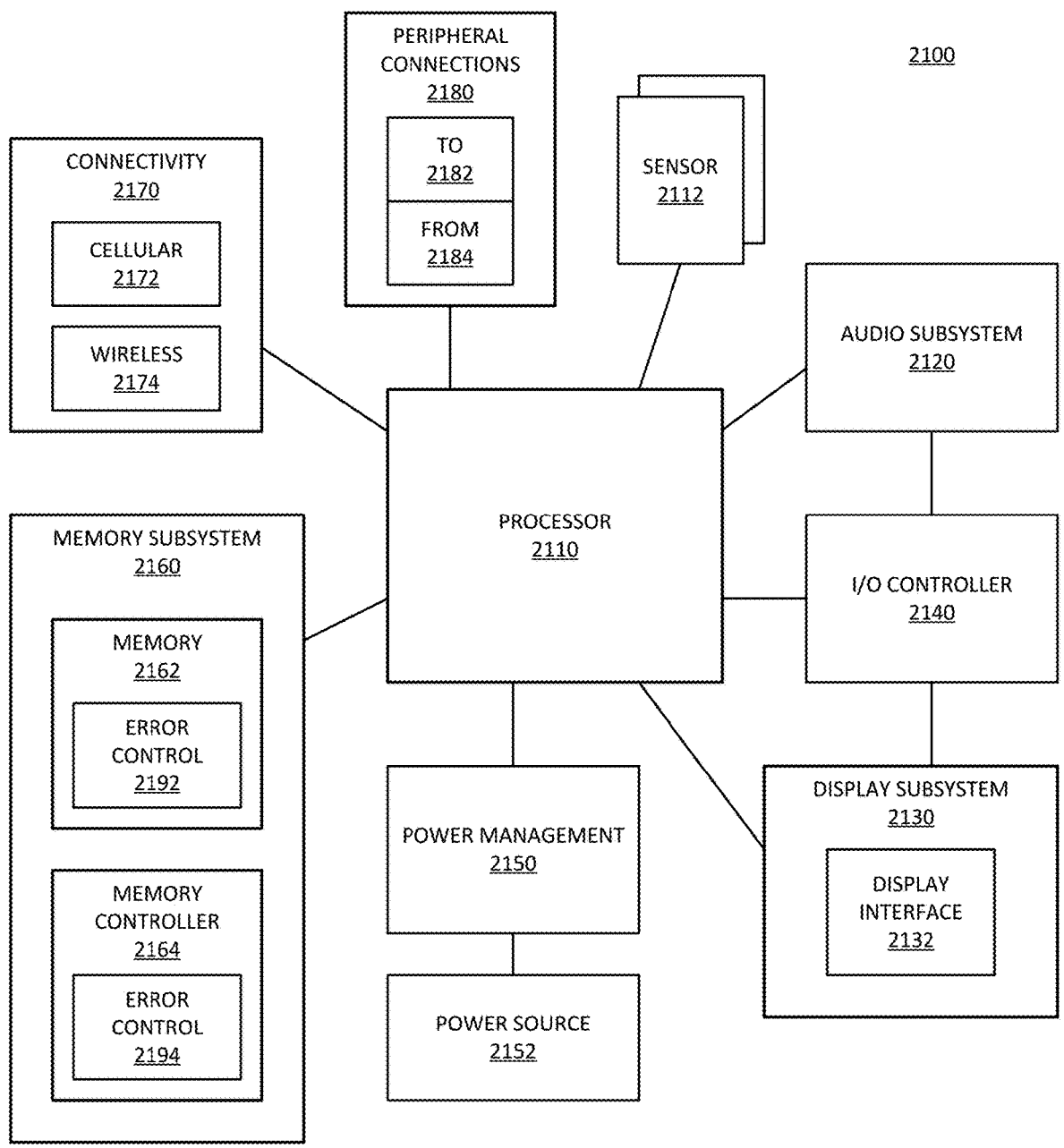
FIG. 21 is a block diagram of an example of a mobile device in which adaptive error scrubbing can be implemented.

FIG. 21 is a block diagram of an example of a mobile device in which adaptive error scrubbing can be implemented. System 2100 represents a mobile computing device, such as a computing tablet, a mobile phone or smartphone, wearable computing device, or other mobile device, or an embedded computing device. It will be understood that certain of the components are shown generally, and not all components of such a device are shown in system 2100. System 2100 illustrates a system in accordance with an example of system 200, in which an example of system 100 can be implemented.

In one example, memory controller 2164 includes error control 2194, which represents logic within memory controller 2164 to enable determinations about errors within memory. In one example, error control 2194 can detect error patterns and determine there is a row hammer attack in memory device 2162. Error control 2194 can also represent logic within memory controller 2164 to perform system-level ECC operations and detect and correct errors from memory devices 2162. The performance of error checking and correction operations can enable memory controller 2164 to determine the rate of errors in memory 2162 and to identify locations of errors, including MBEs. The error control can enable the memory controller to provide hints and perform operations related to ECS operations in accordance with any example herein.

In one example, memory 2162 includes error control 2192, which can represent ECS logic and logic to provide error information to memory controller 2164 and to perform error determinations within memory 2162. Error control 2192 can include adaptive ECS logic in accordance with any example herein.

System 2100 includes processor 2110, which performs the primary processing operations of system 2100. Processor 2110 can be a host processor device. Processor 2110 can include one or more physical devices, such as microprocessors, application processors, microcontrollers, programmable logic devices, or other processing means. The processing operations performed by processor 2110 include the execution of an operating platform or operating system on which applications and device functions are executed. The processing operations include operations related to I/O (input/output) with a human user or with other devices, operations related to power management, operations related to connecting system 2100 to another device, or a combination. The processing operations can also include operations related to audio I/O, display I/O, or other interfacing, or a combination. Processor 2110 can execute data stored in memory. Processor 2110 can write or edit data stored in memory.

In one example, system 2100 includes one or more sensors 2112. Sensors 2112 represent embedded sensors or interfaces to external sensors, or a combination. Sensors 2112 enable system 2100 to monitor or detect one or more conditions of an environment or a device in which system 2100 is implemented. Sensors 2112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 2112 can also include sensors for biometric systems such as fingerprint recognition systems, face detection or recognition systems, or other systems that detect or recognize user features. Sensors 2112 should be understood broadly, and not limiting on the many different types of sensors that could be implemented with system 2100. In one example, one or more sensors 2112 couples to processor 2110 via a frontend circuit integrated with processor 2110. In one example, one or more sensors 2112 couples to processor 2110 via another component of system 2100.

In one example, system 2100 includes audio subsystem 2120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 2100, or connected to system 2100. In one example, a user interacts with system 2100 by providing audio commands that are received and processed by processor 2110.

Display subsystem 2130 represents hardware (e.g., display devices) and software components (e.g., drivers) that provide a visual display for presentation to a user. In one example, the display includes tactile components or touchscreen elements for a user to interact with the computing device. Display subsystem 2130 includes display interface 2132, which includes the particular screen or hardware device used to provide a display to a user. In one example, display interface 2132 includes logic separate from processor 2110 (such as a graphics processor) to perform at least some processing related to the display. In one example, display subsystem 2130 includes a touchscreen device that provides both output and input to a user. In one example, display subsystem 2130 includes a high definition (HD) or ultra-high definition (UHD) display that provides an output to a user. In one example, display subsystem includes or drives a touchscreen display. In one example, display subsystem 2130 generates display information based on data stored in memory or based on operations executed by processor 2110 or both.

I/O controller 2140 represents hardware devices and software components related to interaction with a user. I/O controller 2140 can operate to manage hardware that is part of audio subsystem 2120, or display subsystem 2130, or both. Additionally, I/O controller 2140 illustrates a connection point for additional devices that connect to system 2100 through which a user might interact with the system. For example, devices that can be attached to system 2100 might include microphone devices, speaker or stereo systems, video systems or other display device, keyboard or keypad devices, buttons/switches, or other I/O devices for use with specific applications such as card readers or other devices.

As mentioned above, I/O controller 2140 can interact with audio subsystem 2120 or display subsystem 2130 or both. For example, input through a microphone or other audio device can provide input or commands for one or more applications or functions of system 2100. Additionally, audio output can be provided instead of or in addition to display output. In another example, if display subsystem includes a touchscreen, the display device also acts as an input device, which can be at least partially managed by I/O controller 2140. There can also be additional buttons or switches on system 2100 to provide I/O functions managed by I/O controller 2140.

In one example, I/O controller 2140 manages devices such as accelerometers, cameras, light sensors or other environmental sensors, gyroscopes, global positioning system (GPS), or other hardware that can be included in system 2100, or sensors 2112. The input can be part of direct user interaction, as well as providing environmental input to the system to influence its operations (such as filtering for noise, adjusting displays for brightness detection, applying a flash for a camera, or other features).

In one example, system 2100 includes power management 2150 that manages battery power usage, charging of the battery, and features related to power saving operation. Power management 2150 manages power from power source 2152, which provides power to the components of system 2100. In one example, power source 2152 includes an AC to DC (alternating current to direct current) adapter to plug into a wall outlet. Such AC power can be renewable energy (e.g., solar power, motion based power). In one example, power source 2152 includes only DC power, which can be provided by a DC power source, such as an external AC to DC converter. In one example, power source 2152 includes wireless charging hardware to charge via proximity to a charging field. In one example, power source 2152 can include an internal battery or fuel cell source.

Memory subsystem 2160 includes memory device(s) 2162 for storing information in system 2100. Memory subsystem 2160 can include nonvolatile (state does not change if power to the memory device is interrupted) or volatile (state is indeterminate if power to the memory device is interrupted) memory devices, or a combination. Memory 2160 can store application data, user data, music, photos, documents, or other data, as well as system data (whether long-term or temporary) related to the execution of the applications and functions of system 2100. In one example, memory subsystem 2160 includes memory controller 2164 (which could also be considered part of the control of system 2100, and could potentially be considered part of processor 2110). Memory controller 2164 includes a scheduler to generate and issue commands to control access to memory device 2162.

Connectivity 2170 includes hardware devices (e.g., wireless or wired connectors and communication hardware, or a combination of wired and wireless hardware) and software components (e.g., drivers, protocol stacks) to enable system 2100 to communicate with external devices. The external device could be separate devices, such as other computing devices, wireless access points or base stations, as well as peripherals such as headsets, printers, or other devices. In one example, system 2100 exchanges data with an external device for storage in memory or for display on a display device. The exchanged data can include data to be stored in memory, or data already stored in memory, to read, write, or edit data.

Connectivity 2170 can include multiple different types of connectivity. To generalize, system 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 2174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 2180 include hardware interfaces and connectors, as well as software components (e.g., drivers, protocol stacks) to make peripheral connections. It will be understood that system 2100 could both be a peripheral device ("to" 2182) to other computing devices, as well as have peripheral devices ("from" 2184) connected to it. System 2100 commonly has a "docking" connector to connect to other computing devices for purposes such as managing (e.g., downloading, uploading, changing, synchronizing) content on system 2100. Additionally, a docking connector can allow system 2100 to connect to certain peripherals that allow system 2100 to control content output, for example, to audiovisual or other systems.

In addition to a proprietary docking connector or other proprietary connection hardware, system 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory controller includes: control logic to detect a change in a rate of errors for a memory device having error checking and scrubbing (ECS) logic to perform ECS operations with on-die error checking and correction (ECC) logic in an automatic ECS mode where the ECS logic is to control the performing of the ECS operations; and input/output (I/O) circuitry to send a command to the memory device, in response to detection of the change in the rate of errors, to adjust a rate of performing the ECS operations.

In one example, the memory controller is to adjust the rate of performing the ECS operations in the automatic ECS mode where the memory device is to perform the ECS operations during self refresh. In one example, the memory controller is to adjust the rate of performing the ECS operations in the automatic ECS mode where the memory device is to perform the ECS operations in response to an all bank refresh command. In one example, the control logic is to detect the change based on data received from the memory device. In one example, the control logic is to detect the change based on error transparency data from the ECS logic. In one example, the memory controller further includes: error correction logic to perform error correction on data received from the memory device; wherein the control logic is to detect the change based on errors detected by the error correction logic. In one example, the control logic is to detect the change in response to a signal from the memory device to indicate a change in the rate of errors. In one example, the control logic is to detect the change as a predicted change in the rate of errors due to a change in an environmental condition that affects error rate. In one example, the I/O circuitry is to send the command to change a mode register setting to adjust the rate of performing the ECS operations. In one example, the I/O circuitry is to send the command to set a configuration within the ECS logic. In one example, the I/O circuitry is to send additional refresh commands to the memory device to enable the memory device to perform the ECS operations.

In general with respect to the descriptions herein, in one example a memory controller includes: a control circuit to detect a change in a rate of errors for a memory device having an error checking and scrubbing (ECS) circuit to perform ECS operations with on-die error checking and correction (ECC) circuitry in an automatic ECS mode where the ECS circuit is to control the performing of the ECS operations; and input/output (I/O) circuitry to send a command to the memory device, in response to detection of the change in the rate of errors, to adjust a rate of performing the ECS operations.

In general with respect to the descriptions herein, in one example a method of managing errors for a memory includes: detecting a change in a rate of errors for a memory device having error checking and scrubbing (ECS) logic to perform ECS operations with on-die error checking and correction (ECC) logic in an automatic ECS mode where the ECS logic is to control the performing of the ECS operations; sending a command to the memory device from a memory controller, in response to detecting the change in the rate of errors, to adjust a rate of performing the ECS operations; and adjusting a frequency of refresh commands sent to the memory device based on the adjusted rate of performing the ECS operations.

In one example, adjusting the rate of performing the ECS operations in the automatic ECS mode comprises adjusting the rate of performing the ECS operation for the memory device to perform during self refresh. In one example, adjusting the rate of performing the ECS operations in the automatic ECS mode comprises adjusting the rate of performing the ECS operation for the memory device to perform in response to an all bank refresh command. In one example, detecting the change comprises detecting the change based on data received from the memory device. In one example, detecting the change comprises detecting the change based on error transparency data from the ECS logic. In one example, the method further includes: performing error correction in the memory controller with error correction logic to perform error correction on data received from the memory device; wherein detecting the change comprises detecting the change based on errors detected by the error correction logic. In one example, detecting the change comprises detecting the change based on a signal from the memory device to indicate a change in the rate of errors. In one example, detecting the change comprises detecting the change as a predicted change in the error rate due to a change in an environmental condition that affects error rate. In one example, sending the command comprises sending the command to change a mode register setting to adjust the rate of performing the ECS operations. In one example, sending the command comprises setting a configuration within the ECS logic. In one example, sending the command comprises sending additional refresh commands to the memory device to enable the memory device to perform the ECS operations.

In general with respect to the descriptions herein, in one example a dynamic random access memory (DRAM) device includes: on-die error checking and correction (ECC) logic to detect and correct errors; error checking and scrubbing (ECS) logic to perform ECS operations with the on-die ECC logic in an automatic ECS mode where the ECS logic is to control the performing of the ECS operations; and a storage to store a value to control a rate of performing the ECS operations, wherein the ECS logic is to change the value to change the rate of performing the ECS operations based on detection of a change in a rate of errors.

In one example, the ECS logic is to change the rate of performing the ECS operations in an automatic ECS mode where the DRAM device is to perform the ECS operations during self refresh. In one example, the ECS logic is to change the rate of performing ECS the operations in an automatic ECS mode where the DRAM device is to perform the ECS operations in response to an all bank refresh command. In one example, the detection of the change in the rate of errors comprises detection by an associated memory controller based on data sent to the associated memory controller from the DRAM device. In one example, the detection of the change in the rate of errors comprises detection based on error transparency data from the ECS logic sent to the associated memory controller from the DRAM device. In one example, the detection of the change in the rate of errors comprises detection by error correction logic of the associated memory controller that performs error correction on data sent to the associated memory controller. In one example, the detection of the change in the rate of errors comprises detection by an associated memory controller of a predicted change in the error rate due to a change in an environmental condition that affects error rate. In one example, the detection of the change in the rate of errors comprises detection by the ECS logic. In one example, the ECS logic is to change the value to change the rate of performing the ECS operations in response to a command from an associated memory controller to change a mode register setting to adjust the rate of performing the ECS operations. In one example, the ECS logic is to change the value to change the rate of performing the ECS operations in response to a command from an associated memory controller to set the rate as a configuration within the ECS logic. In one example, the storage comprises a mode register.

In general with respect to the descriptions herein, in one example a system includes: a memory device including: on-die error checking and correction (ECC) logic to detect and correct errors; and error checking and scrubbing (ECS) logic to perform ECS operations with the on-die ECC logic in an automatic ECS mode where the ECS logic is to control the performing of the ECS operations, wherein the ECS logic is to change a rate of performing the ECS operations based on detection of a change in a rate of errors; and a memory controller including: control logic to detect the change in the rate of errors for the memory device; and input/output (I/O) circuitry to send a command to the memory device, in response to detection of the change in the rate of errors, to trigger the ECS logic to adjust the rate of performing the ECS operations.

In general with respect to the descriptions herein, in one example a memory device includes: multiple rows of memory; error scrubbing logic to perform error checking and scrubbing (ECS) operations on the multiple rows of memory, including to detect errors in the multiple rows, correct detected errors, and write corrected data back to the memory, and the error scrubbing logic to generate an error count for the ECS operations to indicate errors detected in the ECS operations; and a storage device to identify addresses of rows offlined by a host associated with the memory, wherein the error scrubbing logic is to not generate the error count for the ECS operations for the addresses of the rows offlined by the host.

In one example, the storage device comprises a storage device in the error scrubbing logic. In one example, the storage device comprises a storage device within counter logic of the error scrubbing logic. In one example, the error scrubbing logic includes an address comparator to check an internally generated address for ECS operations against the addresses of rows offlined by the host, and only perform the ECS operations, including generate the error count, if the generated address is not an address of a row offlined by the host. In one example, the error scrubbing logic includes an address comparator to check an internally generated address for ECS operations against the addresses of rows offlined by the host, perform the ECS operations on the generated address, and generate the error count if the generated address is not an address of a row offlined by the host. In one example, an associated memory controller writes the addresses of the rows offlined by the host in the storage device. In one example, the memory device further includes: a mode register to store a value to select a response to identification of the addresses of the rows offlined by the host, including a first response to not perform the ECS operation for an address of a row offlined by the host and not generate the error count, and a second response to perform the ECS operation for an address of a row offlined by the host and not generate the error count. In one example, the error scrubbing logic includes an address generator including an address comparator, wherein the address generator is to output a signal to selectively disable error checking and correction (ECC) logic of the error scrubbing logic to provide the first response. In one example, the error scrubbing logic includes an address generator including an address comparator, wherein the address generator is to output a signal to disable error counting logic for the first response and for the second response.

In general with respect to the descriptions herein, in one example a memory device includes: multiple rows of memory; an error scrubbing circuit to perform error checking and scrubbing (ECS) operations on the multiple rows of memory, including to detect errors in the multiple rows, correct detected errors, and write corrected data back to the memory, and the error scrubbing circuit to generate an error count for the ECS operations to indicate errors detected in the ECS operations; and a storage device to identify addresses of rows offlined by a host associated with the memory, wherein the error scrubbing circuit is to not generate the error count for the ECS operations for the addresses of the rows offlined by the host.

In general with respect to the descriptions herein, in one example a method for error scrubbing includes: generating an address for one of multiple rows of an array of a memory device for error checking and scrubbing (ECS) operations by error scrubbing logic of the memory device, including detecting errors in the multiple rows, correcting detected errors, and writing corrected data back to the array; determining if the address is associated with a row offlined by a host associated with the memory device; and selectively generating an error count for the ECS operations to indicate errors detected in the ECS operations in response to the determining if the address is associated with a row offlined by the host.

In one example, the determining if the address is associated with a row offlined by the host comprises determining if the address is identified in a storage device in the error scrubbing logic. In one example, determining if the address is associated with a row offlined by the host comprises determining if the address is identified in a storage device within counter logic of the error scrubbing logic. In one example, selectively generating the error count for the ECS operations comprises only performing the ECS operations and generating the error count if the address is not associated with a row offlined by the host. In one example, selectively generating the error count for the ECS operations comprises performing the ECS operations but only generating the error count if the address is not associated with a row offlined by the host. In one example, selectively generating the error count comprises selecting between a first response and a second response based on a value of a mode register, wherein the first response includes only performing the ECS operations and generating the error count if the address is not associated with a row offlined by the host, and wherein the second response includes performing the ECS operations but only generating the error count if the address is not associated with a row offlined by the host. In one example, selectively generating the error count comprises generating a signal to selectively disable error checking and correction (ECC) logic of the ECS logic when the generated address is identified as associated with a row offlined by the host. In one example, selectively generating the error count comprises generating a signal to selectively disable error counting logic of error checking and scrubbing (ECS) logic when the generated address is identified as associated with a row offlined by the host.

In general with respect to the descriptions herein, in one example a memory controller includes: input/output (I/O) circuitry to couple to a memory having multiple rows of memory, and error scrubbing logic to perform error checking and scrubbing (ECS) operations on the multiple rows of memory, including to detect errors in the multiple rows, correct detected errors, and write corrected data back to the memory, and the error scrubbing logic to generate an error count for the ECS operations to indicate errors detected in the ECS operations; and control logic to detect an error in one of the multiple rows of the memory and offline an address associated with the one of the multiple rows; wherein the I/O circuitry is to send the offlined address to the error scrubbing logic to cause the error scrubbing logic to not generate the error count for ECS operations for the offlined address.

In one example, the I/O circuitry is to send the offlined address to the memory to store in a storage device in the error scrubbing logic. In one example, the I/O circuitry is to send the offlined address to the memory to store in a storage device within counter logic of the error scrubbing logic. In one example, the I/O circuitry is to directly write the offlined address to a storage device of the memory for use by the error scrubbing logic. In one example, the memory has a mode register in to store a value to select a response to identification of the offlined addresses, including a first response to not perform the ECS operation for the offlined address and not generate the error count, and a second response to perform the ECS operation for the offlined address and not generate the error count. In one example, the I/O circuitry is to send a command to write the value of the mode register to select either the first response or the second response. In one example, the error scrubbing logic includes an address generator including an address comparator, wherein the address generator is to output a signal to selectively disable error checking and correction (ECC) logic of the error scrubbing logic to provide the first response in response to the offlined address from the I/O circuitry. In one example, the error scrubbing logic includes an address generator including an address comparator, wherein the address generator is to output a signal to disable error counting logic for the first response and for the second response in response to the offlined address from the I/O circuitry.

In general with respect to the descriptions herein, in one example a memory controller includes: input/output (I/O) circuitry to couple to a memory having multiple rows of memory, and an error scrubbing circuit to perform error checking and scrubbing (ECS) operations on the multiple rows of memory, including to detect errors in the multiple rows, correct detected errors, and write corrected data back to the memory, and the error scrubbing circuit to generate an error count for the ECS operations to indicate errors detected in the ECS operations; and a control circuit to detect an error in one of the multiple rows of the memory and offline an address associated with the one of the multiple rows; wherein the I/O circuitry is to send the offlined address to the error scrubbing circuit to cause the error scrubbing circuit to not generate the error count for ECS operations for the offlined address.

In general with respect to the descriptions herein, in one example a method for managing error scrubbing includes: receiving data from a memory device having an array with multiple rows, and error scrubbing logic to perform error checking and scrubbing (ECS) operations on the multiple rows, including to detect errors in the multiple rows, correct detected errors, and write corrected data back to the array, and the error scrubbing logic to generate an error count for the ECS operations to indicate errors detected in the ECS operations; detecting an error in one of the multiple rows; offlining an address associated with the one of the multiple rows in which the error was detected; and sending the offlined address to the error scrubbing logic to cause the error scrubbing logic to not generate the error count for ECS operations for the offlined address.

In one example, sending the offlined address comprises sending the offlined address for storage in a storage device in the error scrubbing logic. In one example, sending the offlined address comprises sending the offlined address for storage in a storage device within counter logic of the error scrubbing logic. In one example, sending the offlined address comprises directly writing the offlined address to a storage device of the memory device for use by the error scrubbing logic. In one example, sending the offlined address to the error scrubbing logic comprises sending a command to the memory device to cause the error scrubbing logic to not generate the error count for the offlined address. In one example, the memory device having a mode register in to store a value to select a response to identification of the offlined address by error checking and scrubbing (ECS) logic of the memory device, including a first response to not perform the ECS operation for the offlined address and not generate the error count, and a second response to perform the ECS operation for the offlined address and not generate the error count; wherein sending the command comprises sending a command to write the value of the mode register to select either the first response or the second response. In one example, sending the offlined address to the error scrubbing logic to cause the error scrubbing logic to not generate the error count for ECS operations for the address of the offlined address comprises triggering the ECS logic to selectively disable error checking and correction (ECC) logic of the ECS logic to provide the first response in response to selection of the offlined address for scrubbing by the ECS logic. In one example, sending the offlined address to the error scrubbing logic to cause the error scrubbing logic to not generate the error count for ECS operations for the address of the offlined address comprises triggering the ECS logic to disable error counting logic for the first response and for the second response in response to selection of the offlined address for scrubbing by the ECS logic.

In general with respect to the descriptions herein, in one example a memory system includes: a memory device including: an array with multiple rows; and error scrubbing logic to perform error checking and scrubbing (ECS) operations on the multiple rows of memory, including to detect errors in the multiple rows, correct detected errors, and write corrected data back to the array, and the error scrubbing logic to generate an error count for the ECS operations to indicate errors detected in the ECS operations; and a memory controller coupled to the memory device, including: control logic to detect an error in one of the multiple rows of the memory device and offline an address associated with the one of the multiple rows; and input/output (I/O) circuitry to send the offlined address to the error scrubbing logic; wherein the memory device further includes a storage device to store the offlined address from the memory controller, wherein the error scrubbing logic is to not generate the error count for the ECS operations for the offlined address.

In general with respect to the descriptions herein, in one example a memory device includes: an array with multiple rows; error scrubbing logic to perform error checking and scrubbing (ECS) operations on the multiple rows, including to detect errors in the multiple rows, correct detected errors, and write corrected data back to the array, wherein the error scrubbing logic includes an internal address generator to generate addresses for the multiple rows at which to perform the ECS operations; and a storage device to identify an address of a row requested by a host for performance of ECS operations, wherein the internal address generator is to select between internal address generation and an identified address of a row requested by the host for performance of the ECS operations.

In one example, the storage device comprises a storage device in the error scrubbing logic. In one example, the storage device comprises a storage device within the internal address generator of the error scrubbing logic. In one example, the internal address generator comprises weighted arbitration logic, which performs weight arbitration on addresses generated by the internal address generator and the identified address, to determine one or more addresses for the performance of ECS operations. In one example, the identified address comprises one of multiple identified addresses, wherein each of the multiple identified addresses has an associated register to store a weight for the respective identified address. In one example, the associated register comprises a dynamically configurable register. In one example, the associated register is writeable by the host and by the memory device. In one example, the associated register is dynamically updated at runtime to change the weight based on stress conditions of a system in which the memory device is incorporated. In one example, the stress conditions include system temperature. In one example, the stress conditions include load of a central processing unit coupled to the memory device. In one example, the identified address comprises a specific row address requested by the host for the performance of ECS operations. In one example, the error scrubbing logic is to perform ECS operations on the specific row address requested by the host and rows with consecutive addresses to the specific row address. In one example, the error scrubbing logic is to perform ECS operation on the specific row address requested by the host and other rows of generated addresses that are not consecutive to the specific row address. In one example, the identified address is a first address, wherein the storage device is to store a second address, wherein the first address is to identify a start of a range of row addresses, and the second address is to identify an end of the range of row addresses. In one example, the identified address comprises an address selected by the host due to a stress condition on a system of the memory device. In one example, the stress condition comprises data from a temperature sensor. In one example, the stress condition comprises a load on a central processing unit of the system.

In general with respect to the descriptions herein, in one example a memory device includes: an array with multiple rows; an error scrubbing circuit to perform error checking and scrubbing (ECS) operations on the multiple rows, including to detect errors in the multiple rows, correct detected errors, and write corrected data back to the array, wherein the error scrubbing circuit includes an internal address generator to generate addresses for the multiple rows at which to perform the ECS operations; and a storage device to identify an address of a row requested by a host for performance of ECS operations, wherein the internal address generator is to select between internal address generation and an identified address of a row requested by the host for performance of the ECS operations.

In general with respect to the descriptions herein, in one example a method for error scrubbing includes: generating internal addresses for performance of error checking and scrubbing (ECS) operations on multiple rows of an array of a memory device; performing the ECS operations on the multiple rows, including detecting errors in the multiple rows, correcting detected errors, and writing corrected data back to the array; and identifying an address of a row requested by a host for the performance of the ECS operations; wherein generating the internal addresses includes selecting between internal address generation and the identified address.

In one example, identifying the address comprises reading the address from a storage device in error scrubbing logic of the memory device. In one example, selecting between internal address generation and the identified address comprises applying weighted arbitration on addresses generated by an internal address generator and the identified address, to determine one or more addresses for the performance of the ECS operations. In one example, the identified address comprises one of multiple identified addresses, wherein each of the multiple identified addresses has an associated register to store a weight for the respective identified address. In one example, the associated register comprises a dynamically configurable register. In one example, the associated register is writeable by the host and by the memory device. In one example, the associated register is dynamically updated at runtime to change the weight based on stress conditions of a system in which the memory device is incorporated. In one example, the stress conditions include system temperature. In one example, the stress conditions include load of a central processing unit coupled to the memory device. In one example, the identified address comprises a specific row address requested by the host for the performance of the ECS operations. In one example, performing the ECS operations comprises performing the ECS operations on the specific row address requested by the host and rows with consecutive addresses to the specific row address. In one example, performing the ECS operations comprises performing the ECS operations on the specific row address requested by the host and other rows of generated addresses that are not consecutive to the specific row address. In one example, the identified address is a first address to identify a start of a range of row addresses, and further comprising a second address to identify an end of the range of row addresses. In one example, the address of the row requested by the host for the performance of the ECS operations comprises an address selected by the host due to a stress condition on a system of the memory device. In one example, the stress condition comprises data from a temperature sensor. In one example, the stress condition comprises a load on a central processing unit of the system.

In general with respect to the descriptions herein, in one example a memory controller includes: input/output (I/O) circuitry to couple to a memory device having an array with multiple rows, and error scrubbing logic to perform error checking and scrubbing (ECS) operations on the multiple rows, including to detect errors in the multiple rows, correct detected errors, and write corrected data back to the array, wherein the error scrubbing logic includes an internal address generator to generate addresses for the multiple rows at which to perform the ECS operations; and control logic to identify an address of a row of the multiple rows to request for performance of ECS operations; wherein the I/O circuitry is to send the identified address to the error scrubbing logic to cause the internal address generator to select between internal address generation and the identified address.

In one example, the I/O circuitry is to send the identified address to a storage device in the error scrubbing logic. In one example, the storage device comprises a storage device within the internal address generator of the error scrubbing logic. In one example, the internal address generator comprises weighted arbitration logic, which performs weight arbitration on addresses generated by the internal address generator and the identified address, to select addresses for the performance of ECS operations. In one example, the identified address comprises one of multiple identified addresses, wherein each of the multiple identified addresses has an associated register to store a weight for the respective identified address. In one example, the associated register comprises a dynamically configurable register. In one example, the associated register is writeable by the memory controller and by the memory device. In one example, the associated register is dynamically updated at runtime to change the weight based on stress conditions of a system in which the memory device is incorporated. In one example, the stress conditions include system temperature. In one example, the stress conditions include load of a central processing unit coupled to the memory device. In one example, the identified address comprises a specific row address identified for the performance of ECS operations. In one example, the error scrubbing logic is to perform ECS operations on the specific row address and rows with consecutive addresses to the specific row address. In one example, the error scrubbing logic is to perform ECS operation on the specific row address and other rows of generated addresses that are not consecutive to the specific row address. In one example, the identified address is a first address to identify a start of a range of row addresses, and further comprising a second address to identify an end of the range of row addresses. In one example, the identified address comprises an address selected due to a stress condition on a system of the memory device. In one example, the stress condition comprises data from a temperature sensor. In one example, the stress condition comprises a load on a central processing unit of the system.

In general with respect to the descriptions herein, in one example a memory controller includes: input/output (I/O) circuitry to couple to a memory device having an array with multiple rows, and an error scrubbing circuit to perform error checking and scrubbing (ECS) operations on the multiple rows, including to detect errors in the multiple rows, correct detected errors, and write corrected data back to the array, wherein the error scrubbing circuit includes an internal address generator to generate addresses for the multiple rows at which to perform the ECS operations; and a control circuit to identify an address of a row of the multiple rows to request for performance of ECS operations; wherein the I/O circuitry is to send the identified address to the error scrubbing circuit to cause the internal address generator to select between internal address generation and the identified address.

In general with respect to the descriptions herein, in one example a method to manage error scrubbing includes: identifying an address of a row of multiple rows of an array of a memory device to request for performance of ECS operations, wherein the memory device includes error scrubbing logic to perform error checking and scrubbing (ECS) operations on the multiple rows, including to detecting errors in the multiple rows, correcting detected errors, and writing corrected data back to the array, wherein the error scrubbing logic includes an internal address generator to generate addresses for the multiple rows at which to perform the ECS operations; and sending the identified address to the error scrubbing logic to cause the internal address generator to select between internal address generation and the identified address.

In one example, sending the identified address comprises sending the identified address to a storage device in the error scrubbing logic. In one example, sending the identified address comprises sending the identified address to a storage device within the internal address generator of the error scrubbing logic. In one example, sending the identified address to the error scrubbing logic to cause the internal address generator to select between the internal address generation and the identified address comprises sending the identified address to the error scrubbing logic to cause the internal address generator to apply weight arbitration on addresses generated by the internal address generator and the identified address, to select addresses for the performance of ECS operations. In one example, sending the identified address comprises sending one of multiple identified addresses, wherein each of the multiple identified addresses has an associated register to store a weight for the respective identified address. In one example, the associated register comprises a dynamically configurable register. In one example, the associated register is writeable by the memory device and by a memory controller associated with the memory device. In one example, the associated register is dynamically updated at runtime to change the weight based on stress conditions of a system in which the memory device is incorporated. In one example, the stress conditions include system temperature. In one example, the stress conditions include load of a central processing unit coupled to the memory device. In one example, sending the identified address comprises identifying a specific row address identified for the performance of ECS operations. In one example, sending the identified address causes the error scrubbing logic is to perform ECS operations on the specific row address and rows with consecutive addresses to the specific row address. In one example, sending the identified address causes the error scrubbing logic is to perform ECS operation on the specific row address and other rows of generated addresses that are not consecutive to the specific row address. In one example, sending the identified address sending a first address, and comprising sending a second address, wherein the first address is to identify a start of a range of row addresses, and the second address is to identify an end of the range of row addresses. In one example, sending the identified address comprises sending an address selected due to a stress condition on a system of the memory device. In one example, the stress condition comprises data from a temperature sensor. In one example, the stress condition comprises a load on a central processing unit of the system.

In general with respect to the descriptions herein, in one example a memory system includes: a memory device including: an array with multiple rows; and error scrubbing logic to perform error checking and scrubbing (ECS) operations on the multiple rows, including to detect errors in the multiple rows, correct detected errors, and write corrected data back to the array, wherein the error scrubbing logic includes an internal address generator to generate addresses for the multiple rows at which to perform the ECS operations; and a memory controller coupled to the memory device, including: control logic to identify an address of a row of the multiple rows to request for performance of ECS operations; and I/O circuitry to send the identified address to the error scrubbing logic; wherein the memory device further includes a storage device to store the identified address, wherein the internal address generator is to select between internal address generation and the identified address for performance of the ECS operations.

In general with respect to the descriptions herein, in one example a memory controller includes: control logic to detect a multibit error (MBE) in an associated memory and determine if the detected MBE is part of a pattern of errors related to a specific address of the associated memory, wherein the pattern of errors includes a correlation between the specific address and addresses having MBEs; and input/output (I/O) logic to send a command to the associated memory, in response to a determination that the detected MBE is part of a pattern of errors related to the specific address, to trigger a row hammer response for the specific address of the associated memory.

In one example, the control logic is to detect the MBE as an MBE in data received from the associated memory. In one example, the control logic is to detect the MBE as an indication of MBE detected by ECS logic of the associated memory. In one example, the control logic is to detect the pattern by a comparison of multiple addresses having MBEs in the associated memory. In one example, the control logic is to compare addresses of different memory devices of the associated memory that are part of a same rank. In one example, the control logic is to detect the pattern by a comparison of an address of the detected MBE to addresses of recent activate (ACT) commands. In one example, the control logic is to detect the pattern by identification of a group of addresses within the associated memory with MBEs. In one example, the I/O logic is to send the command to disable access to the associated memory. In one example, the I/O logic is to send the command to perform a targeted row refresh. In one example, the I/O logic is to send the command to increase a scrub rate for the associated memory. In one example, the I/O logic is to send the command to identify an address hint for ECS logic of the associated memory. In one example, the associated memory comprises multiple parallel memory devices.

In general with respect to the descriptions herein, in one example a memory controller includes: a control circuit to detect a multibit error (MBE) in an associated memory and determine if the detected MBE is part of a pattern of errors related to a specific address of the associated memory, wherein the pattern of errors includes a correlation between the specific address and addresses having MBEs; and input/output (I/O) circuitry to send a command to the associated memory, in response to a determination that the detected MBE is part of a pattern of errors related to the specific address, to trigger a row hammer response for the specific address of the associated memory.

In general with respect to the descriptions herein, in one example a method for managing memory errors includes: detecting a multibit error (MBE) in an associated memory; determining if the detected MBE is part of a pattern of errors related to a specific address of the associated memory, wherein the pattern of errors includes a correlation between the specific address and addresses having MBEs; and sending a command to the associated memory, in response to determining that the detected MBE is part of a pattern of errors related to the specific address, to trigger a row hammer response for the specific address of the associated memory.

In one example, detecting the MBE comprises detecting the MBE in data received from the associated memory. In one example, detecting the MBE comprises receiving an indication of MBE detected by ECS logic of the associated memory. In one example, determining if the detect MBE is part of a pattern of errors comprises comparing multiple addresses of the associated memory experiencing MBEs to detect the pattern. In one example, comparing the multiple addresses comprises comparing addresses of different memory devices of the associated memory that are part of a same rank. In one example, determining if the detect MBE is part of a pattern of errors comprises comparing an address of the detected MBE to addresses of recent activate (ACT) commands to detect the pattern. In one example, determining if the detect MBE is part of a pattern of errors comprises identifying a group of addresses within the associated memory with MBEs. In one example, sending the command comprises sending a command to disable access to the associated memory. In one example, sending the command comprises sending a command to perform a targeted row refresh. In one example, sending the command comprises sending a command to increase a scrub rate for the associated memory. In one example, sending the command comprises sending a command to identify an address hint for an ECS circuit of the associated memory. In one example, the associated memory comprises multiple parallel memory devices.

In general with respect to the descriptions herein, in one example a memory system comprising: a memory device; and a memory controller coupled to the memory device, the memory controller including: control logic to detect multibit errors (MBEs) in the memory device and determine if the detected MBE is part of a pattern of errors related to a specific address of the memory device, wherein the pattern of errors includes a correlation between the specific address and addresses having MBEs; and input/output (I/O) logic to send a command to the memory device, in response to a determination that the detected MBE is part of a pattern of errors related to the specific address, to trigger a row hammer response for the specific address of the memory device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
control logic to detect a change in a rate of errors for a memory device having error checking and scrubbing (ECS) logic to perform ECS operations with on-die error checking and correction (ECC) logic in an automatic ECS mode where the ECS logic is to control performance of the ECS operations; and
input/output (I/O) circuitry to send a command to the memory device, in response to detection of the change in the rate of errors, to adjust a rate of performing the ECS operations, the command to trigger the ECS logic of the memory device to determine a new scrub interval and request an adjustment to a refresh time provided by the memory controller to enable the ECS logic to perform the ECS operations in accordance with the new scrub interval.

2. The memory controller of claim 1, wherein the memory controller is to adjust the rate of performing the ECS operations in the automatic ECS mode where the memory device is to perform the ECS operations during self refresh.

3. The memory controller of claim 1, wherein the memory controller is to adjust the rate of performing the ECS operations in the automatic ECS mode where the memory device is to perform the ECS operations in response to an all bank refresh command.

4. The memory controller of claim 1, wherein the control logic is to detect the change based on data received from the memory device.

5. The memory controller of claim 1, wherein the control logic is to detect the change in response to a signal from the memory device to indicate a change in the rate of errors.

6. The memory controller of claim 1, wherein the I/O circuitry is to send the command to change a mode register setting to adjust the rate of performing the ECS operations.

7. The memory controller of claim 1, wherein the I/O circuitry is to send the command to set a configuration within the ECS logic.

8. The memory controller of claim 1, wherein the I/O circuitry is to send additional refresh commands to the memory device to enable the memory device to perform the ECS operations.

9. A method comprising:
detecting a change in a rate of errors for a memory device having error checking and scrubbing (ECS) logic to perform ECS operations with on-die error checking and correction (ECC) logic in an automatic ECS mode where the ECS logic controls performance of the ECS operations; and
sending a command to the memory device, in response to detection of the change in the rate of errors, to adjust a rate of performing the ECS operations, the command to trigger the ECS logic of the memory device to determine a new scrub interval;
receiving a request for an adjustment to a refresh time provided by a memory controller for the memory for to enable the ECS logic to perform the ECS operations in accordance with the new scrub interval.

10. The method of claim 9, further comprising:
adjusting the rate of performing the ECS operations in the automatic ECS mode where the memory device is to perform the ECS operations during self refresh or in response to an all bank refresh command.

11. The method of claim 9, wherein detecting the change comprises detecting the change based on data received from the memory device or detecting the change in response to a signal from the memory device to indicate a change in the rate of errors.

12. The method of claim 9, further comprising:
sending additional refresh commands to the memory device to enable the memory device to perform the ECS operations.

13. A memory device comprising:
an array with multiple rows;
error scrubbing logic to perform error checking and scrubbing (ECS) operations on the multiple rows, including to detect errors in the multiple rows, correct detected errors, and write corrected data back to the array, wherein the error scrubbing logic includes an internal address generator to generate addresses for the multiple rows at which to perform the ECS operations; and
a storage device to identify an address of a row requested by a host for performance of ECS operations, wherein the internal address generator is to select between internal address generation and an identified address of a row requested by the host for performance of the ECS operations,
wherein the internal address generator comprises weighted arbitration logic, which performs weight arbitration on addresses generated by the internal address generator and the identified address, to determine one or more addresses for the performance of ECS operations.

14. The memory device of claim 13, wherein the storage device comprises a storage device in the error scrubbing logic or a storage device within the internal address generator of the error scrubbing logic.

15. The memory device of claim 13, wherein the identified address comprises one of multiple identified addresses, wherein each of the multiple identified addresses has an associated register to store a weight for the respective identified address.

16. The memory device of claim 15, wherein the associated register comprises a dynamically configurable register, writeable by the host and by the memory device.

17. The memory device of claim 13, wherein the identified address comprises a specific row address requested by the host for the performance of ECS operations.

18. The memory device of claim 17, wherein the error scrubbing logic is to perform ECS operations on the specific row address requested by the host and rows with consecutive addresses to the specific row address, or to perform ECS operation on the specific row address requested by the host and other rows of generated addresses that are not consecutive to the specific row address.

19. The memory device of claim 13, wherein the identified address is a first address, wherein the storage device is to store a second address, wherein the first address is to identify a start of a range of row addresses, and the second address is to identify an end of the range of row addresses.

* * * * *

UNITED STATES PATENT AND TRADEMARK OFFICE
CERTIFICATE OF CORRECTION

PATENT NO. : 12,360,847 B2
APPLICATION NO. : 18/025868
DATED : July 15, 2025
INVENTOR(S) : Kuljit S. Bains et al.

It is certified that error appears in the above-identified patent and that said Letters Patent is hereby corrected as shown below:

In the Claims

Claim 9 should read: A method comprising:
    detecting a change in a rate of errors for a memory device having error checking and scrubbing (ECS) logic to perform ECS operations with on-die error checking and correction (ECC) logic in an automatic ECS mode where the ECS logic controls performance of the ECS operations; and
    sending a command to the memory device, in response to detection of the change in the rate of errors, to adjust a rate of performing the ECS operations, the command to trigger the ECS logic of the memory device to determine a new scrub interval;
    receiving a request for an adjustment to a refresh time provided by a memory controller for the memory device to enable the ECS logic to perform the ECS operations in accordance with the new scrub interval.

Signed and Sealed this
Nineteenth Day of August, 2025

Coke Morgan Stewart
*Acting Director of the United States Patent and Trademark Office*